United States Patent
Terasawa et al.

(10) Patent No.: US 7,361,530 B2
(45) Date of Patent: Apr. 22, 2008

(54) METHOD OF FABRICATING A SEMICONDUCTOR INTEGRATED CIRCUIT THAT INCLUDES PATTERNING A SEMICONDUCTOR SUBSTRATE WITH A FIRST PHOTOMASK THAT USES METAL FOR BLOCKING LIGHT AND PATTERNING THE SAME SUBSTRATE WITH A SECOND PHOTOMASK THAT USES ORGANIC RESIN FOR BLOCKING LIGHT

(75) Inventors: Tsuneo Terasawa, Ome (JP); Toshihiko Tanaka, Tokyo (JP); Ko Miyazaki, Kokubunji (JP); Norio Hasegawa, Hinode (JP); Kazutaka Mori, Kokubunji (JP)

(73) Assignee: Renesas Technology Corporation, Tokyo (JP)

(*) Notice: Subject to any disclaimer, the term of this patent is extended or adjusted under 35 U.S.C. 154(b) by 0 days.

(21) Appl. No.: 11/714,837

(22) Filed: Mar. 7, 2007

(65) Prior Publication Data

US 2007/0155052 A1    Jul. 5, 2007

Related U.S. Application Data

(63) Continuation of application No. 11/022,758, filed on Dec. 28, 2004, now Pat. No. 7,205,222, which is a continuation of application No. 10/296,495, filed on Nov. 25, 2002, now Pat. No. 6,849,540.

(51) Int. Cl.
   *H01L 21/58*  (2006.01)
(52) U.S. Cl. .................. 438/108; 438/125; 438/946; 257/E21.511; 430/5; 430/313

(58) Field of Classification Search ................ 438/944, 438/946
   See application file for complete search history.

(56) References Cited

U.S. PATENT DOCUMENTS

| 5,708,612 | A | 1/1998 | Abe |
| 5,804,340 | A | 9/1998 | Garza et al. |
| 5,899,719 | A | 5/1999 | Hong |
| 6,060,769 | A | 5/2000 | Wark |
| 6,656,646 | B2 * | 12/2003 | Hotta et al. ............... 430/5 |
| 6,846,598 | B2 | 1/2005 | Hasegawa et al. |
| 2002/0042007 | A1 * | 4/2002 | Miyazaki et al. ........... 430/5 |

FOREIGN PATENT DOCUMENTS

| JP | 05-289307 | 4/1992 |
| JP | 2000-91192 | 3/2000 |

OTHER PUBLICATIONS

International Search Reported dated Oct. 15, 2001 for PCT/JP01/07035.
International Preliminary Examination Report dated Apr. 19, 2002 for PCT/JP01/07035.
Chinese Office Action dated Nov. 18, 2005.

* cited by examiner

*Primary Examiner*—Stephen W. Smoot
(74) *Attorney, Agent, or Firm*—Reed Smith LLP; Stanley P. Fisher, Esq.; Juan Carlos A. Marquez, Esq.

(57) ABSTRACT

Productivity of a semiconductor integrated circuit device is improved. According to how many times the photomask is used, a photomask having an opaque pattern made of metal and a photomask having an opaque pattern made of a resist film are properly used, and thereby an exposure treatment is performed.

11 Claims, 62 Drawing Sheets

3 : MASK SUBSTRATE
5e : OPAQUEPATTERN
7a : OPAQUEPATTERN
MR1 : PHOTO MASK

FIG.18A
FIG.18B
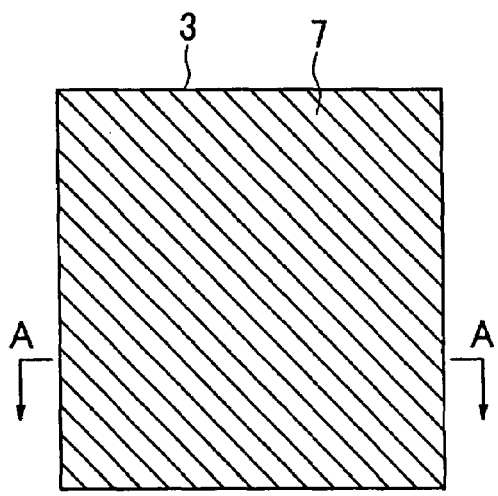
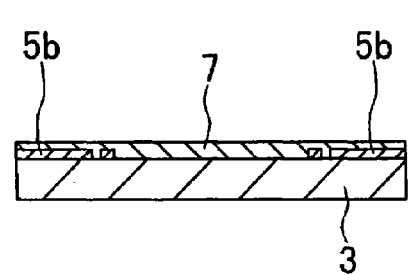
FIG.19A
FIG.19B
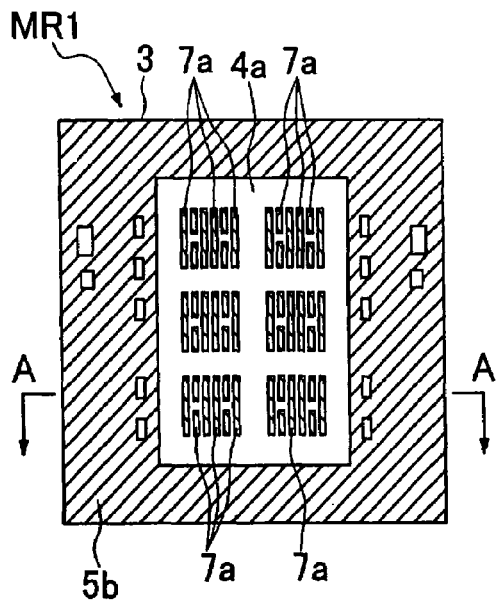
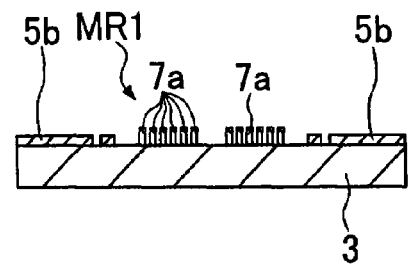

FIG.23A
FIG.23B
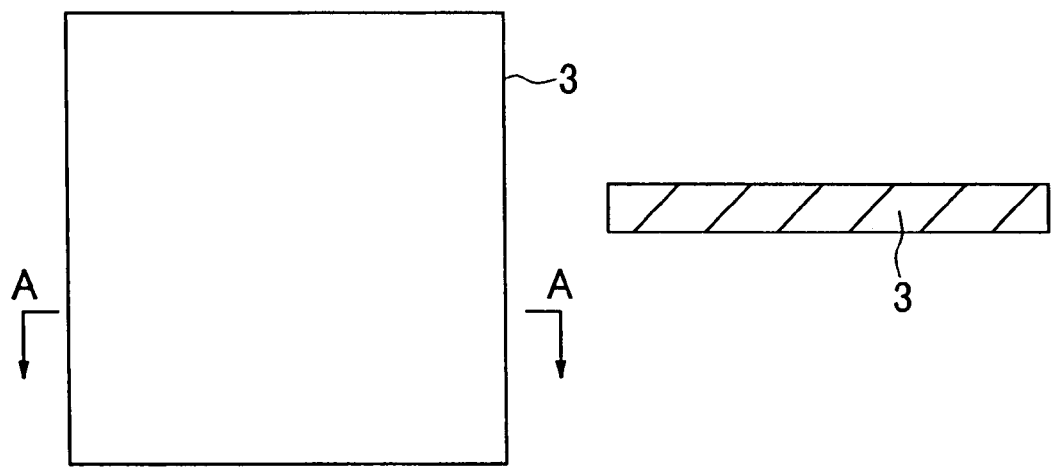
FIG.24A
FIG.24B
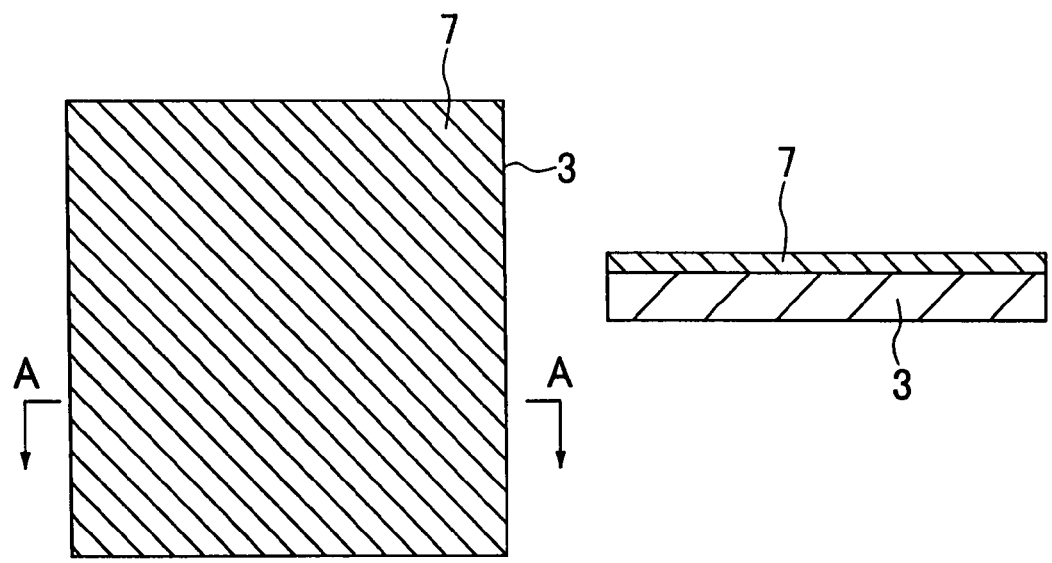

FIG.37A
FIG.37B
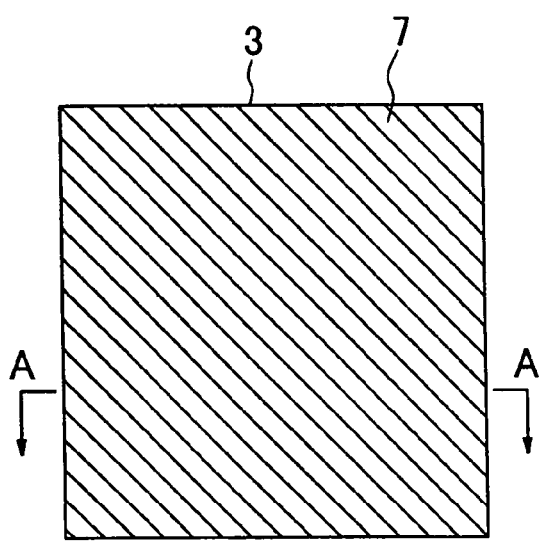
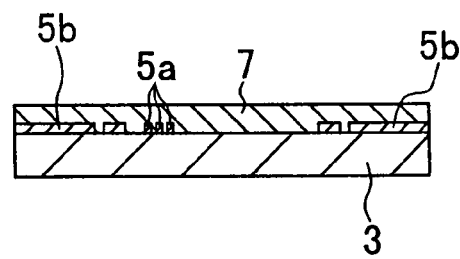

FIG.69A  FIG.69B  FIG.69C
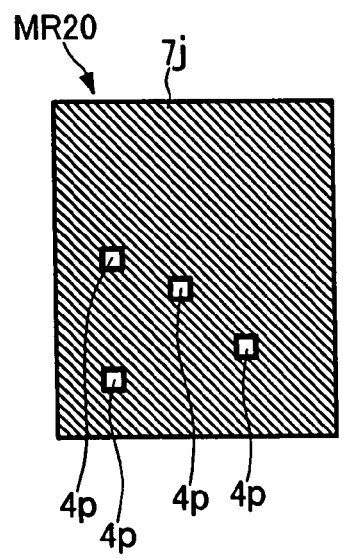
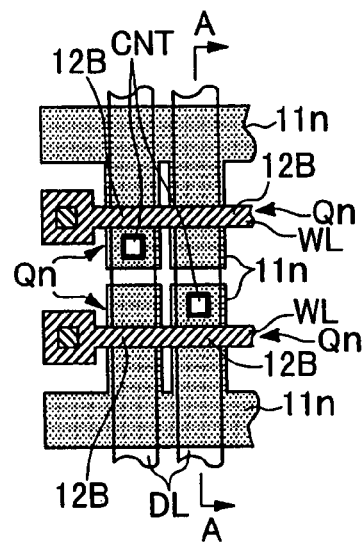
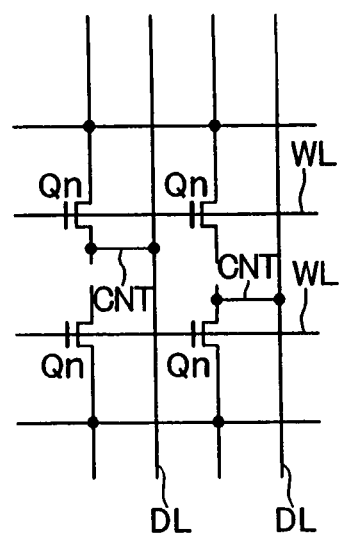
FIG.69D
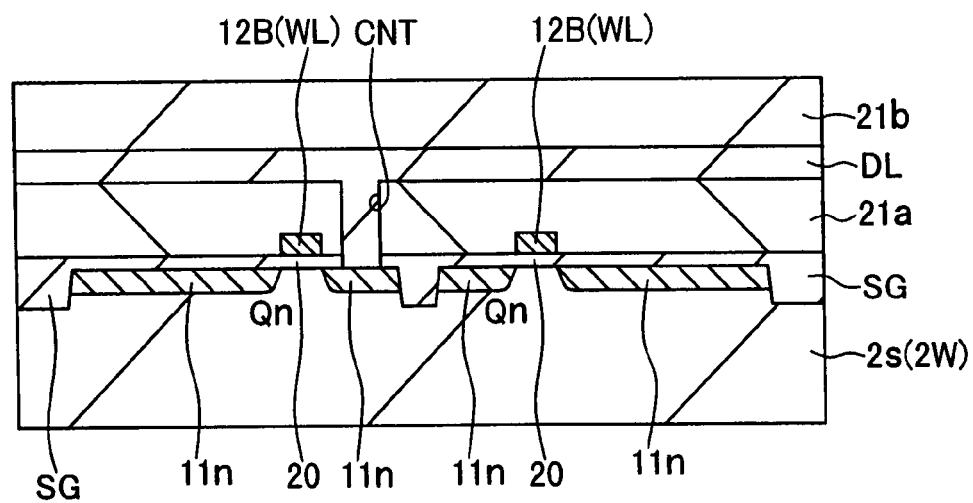

METHOD OF FABRICATING A SEMICONDUCTOR INTEGRATED CIRCUIT THAT INCLUDES PATTERNING A SEMICONDUCTOR SUBSTRATE WITH A FIRST PHOTOMASK THAT USES METAL FOR BLOCKING LIGHT AND PATTERNING THE SAME SUBSTRATE WITH A SECOND PHOTOMASK THAT USES ORGANIC RESIN FOR BLOCKING LIGHT

CROSS-REFERENCES TO RELATED APPLICATIONS

This application is a Continuation of U.S. application Ser. No. 11/022,758 filed on Dec. 28, 2004 now U.S. Pat. No. 7,205,222 which is a continuation of U.S. application Ser. No. 10/296,495 filed on Nov. 25, 2002 now U.S. Pat No. 6,849,540. Priority is claimed based on U.S. application Ser. No. 11/022,758 filed on Dec. 28, 2004, which claims the priority of U.S. application Ser. No. 10/296,495 filed on Nov. 25, 2002, which claims the priority to PCT/JP01/07035 filed on Aug. 15, 2001, which claims the priority date of Japanese Patent Application 2000-246466 filed on Aug. 15, 2000, the entire disclosure of which is incorporated herein by reference.

BACKGROUND OF THE INVENTION

The present invention relates to a method of fabricating a semiconductor integrated circuit device and a method of fabricating a multichip module, more particularly, to a technique effectively applicable to a photolithography (hereinafter, referred to as lithography) technique in which a predetermined pattern is printed onto a semiconductor wafer (hereinafter, referred to as wafer) with using a photomask (hereinafter, referred to as mask) in the fabrication process of a semiconductor integrated circuit device.

In the fabrication of a semiconductor integrated circuit device (LSI: Large Scale Integrated Circuit), the lithography technique is used as a method of forming a fine pattern on a wafer. As the lithography technique, a so-called optical projection exposure method, in which a pattern formed on each mask is repeatedly printed onto a wafer through reduced projection optics, has become the mainstream. The basic constitution of the exposure tool is disclosed in Japanese Patent Laid-open No. 2000-91192.

The resolution R on the wafer in this projection exposure method is generally represented by: $R = k \times \lambda / NA$, where k represents a constant depending on a resist material and a process, $\lambda$ represents a wavelength of exposure light, and NA represents numerical aperture of a projection lens. As is apparent from the relational expression, as the pattern becomes finer, a projection exposure technique using the light source having shorter wavelength has become necessary. At the present, the LSI is fabricated by a projection exposure tool using an i-ray ($\lambda$=365 nm) of a mercury lamp or a KrF excimer laser ($\lambda$=248 nm) as an illumination light source. In order to make the pattern further finer, a light source having a shorter wavelength is required, and the employment of an ArF excimer laser ($\lambda$=193 nm) or an $F_2$ laser ($\lambda$=157 nm) has been examined.

Meanwhile, the above-mentioned mask used in the projection exposure method has a structure in which an opaque pattern made of, for example, chromium or the like is formed as an opaque film on a quartz glass substrate transparent to an exposure light. The fabrication method thereof is, for example, as follows. That is, a chromium film serving as an opaque film is first formed on a quartz glass substrate, and a resist film reactive to an electron beam is coated thereon. Subsequently, an electron beam is irradiated onto the resist film according to pattern data predetermined, and then a resist pattern is formed by performing the development thereto. Subsequently, the chromium thin film is etched with using the resist pattern as an etching mask to form an opaque pattern made of chromium or the like. Lastly, the remaining resist film reactive to an electron beam is removed, and thus, the fabrication of a mask is completed.

SUMMARY OF THE INVENTION

However, the inventors of the present invention have found out that the exposure technique using a mask having an opaque pattern made of a metal film such as chromium or the like has problems as follows.

Specifically, the mask having an opaque pattern made of a metal film is advantageous in mass production because it has good durability and high reliability and is capable of being used in a large amount of exposure. However, when such a mask is used in the development period of a semiconductor integrated circuit device or in the fabrication of a small number of various semiconductor integrated circuit devices, in other words, in the case where changes and modifications are frequently made in the mask pattern and the same mask is rarely used in different processes, a great amount of time and increased cost are required to fabricate the mask. Therefore, there arise such problems as to hinder the improvement in productivity of and the reduction in fabrication cost of a semiconductor integrated circuit device.

An object of the present invention is to provide a technique capable of improving the productivity of a semiconductor integrated circuit device.

Also, another object of the present invention is to provide a technique capable of reducing a development period required to develop a semiconductor integrated circuit device.

Also, another object of the present invention is to provide a technique capable of reducing a fabrication period required to fabricate a semiconductor integrated circuit device.

Also, another object of the present invention is to provide a technique capable of reducing the cost of a semiconductor integrated circuit device.

The above and other objects and novel characteristics of the present invention will be apparent from the description of the present specification and the accompanying drawings.

The advantages achieved by the typical ones of the inventions disclosed in the present application will be briefly described as follows.

Specifically, in the present invention, a mask having a metal film as an opaque member relative to an exposure light and a mask having, as an opaque member, an organic material containing an organic photoreactive resin film relative to an exposure light are used in an exposure treatment of the fabrication steps of a semiconductor integrated circuit device.

Also, in the present invention, a mask having a metal film as an opaque member relative to an exposure light and a mask having, as an opaque member, an organic material containing an organic photoreactive resin film relative to an exposure light are properly used, depending on how to use the mask, in an exposure process of the fabrication steps of a semiconductor integrated circuit device.

Also, in the present invention, the organic material is made of a single film of the organic photoreactive resin film.

Also, in the present invention, the organic material is made by adding a photo-absorbing material or a photo-attenuating material to the organic photoreactive resin film.

Also, in the present invention, the organic material is made of a laminated film of the organic photoreactive resin film and the photo-absorbing film, a laminated film of the organic photoreactive resin film and the photo-attenuating film, or a laminated film of the organic photoreactive resin film and an anti-reflective layer.

Also, in the present invention, the mask having an organic material containing an organic photoreactive resin film as an opaque member relative to an exposure light includes also a pattern made of a metal film as an opaque member relative to an exposure light.

Also, in the present invention, the mask having an organic material containing the organic photoreactive resin film as an opaque member relative to an exposure light includes also a pattern made of a metal film as an opaque member relative to an exposure light, and the pattern made of metal film serving as the opaque member is a pattern functioning to print an integrated circuit pattern onto a wafer.

Also, in the present invention, the mask having an organic material containing organic photoreactive resin film as an opaque member to an exposure light has also a pattern made of a metal film as an opaque member to an exposure light, and the pattern made of metal film serving as the opaque member is a metal film covering a peripheral region of the mask.

Also, in the present invention, when fabricating the mask having an organic material containing organic photoreactive resin film as an opaque member to an exposure light, a step of removing an opaque member made of the organic material, and then forming a new opaque member made of the organic material is performed.

Also, in the present invention, when fabricating the mask having an organic material containing organic photoreactive resin film as an opaque member to an exposure light, a step of removing an opaque member made of the organic material, and then forming a new opaque member made of the organic material is performed, wherein the newly formed opaque member made of the organic material serves as a pattern used to print an integrated circuit pattern onto a wafer.

BRIEF DESCRIPTIONS OF THE DRAWINGS

FIG. 18A is a plan view during the re-fabrication process of the photomask shown in FIG. 9 subsequently to FIG. 17.

FIG. 18B is a cross-sectional view taken along line A-A in FIG. 18A.

FIG. 19A is a plan view during the re-fabrication process of the photomask shown in FIG. 9 subsequently to FIG. 18.

FIG. 19B is a cross-sectional view taken along line A-A in FIG. 19A.

FIG. 23A is a plan view during the fabrication process of the photomask shown in FIG. 20.

FIG. 23B is a cross-sectional view taken along line A-A in FIG. 23A.

FIG. 24A is a plan view during the fabrication process of the photomask shown in FIG. 20 subsequently to FIG. 23.

FIG. 24B is a cross-sectional view taken along line A-A in FIG. 24A.

FIG. 37A is a plan view during the fabrication process of the photomask subsequently to FIG. 34.

FIG. 37B is a cross-sectional view taken along line A-A in FIG. 37A.

FIG. 69A is a plan view showing an example of the principal part of a photomask used in data rewriting of the mask ROM of FIG. 67.

FIG. 69B is a plan view showing the principal part of the memory region after the data rewriting by the use of the photomask of FIG. 69A.

FIG. 69C is a circuit diagram of the memory region of FIG. 69C.

FIG. 69D is a cross-sectional view taken along line A-A in FIG. 69B.

DESCRIPTIONS OF THE PREFERRED EMBODIMENTS

Figure 1:
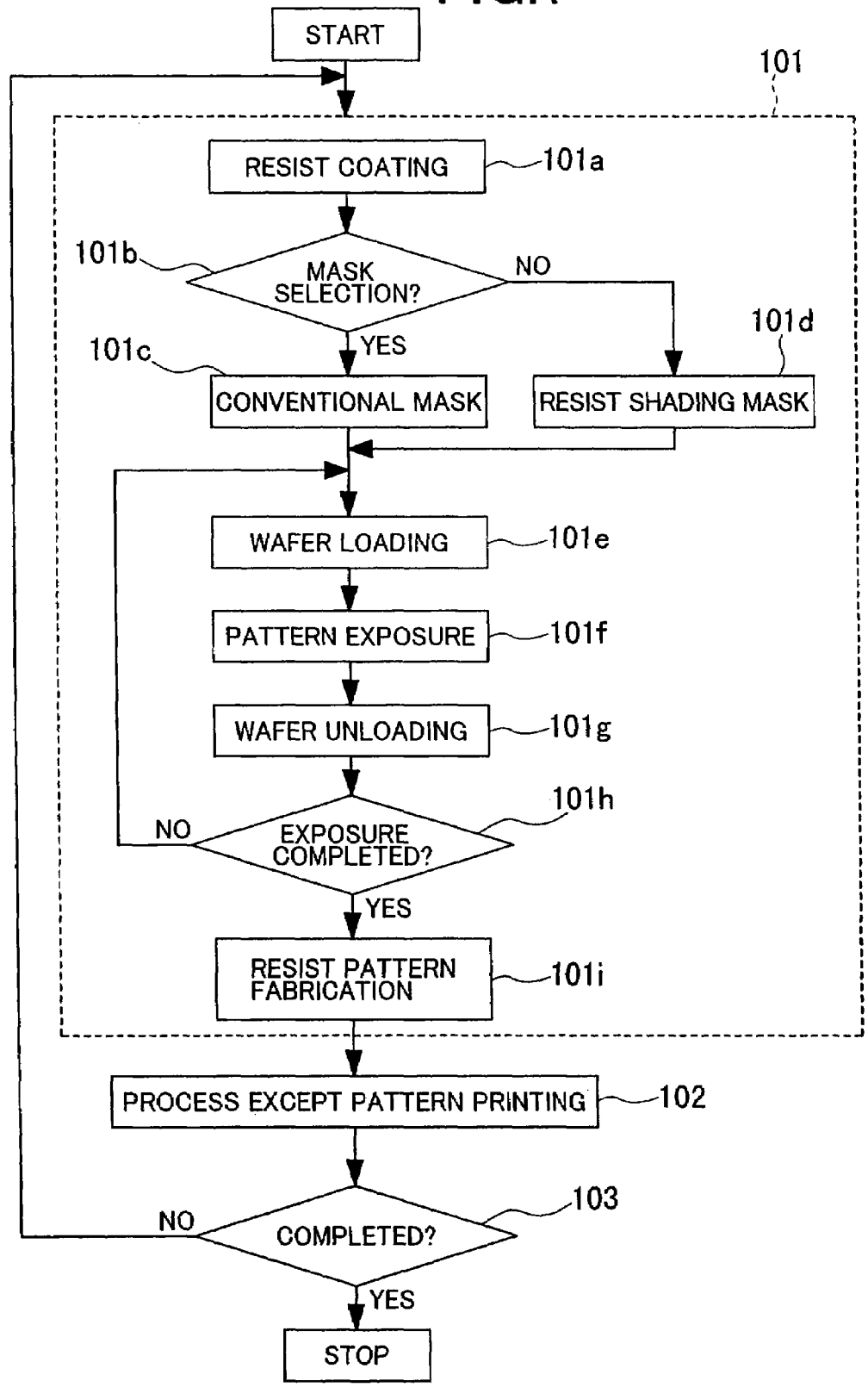
FIG. 1 is a flow chart showing the fabrication process of a semiconductor integrated circuit device according to an embodiment of the present invention.

In advance of the detail description of the present invention, each meaning of technical terms employed in this application will be described as follows.

1. Mask (photomask): It is one made by forming a pattern for shading the light and/or a pattern for changing a phase of the light, on a mask substrate. It includes a reticle having a pattern several times as large as a pattern of the actual size. A first main surface of the mask means a pattern surface on which the pattern for shading the light and/or the pattern for changing a phase of the light are/is formed, and a second main surface of the mask means a surface located in the other side of the first main surface.

2. Conventional mask: It means a normal mask in which a mask pattern is formed of an opaque pattern made of metal and of a clear pattern, on a mask substrate. In the present embodiments, a phase shift mask having a meaning for generating a phase difference in exposure light transmitting through the mask is also included in the conventional mask. The phase shifter for generating the phase difference in exposure light is one made by forming a trench having a predetermined depth in a mask substrate and/or by providing a transparent film or a semi-transparent film having a predetermined film thickness on a mask substrate.

3. Resist shading mask: It means a mask having an opaque member (opaque film, opaque pattern, and opaque region) made of an organic material containing an organic photo-reactive resin film on a mask substrate. Note that the organic material mentioned here includes a single film of the organic photoreactive resin film, a film made by adding the photo-absorbing material or the photo attenuating material to the organic photoreactive resin film, a laminated film of the organic photoreactive resin film and other film (e.g., anti-reflective layer, photo-absorbing resin film, or photo-attenuating resin film), and the like.

4. The pattern surface of a mask (the above-mentioned conventional mask and resist-shading mask) is classified into the following regions, that is, an "integrated circuit pattern region" in which an integrated circuit pattern to be printed is arranged, and a "peripheral region" which is a region of the outer circumference of the "integrated circuit pattern region".

5. Although not particularly limited, the resist shading mask is classified into the following three types in this specification as a matter of convenience from the viewpoint of the fabrication process thereof, that is, one of mask blanks (hereinafter, referred to as blanks), a metal mask, and a resist shading mask. Each of the blanks means a mask in an early stage, in other words, a mask before completion as a mask to be used for printing a desired pattern. More specifically, each the blanks indicates a mask in a high commonality (versatility) stage, the mask in which patterns have yet to be formed in the above-mentioned integrated circuit pattern region but which has basic constituents required for fabricating a complete mask. The metal mask is an incomplete mask and is a mask in such a stage that a pattern made of metal is formed in the above-mentioned integrated circuit pattern region is formed. The difference between the metal mask and the conventional mask mentioned above is whether or not the mask is completed as a mask capable of printing a desired pattern onto a substrate to be processed. The resist shading mask means a complete mask to be used as a mask and is a mask in such a stage that a pattern made of a resist film is formed in the above-mentioned integrated circuit pattern region. Some patterns used for printing a desired pattern on a mask are made of resist films only, and the other patterns are made of both a metal and a resist film. Some patterns for printing desired patterns onto the mask are all made of resist films, and the other patterns are made of metal and resist films.

6. A wafer means a single crystal silicon substrate (having an approximately flat and round shape in general), a sapphire substrate, a glass substrate, other dielectric or semi-dielectric substrate, a semiconductor substrate or the like, or a substrate made by combining them, which are all used in the fabrication of an integrated circuit. In addition, a semiconductor integrated circuit device mentioned in this application is not limited to one made on a semiconductor or a dielectric substrate such as a silicon wafer, a sapphire substrate or the like, and it also includes one made on other dielectric substrate such as glass, for example, TFT (Thin Film Transistor) and STN (Super-Twisted-Nematic) liquid crystal and the like unless otherwise stated.

7. A device surface means a main surface of a wafer and means a surface on which device patterns corresponding to a plurality of chip regions are formed by photolithography.

8. When "opaque member", "opaque region", "opaque film", and "opaque pattern" are mentioned, it means that they have such optical properties that exposure light irradiated onto the regions thereof is penetrated less than 40%. Generally, the one capable of penetrating the light from several percent to less than 30% is used. Meanwhile, when "transparent", "transparent film", "clear region", and "clear pattern" are mentioned, it means that they have such optical properties that exposure light irradiated onto the regions is penetrated 60% or more. Generally, the one capable of penetrating the light 90% or more is used.

9. Printed pattern: It is a pattern printed onto a wafer by a mask, and more specifically means a pattern on a wafer actually formed by using a resist pattern and by using a resist pattern as a mask.

10. Resist pattern: It means a film pattern formed by patterning a photo-reactive organic film based by means of a photolithography technique. Note that this pattern includes a mere resist film having no openings with respect to the portion concerned.

11. Hole pattern: It means a micro-pattern such as a contact hole, a via hole or the like having, on a wafer, a two-dimensional size equal to or smaller than the exposure light wavelength. In general, the hole pattern has, on a mask, a square shape or a rectangular shape approximate thereto or an octagonal shape or the like. On a wafer, however, it has a round shape in many cases.

12. Line pattern: It means a strip-shaped pattern for forming a wiring pattern or the like on a wafer.

13. Normal illumination: It is an undeformed illumination, and means an illumination having relatively uniform light intensity distribution.

14. Deformed illumination: It is an illumination whose illuminance at the central portion is lowered, and includes oblique illumination, annular illumination, the multi-pole illumination such as 4-pole illumination and 5-pole illumination and the like, or a super resolution technique by a pupil filter equivalent to the foregoing illuminations.

15. Scanning exposure: It is an exposure method in which thin slit-shaped exposure band is moved (scanned) relatively and continuously on both of a wafer and a mask in an orthogonal direction relative to a longitudinal direction of the slit (may be moved in an oblique direction), and thereby a circuit pattern on the mask is printed onto a desired position on the wafer.

16. Step and scan exposure: It is an exposure method for performing exposure of the entire portion to be exposed on a wafer by using the above-mentioned scanning exposure and a stepping exposure in combination, and represents a narrower concept of the above-mentioned scanning exposure.

17. Step and repeat exposure: It is an exposure method in which a wafer is repeatedly stepped relative to a projected image of a circuit pattern on a mask, and thus the circuit pattern on the mask is printed onto a desired position on the wafer.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, a supplementary explanation or the like thereof.

Also, in the embodiments described below, when referring to the number of elements (including number of pieces, values, amounts, ranges, or the like), the number of elements is not limited to a specific number unless otherwise stated, or except the case where the number is apparently limited to a specific number in principle, or the like. The number larger or smaller than the specified number is also applicable.

Further, in the embodiments described below, it goes without saying that the components (including element steps or the like) are not always essential unless otherwise stated, or except the case where the components are apparently essential in principle, or the like.

Similarly, in the embodiments described below, when the shape of the components and the like, or the positional relation and the like thereof, or the like are mentioned, the substantially approximate and similar shapes and the like are included therein unless otherwise stated, or except the case where it can be conceived that they are apparently excluded in principle, or the like. This condition is also applicable to the numerical value and the range described above.

Also, components having the same functions are denoted by the same reference symbols throughout the drawings for describing the embodiments, and the repetitive description thereof will be omitted.

Also, in the drawings used in the embodiments, the opaque members (opaque film, opaque pattern, opaque region, and the like) are hatched so as to make the drawings easy to see even in the plan view.

Also, in the embodiments, a MISFET (Metal Insulator Semiconductor Field Effect Transistor) serving as a typical example of field effect transistors is abbreviated as a MIS, a p channel MISFET is abbreviated as a pMIS, and an n channel MISFET is abbreviated as an nMIS.

Hereinafter, embodiments of the present invention will be described in detail based on the drawings.

First Embodiment

First, a method of fabricating a semiconductor integrated circuit device according to an embodiment of the present invention will be described by the use of FIG. 1. Step 101 is a pattern printing step in which a pattern formed on a mask is printed onto a wafer, and step 102 is a step in which various processes such as etching, impurity doping, deposition, and the like are performed. In the conventional semiconductor integrated circuit device, the pattern printing (exposure) and the various processes are repeatedly performed until it is determined that all of the steps are completed in step 103.

Now, in this embodiment, in the pattern printing step 101, after coating of a resist film on a main surface of a wafer (step 101a), which one of the above-mentioned conventional mask (first photomask) and the above-mentioned resist shading mask (second photomask) is used is selected (step 101b). In this case, for example, when the number of wafers to be exposed (the number of exposures) per mask is smaller than a predetermined value, a resist shading mask is separately prepared according to the method mentioned below, and the mask thus prepared is selected. An exposure operator inputs the above-mentioned predetermined value (a value determined in advance). However, the way to select the mask is not limited to this. For example, the mask can be decided based on the accumulation of the number of times when the wafer is used in the past, or can be decided according to the method of specifying it based on a file or the like. Subsequently, after the conventional mask or the resist shading mask is placed on an exposure tool (step 101c or step 101d), a wafer is loaded on the exposure tool (step 101e), and then the pattern on the mask is printed onto the resist film on the wafer (step 101f). Then, after unloading of the wafer (step 101g), it is determined whether or not the printing is completed (step 101h). When the printing is not completed yet, the steps 101e to 101g are performed again. Meanwhile, when the printing is completed, the wafer is subjected to a heat treatment, development, and the like, and thus a resist pattern is formed on the wafer (step 101i).

As described above, by selectively using the conventional mask and the resist shading mask in accordance with the exposure condition, it becomes possible to use the mask suitable for the exposure condition.

For example, when the number of exposure processes per mask is small, the use of the resist shading mask makes it possible to achieve the cost reduction because of its simple fabrication process. At the same time, a mask having high pattern accuracy can be obtained in a short time because accuracy deterioration due to etching does not occur. Therefore, increase in fabrication cost does not occur. In addition, it is possible to cope with the production of various kinds of products. Thus, the resist shading mask is advantageous in terms of cost when used in the small-lot production.

Meanwhile, in fabrication of a various types of semiconductor integrated circuit devices, there are a large number of steps of deposition or etching or the like onto a semiconductor substrate (wafer) are performed, and are also a large number of lithography steps for printing patterns necessary to such steps. It is required to fabricate the number of masks corresponding to the number of lithography steps. In this case, for example, the same process is performed until the fabrication of a transistor structure. However, there are many cases where the wafers are classified into various types in a wiring process or the like subsequent thereto and then various types of products are fabricated. More specifically, since the number of exposure processes per mask used to fabricate the common structure is extremely large, the conventional mask is used thereto. However, the number of exposure processes per mask used to form patterns different in each type is smaller in comparison to that used to fabricate the common structure. Therefore, the resist shading mask is employed in such a pattern exposure step. Thus, the improvement of productivity of a semiconductor integrated circuit device can be achieved. Also, the reduction in development period required to develop and fabrication time required to fabricate the semiconductor integrated circuit device can be achieved. Furthermore, the reduction in cost for the semiconductor integrated circuit device can be achieved.

Figure 2:
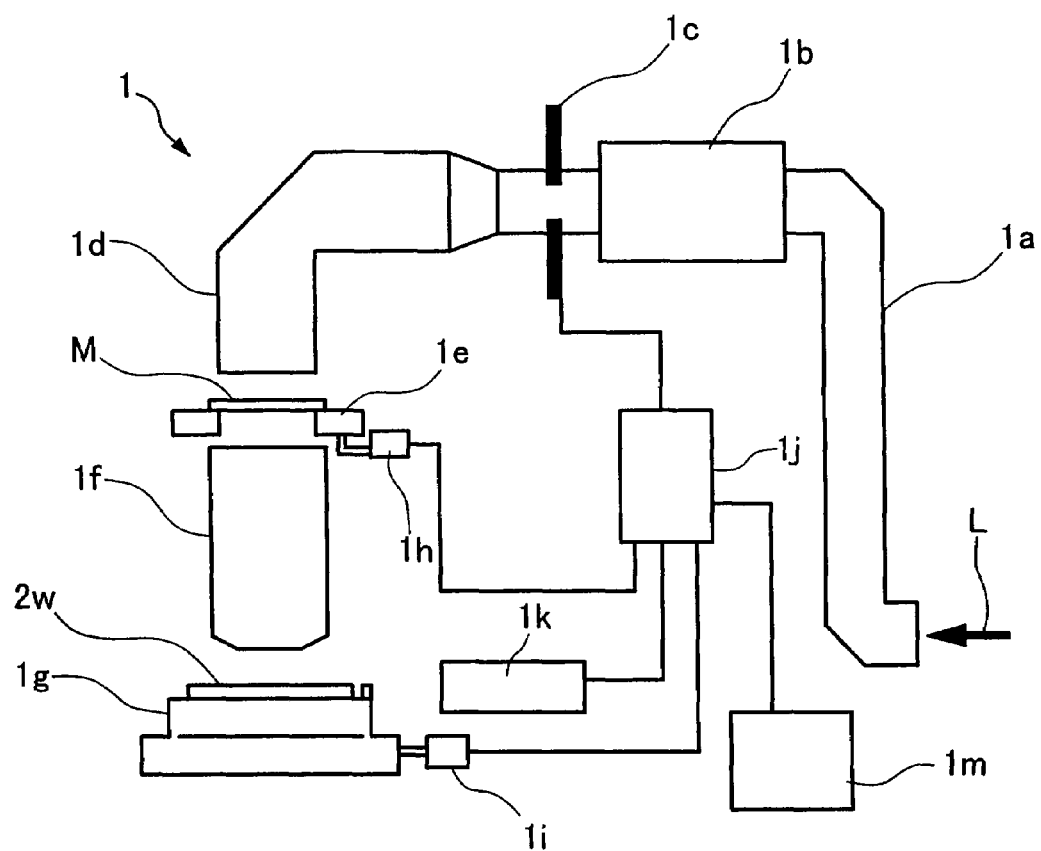
FIG. 2 is an explanatory diagram showing an example of an exposure tool used in the fabrication process of the semiconductor integrated circuit device in FIG. 1.

For example, the exposure tool used therein is a standard reduced projection exposure tool. FIG. 2 shows an example thereof. An exposure tool 1 is provided with an optical path 1a for guiding light L emitted from a light source, a diffuser 1b, an aperture 1c, illumination optics (condenser lens) 1d, a mask stage 1e, projection optics if, a wafer stage 1g, and the like. A mask M and a wafer 2W are placed on the mask stage 1e and the wafer stage 1g, respectively, and mask patterns on the mask M are printed onto the wafer 2W. As the light source, for example, i-ray (wavelength of 365 nm), KrF excimer laser (wavelength of 248 nm), ArF excimer laser (wavelength of 193 nm), F.sub.2 laser (wavelength of 157 nm), or the like is used. As an exposure method, for example, any one of the step and repeat exposure and the step and scan exposure described above may be used. A pellicle may be formed on a surface of the mask M. The mask on the mask stage 1e is appropriately replaced in accordance with the types of desired patterns to be printed. The position of the mask stage 1e is controlled by a driving system 1h. Also, the position of the wafer stage 1g is controlled by a driving system 1i. The driving systems 1h and 1i are driven in response to the control command from a main control unit 1j. The position of the wafer 2W is obtained by detecting the position of a mirror fixed to the wafer stage 1g by using a laser interferometer 1k. The position data thus obtained is transmitted to the main control system 1j. The main control system 1j controls the driving system 1i based on the transmitted data. Also, the main control system 1j is electrically connected to a network system 1m, which makes it possible to perform remote monitoring of the state of the exposure tool 1.

Next, description will be made for the mask M used therein. The mask M used in this embodiment is a reticle for printing the original integrated circuit patterns, for example, having dimensions one to ten times as large as the actual size onto a wafer via the reduced projection optics. Also, a mask used when printing a line pattern onto a wafer is exemplified here. However, the technical idea of the present invention is not limited to this and is applicable to various cases. For example, the mask is applicable to the case of printing the hole pattern or the like. Note that the mask described here is only an example and the present invention is not limited to use of the masks described below.

FIGS. 3 to 7 show examples of the conventional mask described above. Note that FIGS. 3B, 4B, 5B, 6B and 7B are cross-sectional views taken along line A-A in FIGS. 3A, 4A, 5A, 6A and 7A, respectively.

Mask substrates 3 of masks MN1(M) to MN3(M), MN4a(M), MN4b(M) are made of, for example, a transparent fused silica glass substrate having a thickness of about 6 mm and formed in a square shape in two dimensions. When the masks MN1, MN2, MN 4a, or MN4b is used, a positive resist film is used on a wafer, and when the mask MN3 is used, a negative resist film is used on a wafer.

The mask MN1 shown in FIG. 3 exemplifies a mask which forms an opaque region in the periphery of a semiconductor chip. A clear region 4a having a rectangular shape in two dimensions is formed in the integrated circuit pattern region at the center of the main surface (pattern forming surface) of the mask substrate 3 of the mask MN1, and a part of the main surface of the mask substrate 3 is exposed. Opaque patterns 5a made of metal are arranged in this clear region 4a. The opaque patterns 5a are printed as line patterns (integrated circuit pattern) onto a wafer. Also, the above-mentioned peripheral region located on the outer of the integrated circuit pattern region is covered with an opaque pattern 5b (metal film) made of metal. The opaque patterns 5a and 5b are patterned in the same step and are formed of chromium or by depositing chromium oxide on chromium. However, the material of the metal opaque pattern is not limited to this, and various kinds of materials can be used thereto. This metal material will be described later.

The mask MN2 shown in FIG. 4 exemplifies a mask which forms an opaque region in the peripheral outline of the semiconductor chip. The integrated circuit pattern region of the mask MN2 is the same as that of the mask MN1. Therefore, the description thereof will be omitted. The integrated circuit pattern region on the main surface of the mask substrate 3 of the mask MN2 is surrounded by a strip-shaped opaque pattern 5c (metal film) made of metal. The material of the opaque pattern 5c is the same as that of the opaque patterns 5a and 5b described above. In addition, on the most part of the peripheral region of the mask MN2, the opaque film is removed to form the clear region 4b.

The mask MN3 shown in FIG. 5 exemplifies a mask having a pattern reverse to the patterns of the above-mentioned masks MN1 and MN2. The most part of the main surface of the mask substrate 3 of the mask MN3 is covered with an opaque film 5d made of metal. The material of the opaque film 5d is the same as that of the opaque patterns 5b and 5c described above. Also, in the integrated circuit pattern region of the mask MN3, parts of the opaque film 5d are removed to form clear patterns 4c. This clear pattern 4c is printed as a line pattern onto a wafer. Note that the peripheral region of the mask MN3 shown in FIG. 5 may be formed in the same manner as that shown in FIG. 4.

The mask MN 4a shown in FIG. 6 and the mask MN 4b shown in FIG. 7 exemplify the masks used in a so-called overlapping exposure in which one pattern or a group of patterns on a wafer are formed by the exposure using a plurality of masks overlapping with each other.

In the integrated circuit pattern region of the mask MN4a shown in FIG. 6, for example, a clear region 4d having a reverse-L shape in two dimensions is formed. In the clear region 4d, the opaque patterns 5a made of metal are arranged. The most parts of the outer peripheral region of the clear region 4d are covered with the opaque pattern 5b made of metal. Parts of the integrated circuit pattern region on the mask MN4a are also covered with the opaque patterns 5b made of metal. The mask MN4a is used as a mask for printing a circuit pattern, for example, that is constituted of a group of fixed patterns to which modifications and alterations are not made basically in the semiconductor integrated circuit device.

Meanwhile, in the integrated circuit pattern region of the mask MN4b shown in FIG. 7, for example, a clear region 4e having a square shape in two dimensions and having a relatively small area is formed. This clear region 4e is formed in a region corresponding to a part of the region in the integrated circuit pattern region of the mask MN4a, which is covered with the opaque pattern 5b. Opaque patterns 5a made of metal are arranged in the clear region 4e. The most parts around the clear region 4e are covered with the opaque pattern 5b made of metal. The mask MN4b is used as a mask for printing a circuit pattern, for example, which is constituted of a group of fixed patterns to which modifications and alterations are not made basically in the semiconductor integrated circuit device. More specifically, only the mask MN4b may be replaced in the case where modifications and alterations are made in the pattern. Therefore, it is possible to reduce the fabrication time of the mask. Also, reduction in the material cost, the process cost, and the fuel cost of the mask fabrication can be achieved. With regard to the exposure process, each of the masks MN4a and MN4b is used to perform the exposure process. Then, after the exposure processes of both the masks MN4a and MN4b, processes such as development or the like are performed relative to a resist film on the wafer, and thus the resist pattern is formed.

Figure 8A:
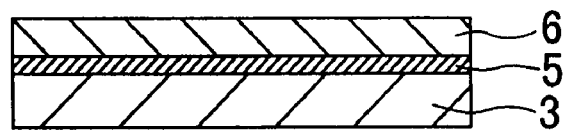
FIG. 8A is a cross-sectional view during fabrication process of a conventional photomask.
Figure 8B:
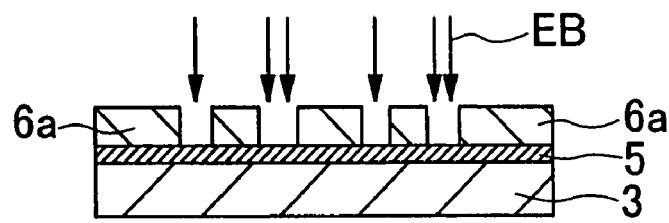
FIG. 8B is a cross-sectional view during fabrication process of a conventional photomask.
Figure 8C:
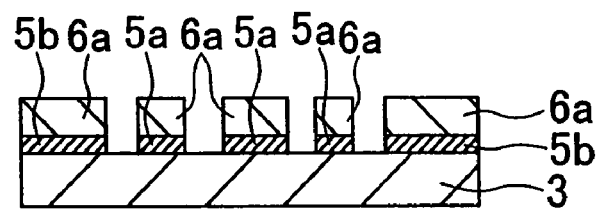
FIG. 8C is a cross-sectional view during the fabrication process of a conventional photomask.
Figure 8D:
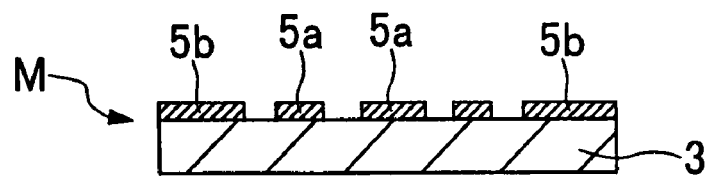
FIG. 8D is a cross-sectional view during the fabrication process of a conventional photomask.

An example of fabrication process of the above-described conventional mask is shown in FIGS. 8A to 8D. First, an opaque film 5 made of, for example, chromium or the like is formed on a mask substrate 3, and a resist film 6 reactive to an electron beam is coated thereon (FIG. 8A). Note that the opaque film 5 is not limited to the one made of chromium, and various changes can be made therein. For example, refractory metal such as tungsten (W), molybdenum (Mo), tantalum (Ta), titanium (Ti) or the like; refractory metal nitride such as tungsten nitride (WN) or the like; refractory metal silicide (compound) such as tungsten silicide (WSix); molybdenum silicide (MoSix) or the like; or a laminated film of these may be used. In the case of the later-described resist shading mask, the mask substrate is washed and used again in some cases after removal of the opaque pattern made of the resist film. Therefore, a material having high peeling resistance and high abrasion resistance is preferably used for a metal opaque pattern. The refractory metal such as tungsten or the like is preferable for the material of the metal opaque pattern because it has high oxidation resistance, high abrasion resistance, and high peeling resistance. Next, an electron beam EB having a predetermined pattern data is irradiated to perform the development, and thus a resist pattern 6a is formed (FIG. 8B). Subsequently, the resist pattern 6a is used as an etching mask to etch the opaque film 5 and to form opaque patterns 5a and 5b (FIG. 8C). Lastly, the remaining resist pattern 6a reactive to the electron beam is removed, and thus the fabrication of the conventional mask M is completed (FIG. 8D). The conventional mask as described above is suitable in mass production because the mask has high durability and high reliability and is capable of being used in a large number of exposures.

Figure 9A:
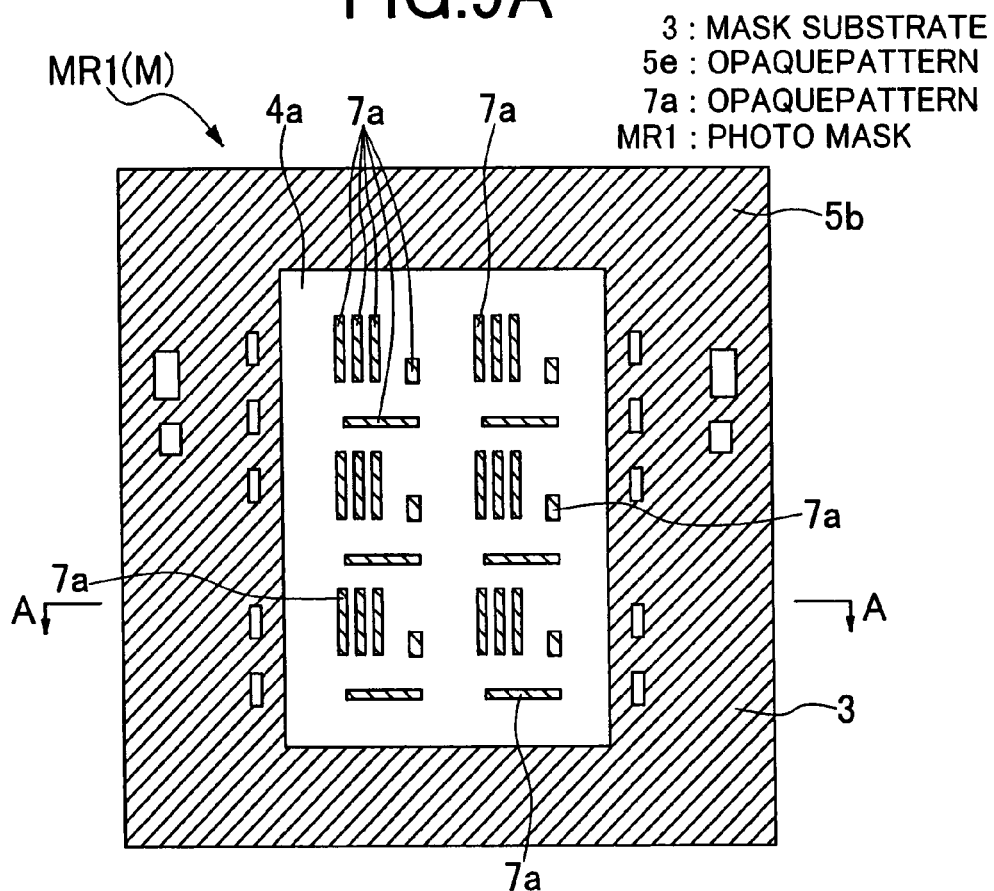
FIG. 9A is a plan view showing an example of a photomask used in the fabrication process of the semiconductor integrated circuit device in FIG. 1.
Figure 9B:
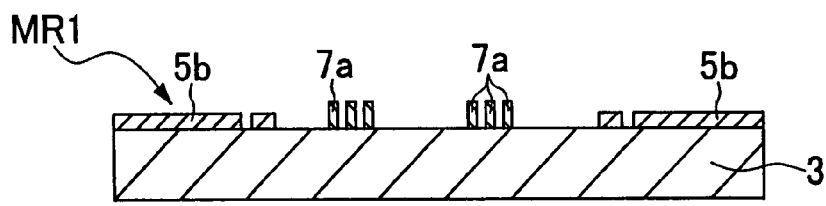
FIG. 9B is a cross-sectional view taken along line A-A in FIG. 9A.
Figure 9C:
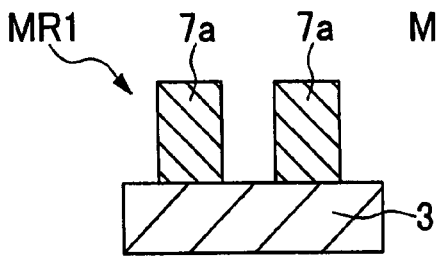
FIG. 9C is an enlarged view showing the principal part of FIG. 9B.
Figure 9D:
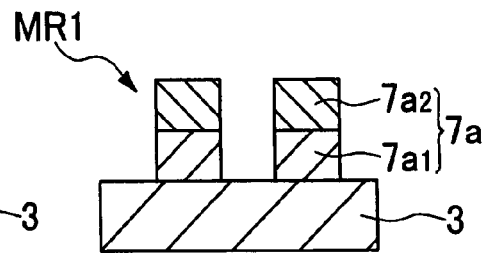
FIG. 9D shows a modification example of an opaque member and is an enlarged plan view showing the principal part of FIG. 9B.
Figure 10A:
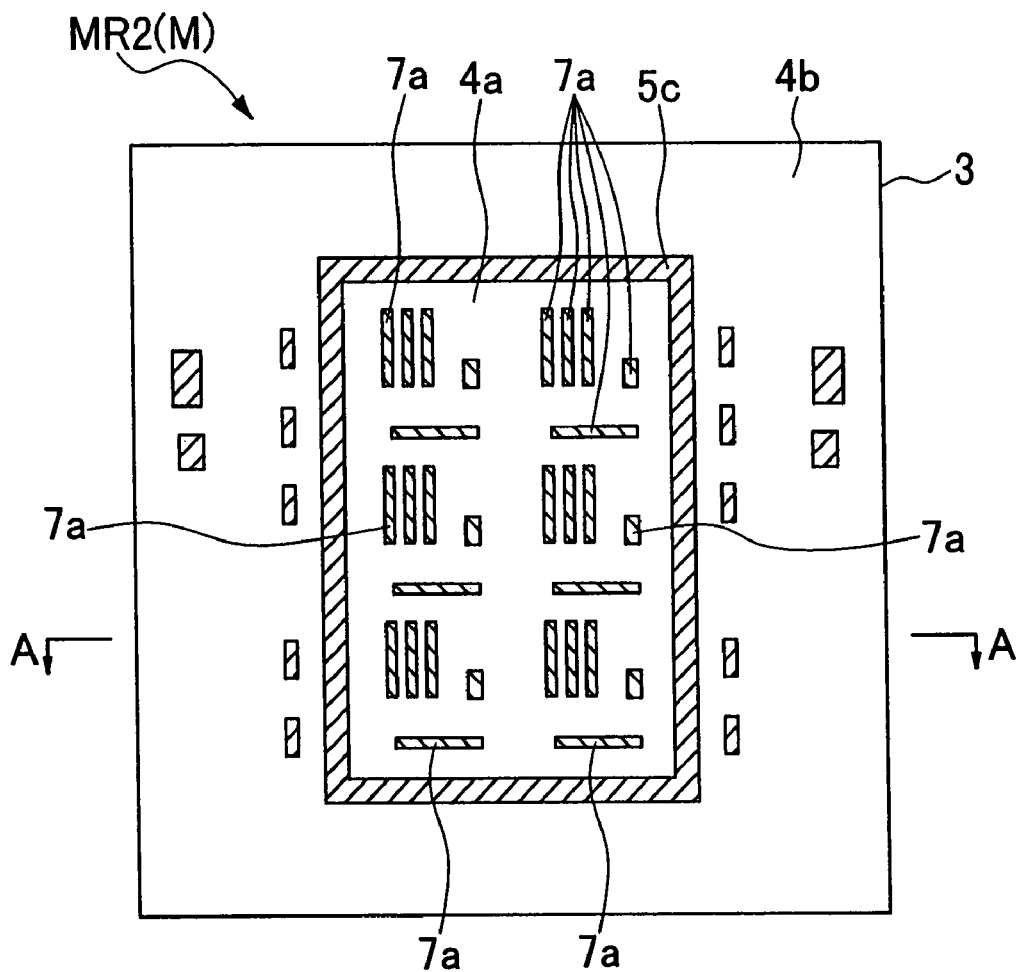
FIG. 10A is a plan view showing an example of the photomask used in the fabrication process of the semiconductor integrated circuit device in FIG. 1.
Figure 10B:
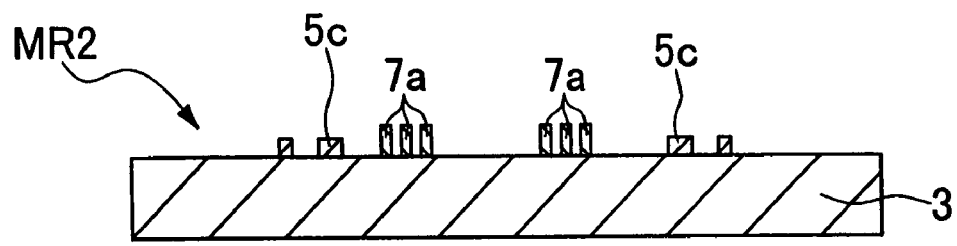
FIG. 10B is a cross-sectional view taken along line A-A in FIG. 10A.
Figure 11A:
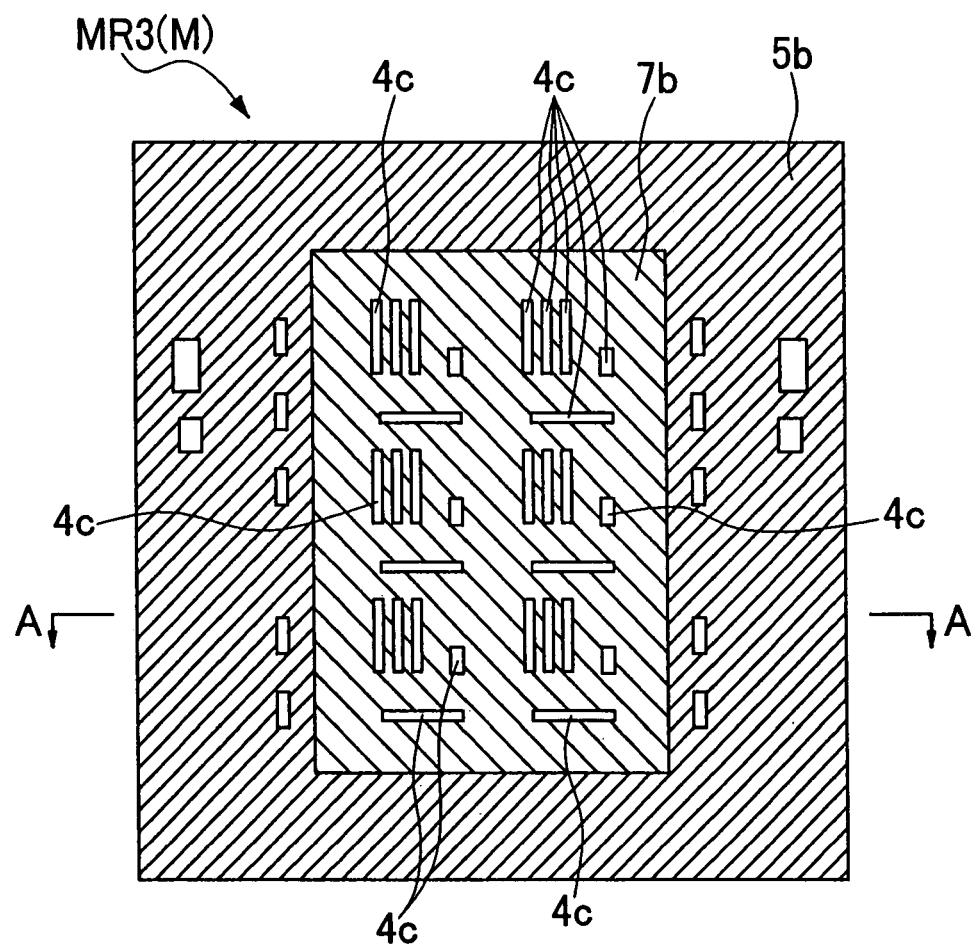
FIG. 11A is a plan view showing an example of the photomask used in the fabrication process of the semiconductor integrated circuit device in FIG. 1.
Figure 11B:
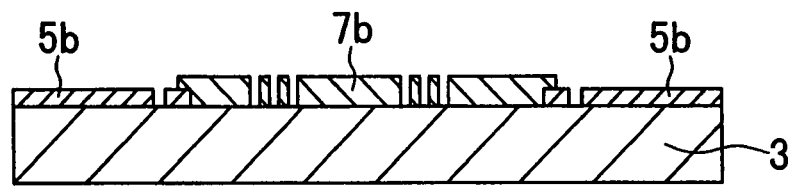
FIG. 11B is a cross-sectional view taken along line A-A in FIG. 11A.
Figure 12A:
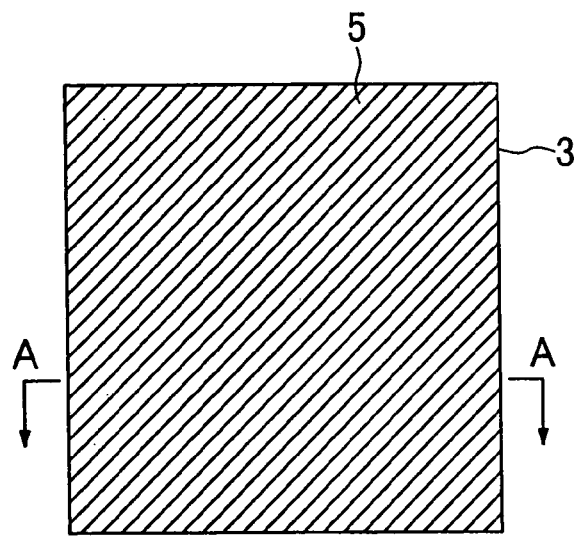
FIG. 12A is a plan view during the fabrication process of the photomask shown in FIG. 9.
Figure 12B:
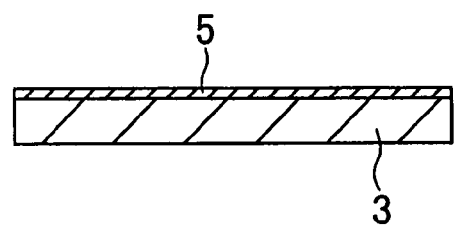
FIG. 12B is a cross-sectional view taken along line A-A in FIG. 12A.

Next, FIGS. 9 to 11 show examples of the resist shading masks, respectively. Note that FIGS. 9B, 10B and 11B are cross-sectional views taken along line A-A in FIGS. 9A, 10A, and 11A, respectively.

Mask MR1(M) in FIG. 9 exemplifies a mask which forms an opaque region in the periphery of a semiconductor chip. A clear region 4a having a rectangular shape in two dimensions is formed in the integrated circuit pattern region at the center of the main surface of the mask substrate 3 of the mask MR1, and parts of the main surface of the mask substrate 3 are exposed. Opaque patterns 7a such as a resist film made of organic material containing an organic photo-reactive resin film are arranged in this clear region 4a. The opaque patterns 7a are printed as line patterns onto a wafer. Since the opaque pattern 7a is formed of the resist film as described above, it becomes possible to remove the opaque patter 7a relatively easily as described later. Also, the new opaque pattern 7a can be formed easily and in a short time. The resist film forming the opaque pattern 7a has a characteristic of absorbing the exposure light such as KrF excimer laser, ArF excimer laser, F.sub.2 laser and the like, and has almost the same light-shielding function as an opaque pattern made of metal.

The opaque pattern 7a may be constituted by a single film of a resist film as shown in FIG. 9C, and it is also possible to form the opaque pattern 7a by adding a photo-absorbing material and a photo-attenuating material to the single film. Also, as shown in FIG. 9D, the opaque pattern 7a may be constituted by laminating a photo-reactive organic film 7a2 on a photo-absorbing organic film 7a1, or may be constituted by laminating an anti-reflective layer on a photoreactive organic film. The lamination structure as described above makes it possible to obtain a sufficient photo-reducing property relative to the exposure light having a wavelength of 200 nm or longer such as i-ray, KrF excimer laser or the like. Also, in the case where the opaque pattern 7a is constituted of a single film of a resist film, the sufficient photo-reducing property relative to the exposure light having a wavelength of 200 nm or longer can be obtained by adding an photo-absorbing material to the resist film. The material of the resist film will be described later. Similarly to the mask MN1 shown in FIGS. 3A and 3B, the most parts of the peripheral region located on the outer circumference of the integrated circuit pattern region are covered with the opaque pattern 5b (metal film) made of metal. Note that the technique for forming an opaque pattern by using a resist film is disclosed in Japanese Patent Application No. 11-185221 (filed on Jun. 30, 1999).

A mask MR2(M) shown in FIGS. 10A and 10B exemplifies a mask which forms an opaque region in the peripheral outline of the semiconductor chip. The mask MR2 is the same as the conventional mask MN2 shown in FIGS. 4A and 4B except that the opaque pattern 7a made of a resist film is arranged in the integrated circuit pattern region 4a.

A mask MR3(M) shown in FIGS. 11A and 11B exemplifies a mask having a pattern reverse to the patterns of the masks MR1 and MR2. The integrated circuit patter region on the main surface of the mask substrate 3 of the mask MR3 is covered with an opaque film 7b. The material of the opaque film 7b is the same as that of the opaque pattern 7a described above. Also, in the integrated circuit pattern region of the mask MR3, parts of the opaque film 7b are removed to form clear patterns 4c. The clear pattern 4c is printed as a line pattern onto a wafer. Note that it is also possible to form the peripheral region of the mask MR3 shown in FIGS. 11A and 11B in the same manner as that shown in FIGS. 10A and 10B.

An example of the fabrication process of the above-mentioned resist shading mask will be described by the use of FIGS. 12 to 16. Note that FIGS. 12B, 13B, 14B, 15B and 16B are cross-sectional views taken along line A-A in FIGS. 12A, 13A, 14A, 15A and 16A, respectively. Also, descriptions will be made of the fabrication method of the mask MR1 shown in FIGS. 9A to 9D as an example.

Figure 13A:
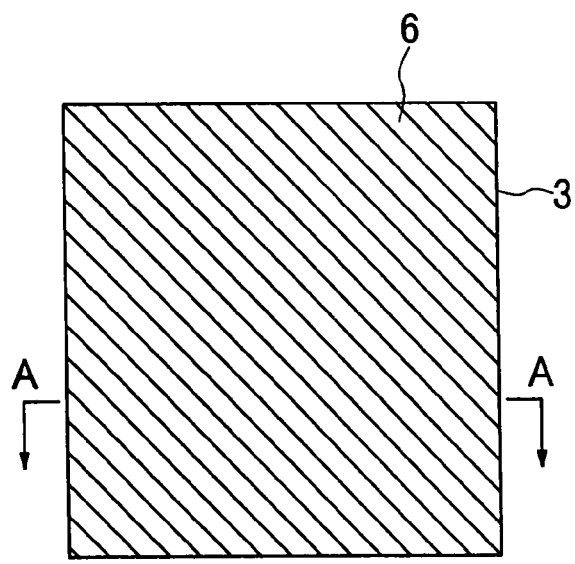
FIG. 13A is a plan view during the fabrication process of the photomask shown in FIG. 9 subsequently to FIG. 12.
Figure 13B:
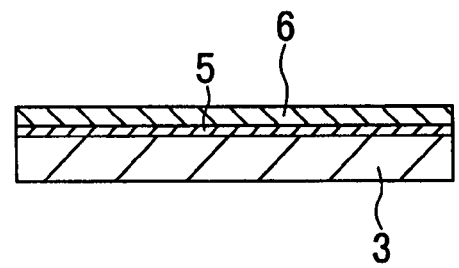
FIG. 13B is a cross-sectional view taken along line A-A in FIG. 13A.
Figure 14A:
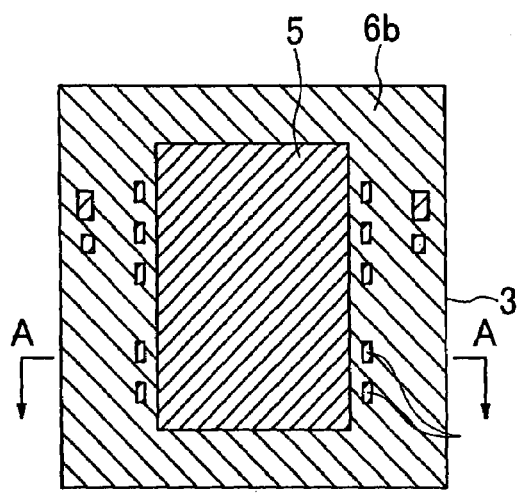
FIG. 14A is a plan view during the fabrication process of the photomask shown in FIG. 9 subsequently to FIG. 13.
Figure 14B:
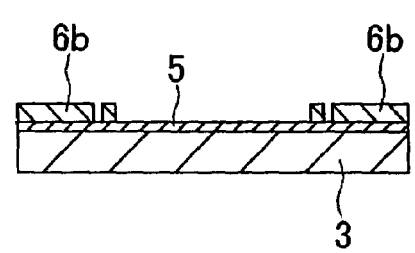
FIG. 14B is a cross-sectional view taken along line A-A in FIG. 14A.
Figure 15A:
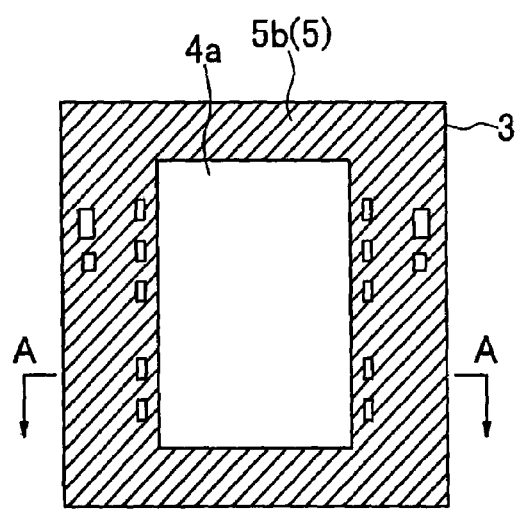
FIG. 15A is a plan view during the fabrication process of the photomask shown in FIG. 9 subsequently to FIG. 14.
Figure 15B:
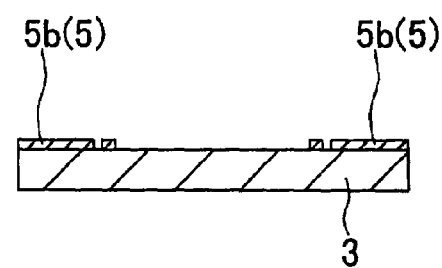
FIG. 15B is a cross-sectional view taken along line A-A in FIG. 15A.
Figure 16A:
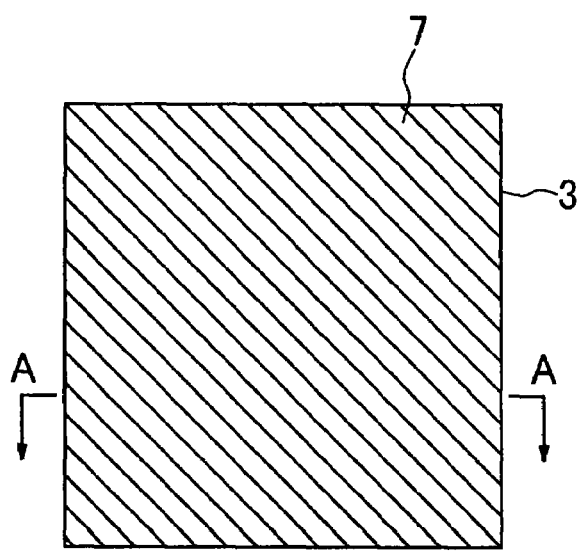
FIG. 16A is a plan view during the fabrication process of the photomask shown in FIG. 9 subsequently to FIG. 15.
Figure 16B:
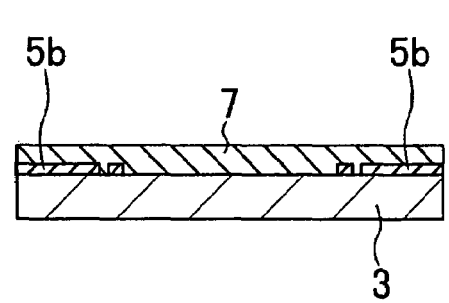
FIG. 16B is a cross-sectional view taken along line A-A in FIG. 16A.

First, after deposition of the above-mentioned opaque film 5 made of metal on the mask substrate 3 (FIGS. 12A and 12B), the resist film 6 reactive to an electron beam is coated thereon (FIGS. 13A and 13B). Subsequently, an electron beam or the like having a predetermined pattern data is irradiated to perform the development, and thus a resist pattern 6b is formed (FIGS. 14A and 14B). Subsequently, the resist pattern 6b is used as an etching mask to etch the opaque film 5 and to form the opaque pattern 5b. Thereafter, the resist pattern 6b is removed (FIGS. 15A and 15B). FIGS. 15A and 15B each correspond to the above-mentioned blanks in this type of mask. These blanks may be stocked. Thereafter, the resist film 7 made of an organic material containing an organic photoreactive resin film reactive to an electron beam is coated to a thickness of about 150 nm on the main surface of the mask substrate 3 (corresponding to the blanks) having the opaque pattern 5b formed thereon (FIGS. 16A and 16B). Then, the opaque pattern 7a made of the resist film shown in FIGS. 9A to 9D is formed by performing the mask pattern writing and the development, and thereby the fabrication of the mask MR1 is completed.

As the resist film 7, a substance mainly made of, for example, poly (α-methylstyrene-co-α-chloroacrylic acid), novolak resin and quinonediazide, novolak resin and poly (2-methylpentene-co-sulfone), chloromethylated polystyrene, or the like is used. A so-called chemical amplification resist made by mixing an acid generator into phenol resin such as polyvinyl phenol resin or the like, or mixing an acid generator into novolak resin can be also used. Substances for use as the material of the resist film 7 used here are required to have a photo-shading property relative to a light source of the projection exposure tool and a photosensitivity relative to the light source of the pattern writing tool in the mask fabrication process, that is, photosensitivity relative to the electron beam or the light having a wavelength of 230 nm or longer. Therefore, the material of the opaque resist film 7 is not limited to the foregoing substances and various changes can be made therein. Also, the film thickness too is not limited to 150 nm, and any film thickness is applicable if satisfying the foregoing conditions.

In the case where the polyphenol resin or novolak resin is formed up to the film thickness of about 100 nm, since the light transmittance for the light having a wavelength of, for example, about 150 nm to 230 nm is almost 0, it can be understood that such resins have sufficient mask effect on, for example, the ArF excimer laser having a wavelength of 193 nm, F.sub.2 laser having a wavelength of 157 nm, and the like. Although vacuum-ultraviolet light having a wavelength of 200 nm or shorter is employed as an object, the light used therein is not limited to this. If a mask material for i-ray having a wavelength of 365 nm, KrF excimer laser having a wavelength of 248 nm, or the like is required, it is preferable to take measures as follows, that is: use of other materials; addition of a photo-absorbing material, a photo-shielding material or a photo-attenuating material to the resist film; or formation of a laminated film of a photo-absorbing organic film and an organic photoreactive resin film or formation of a laminated film of an organic photo-reactive resin film and an anti-reflective layer, as the resist film. In addition, it is also effective to add a heat treatment or irradiate an intense ultraviolet ray in advance for the purpose of improving the resistance to the exposure light irradiation, that is, to perform a so-called hardening process of the resist film, after the opaque pattern 7a and the opaque pattern 7b made of a resist film are formed.

Next, an example of modifications and alterations of the mask pattern in the mask as described above will be described based on FIGS. 17 to 19. Note that FIGS. 17B, 18B and 19B are cross-sectional views taken along line A-A in FIGS. 17A, 18A and 19A, respectively. Also, description will be made of a method of modifying and altering the mask pattern of the mask MR1 shown in FIG. 9 as an example.

Figure 17A:
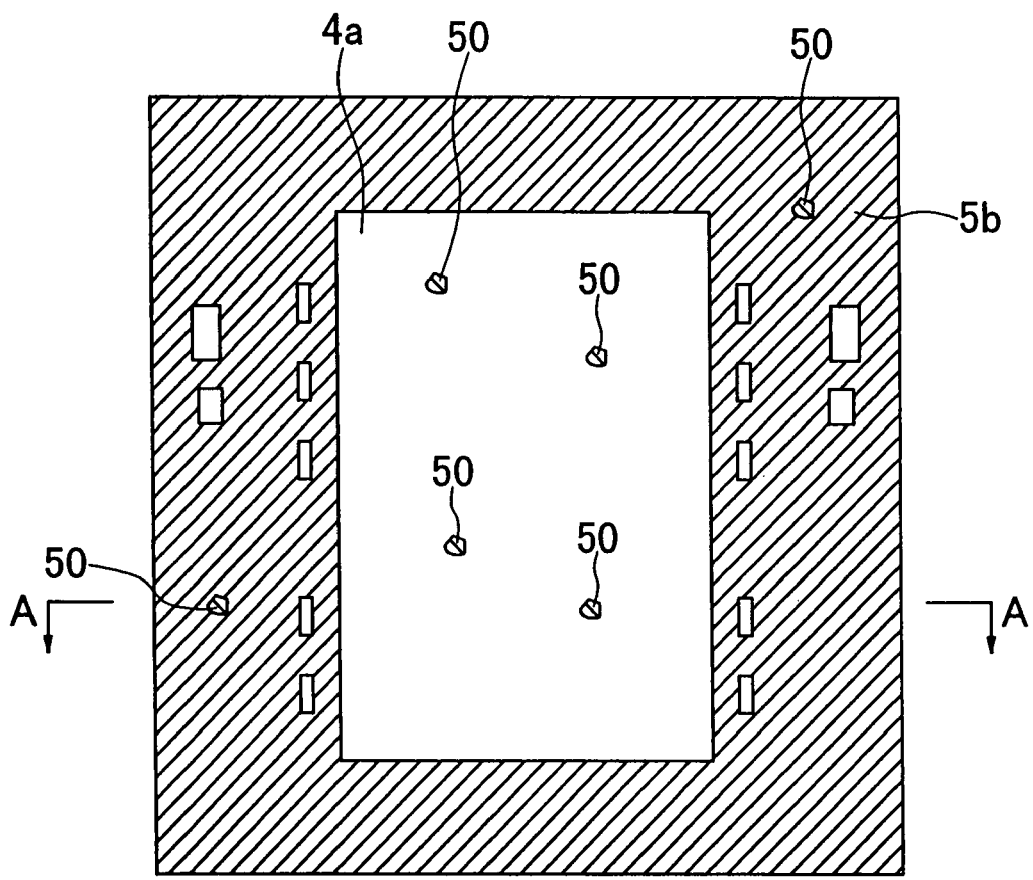
FIG. 17A is a plan view during a re-fabrication process of the photomask shown in FIG. 9.
Figure 17B:
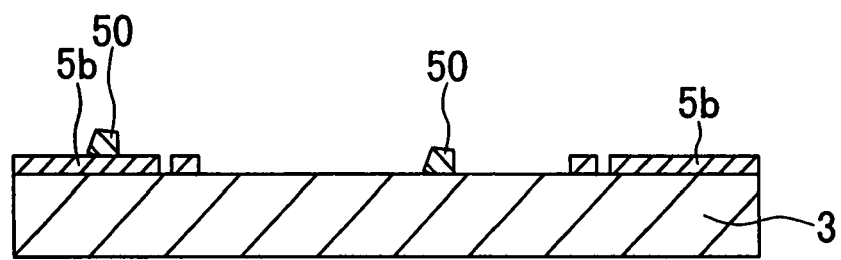
FIG. 17B is a cross-sectional view taken along line A-A in FIG. 17A.

First, the opaque pattern 7a made of the resist film is peeled from the mask MR1 by the use of n-methyl-2-pyrrolidinone organic solvent (FIGS. 17A and 17B). In addition to this, a heated amine organic solvent or acetone may be used to peel the opaque pattern made of the resist film. It is also possible to remove it by using tetramethylammonium hydroxide (TMAH) solution, or mixture solution of ozone sulfuric acid or hydrogen peroxide, and concentrated sulfuric acid. In the case of using the TMAH solution, the concentration thereof is preferably set about 5% because the opaque pattern made of the resist film can be peeled without damaging the metal (opaque pattern 5b or the like).

Also, as another method of removing the opaque pattern made of the resist film, oxygen plasma ashing is also available. This oxygen plasma ashing has showed the highest peeling performance. This method is particularly effective in the case where the hardening process has been performed relative to the opaque pattern made of the resist film. This is because since the resist film subjected to the hardening process is hardened, it is difficult to adequately remove such a film by the chemical removal method in some cases.

Also, an opaque pattern made of the resist film may be mechanically removed by peeling. More specifically, after an adhesive tape is pasted on the pattern forming surface of the opaque pattern made of the resist film of the mask MR1, the pasted adhesive tape is peeled and thereby the opaque pattern made of the resist film is removed together. In this case, since it is unnecessary to create the vacuum state, the opaque pattern made of the resist film can be peeled comparatively easily and in a short time.

After the removal step of the opaque pattern made of the resist film, a washing process is performed to remove foreign objects 50 on the surface of the mask MR1. By so doing, this is led to the state of blanks shown in FIG. 15. The washing process here is performed by using the combination of, for example, an ozone sulfuric acid washing process and a brush washing process. However, if showing high performance in removing the foreign objects and not damaging the opaque pattern made of metal, a washing process is not limited to this and various modifications and alterations can be made therein.

Subsequently, the resist film 7 is coated on the mask substrate 3 in the same manner as that described in the fabrication process of the resist shading mask (FIGS. 18A and 18B), and the opaque pattern 7a made of the resist film is formed by performing the mask pattern writing and the development and thereby the fabrication of the mask MR1 is completed (FIGS. 19A and 19B). In this example, the opaque pattern 7a having a shape and arrangement different from those of the opaque pattern 7a shown in FIGS. 9A to 9D is exemplified. Of course, a pattern the same as the opaque pattern 7a shown in FIGS. 9A and 9D may be formed.

The use of the above-described resist mask makes it possible to avoid problems arising at the time of installing the mask into various tools such as a mask inspection tool, an exposure tool or the like because the opaque member made of metal is formed in the peripheral region of the mask or the mask substrate 3 thereof is exposed. More specifically, if an installation portion of such tools touches the opaque member made of the resist film on the mask when the mask is installed into the various tools, the abrasion and the peeling of the resist film sometimes cause the foreign objects and the pattern defect. However, the above-described resist shading mask can avoid such problems because the installation portion of the various tools touches the opaque member made of metal or the mask substrate. Also, since the opaque member for printing the integrated circuit pattern is formed of a resist film without use of metal, the peeling and reproduction of the opaque member can be performed more easily than the conventional mask in a short time and that with the reliability of the mask substrate ensured. Also, it is possible to perform the reproduction of the mask from the stage after formation of the opaque member made of metal. Therefore, the process cost, material cost, and fuel cost can be reduced. As a result, the significant reduction in the cost of a mask can be achieved. Thus, the resist shading mask of this type is suitably used in the case where the mask pattern is frequently modified and altered or the case where frequency of use common to masks is small, more specifically, in the development period of the semiconductor integrated circuit device, or in the fabrication step of a small quantity of various types of semiconductor integrated circuit devices, or the like.

Figure 20A:
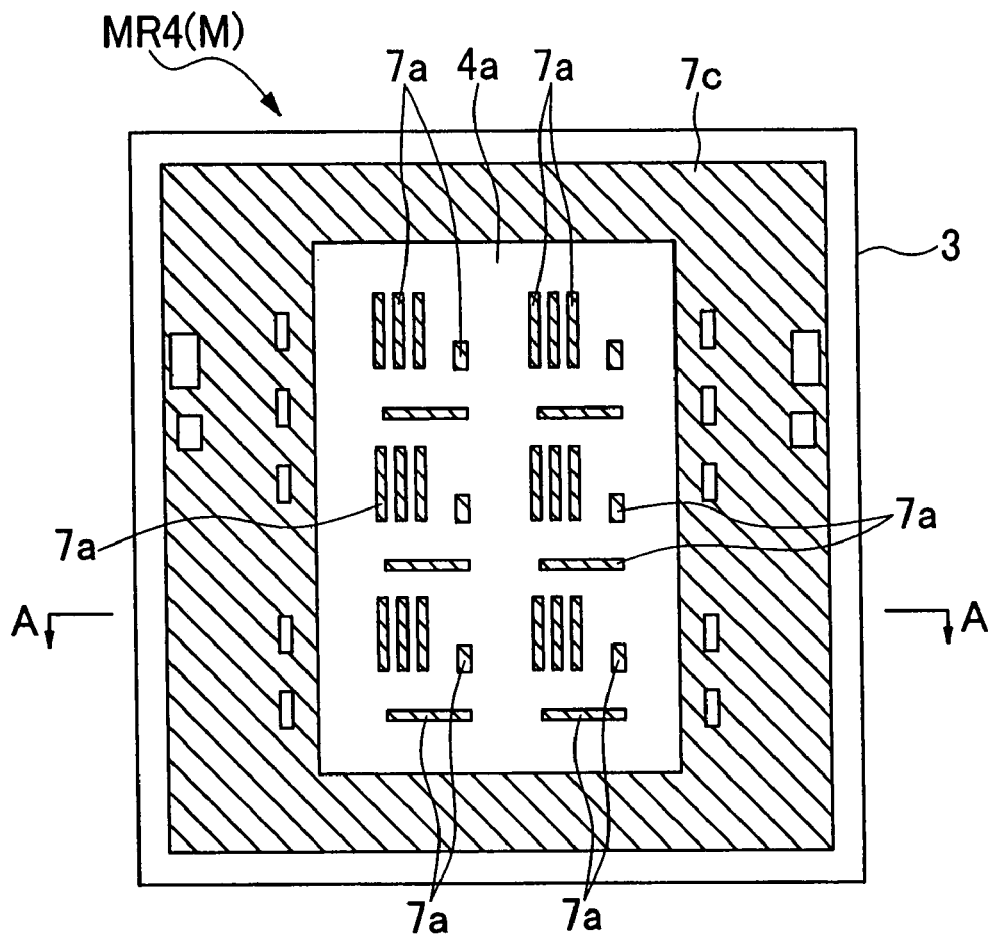
FIG. 20A is a plan view showing an example of a photomask used in the fabrication process of the semiconductor integrated circuit device in FIG. 1.
Figure 20B:
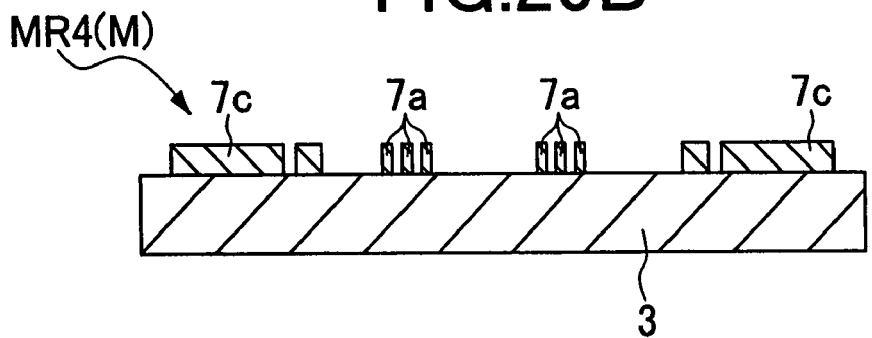
FIG. 20B is a cross-sectional view taken along line A-A in FIG. 20A.
Figure 21A:
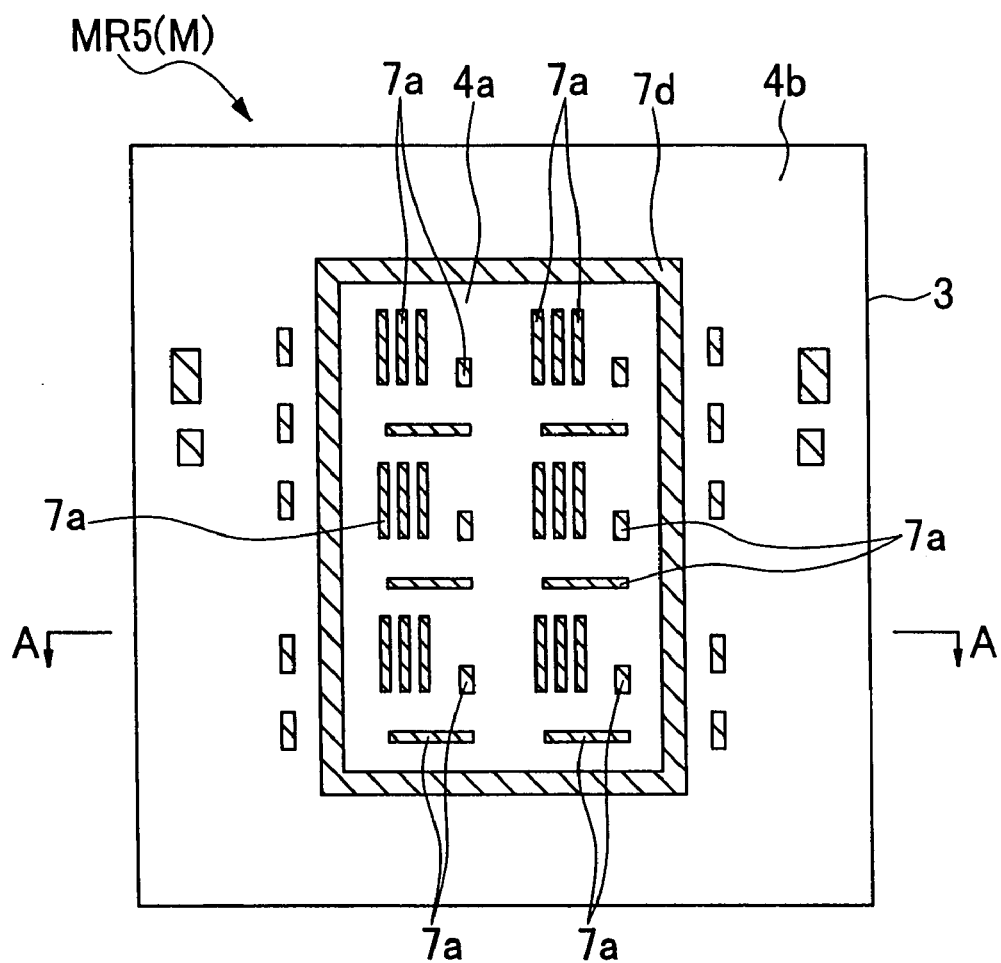
FIG. 21A is a plan view showing an example of a photomask used in the fabrication process of the semiconductor integrated circuit device in FIG. 1.
Figure 21B:
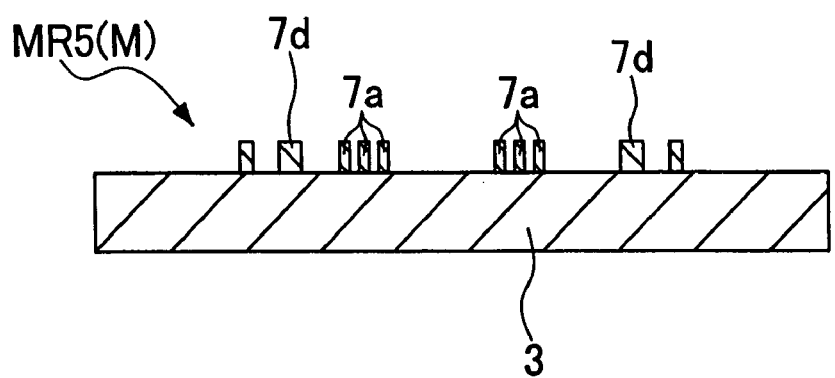
FIG. 21B is a cross-sectional view taken along line A-A in FIG. 21A.
Figure 22A:
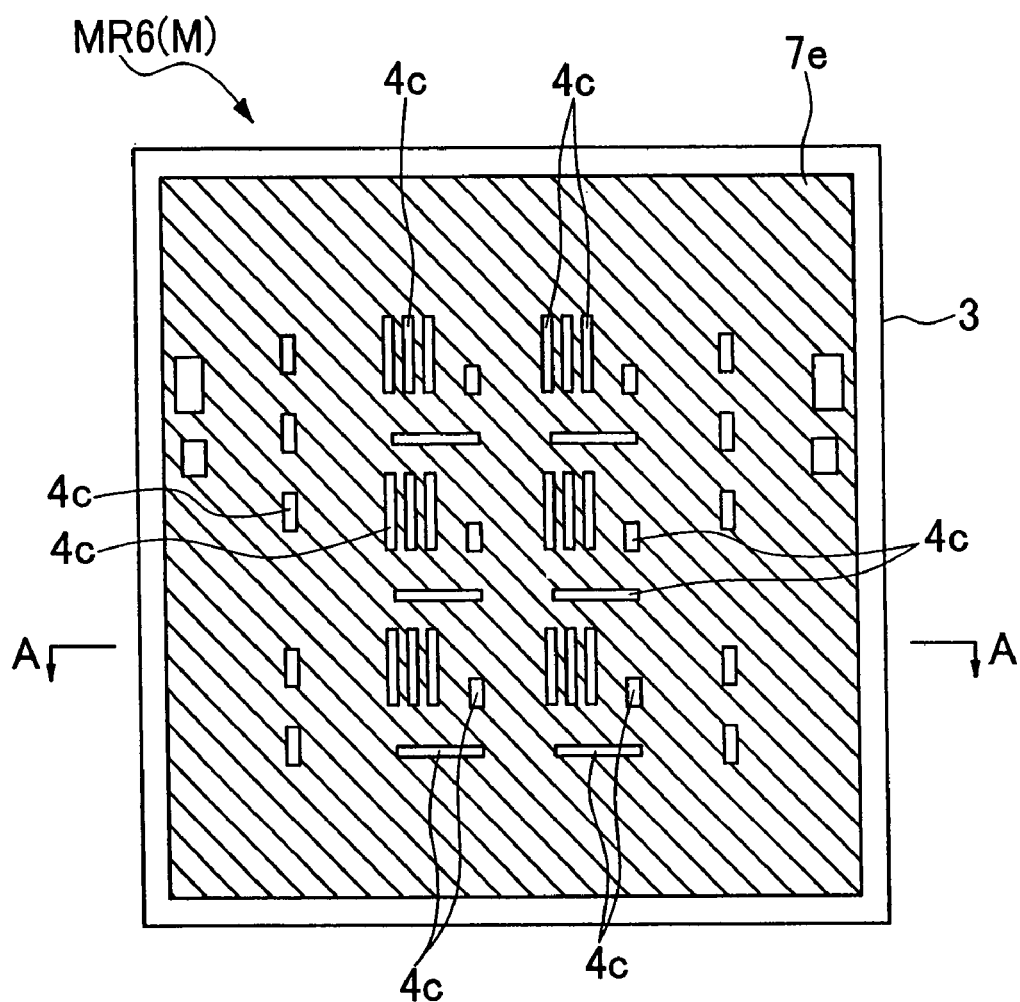
FIG. 22A is a plan view showing an example of a photomask used in the fabrication process of the semiconductor integrated circuit device in FIG. 1.
Figure 22B:
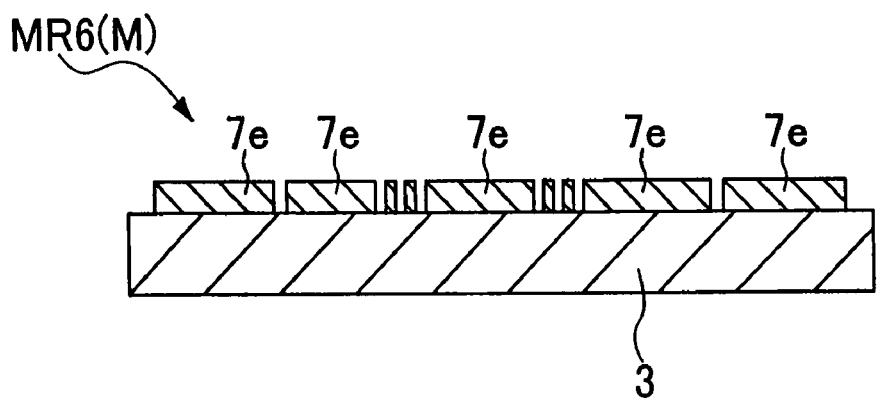
FIG. 22B is a cross-sectional view taken along line A-A in FIG. 22A.
Figures 25A, 25B:
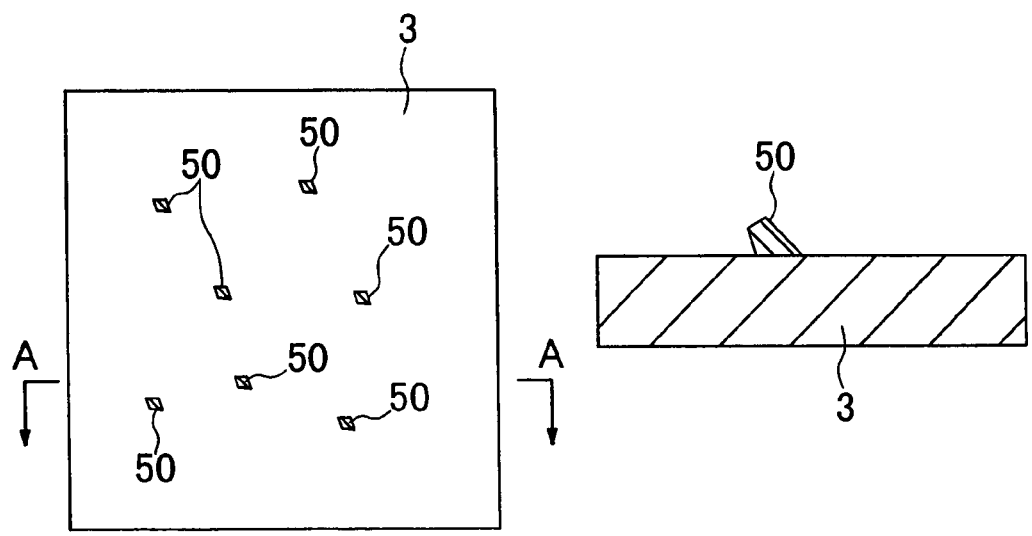
FIG. 25A is a plan view during the re-fabrication process of the photomask shown in FIG. 20.
FIG. 25B is a cross-sectional view taken along line A-A in FIG. 25A.

Next, FIGS. 20 to 22 show another example of the resist shading masks. In each case, a mask, in which all of the opaque patterns on the mask substrate are formed of resist films or the like, is exemplified. Note that FIGS. 20B, 21B and 22B are cross-sectional views taken along line A-A in FIGS. 20A, 21A and 22A, respectively.

In a mask MR4(M) shown in FIGS. 20A and 20B, the opaque pattern 5b located on the periphery of the mask MR1 shown in FIGS. 9A to 9D is formed as the opaque pattern 7c made of the resist film or the like and having the same structure as that of the opaque pattern 7a. The opaque pattern 7c is formed in the same step as the opaque pattern 7a and made of the same material as that of the opaque pattern 7a. Parts of the opaque pattern 7c that mechanically contact to the installation portion of an exposure tool or a mask inspection tool are removed, and the mask substrate 3 is exposed therefrom. Therefore, it is possible to suppress or prevent the occurrence of foreign objects at the time when the mask MR4 is installed into the exposure tool or the mask inspection tool or the like.

In a mask MR5(M) shown in FIGS. 21A and 21B, the opaque pattern 5c of the mask MR2 shown in FIG. 10 is formed as the opaque pattern 7d made of the resist film or the like and having the same structure as that of the opaque pattern 7a. The opaque pattern 7d is formed in the same step as the opaque pattern 7a and made of the same material as that of the opaque pattern 7a.

Figure 5A:
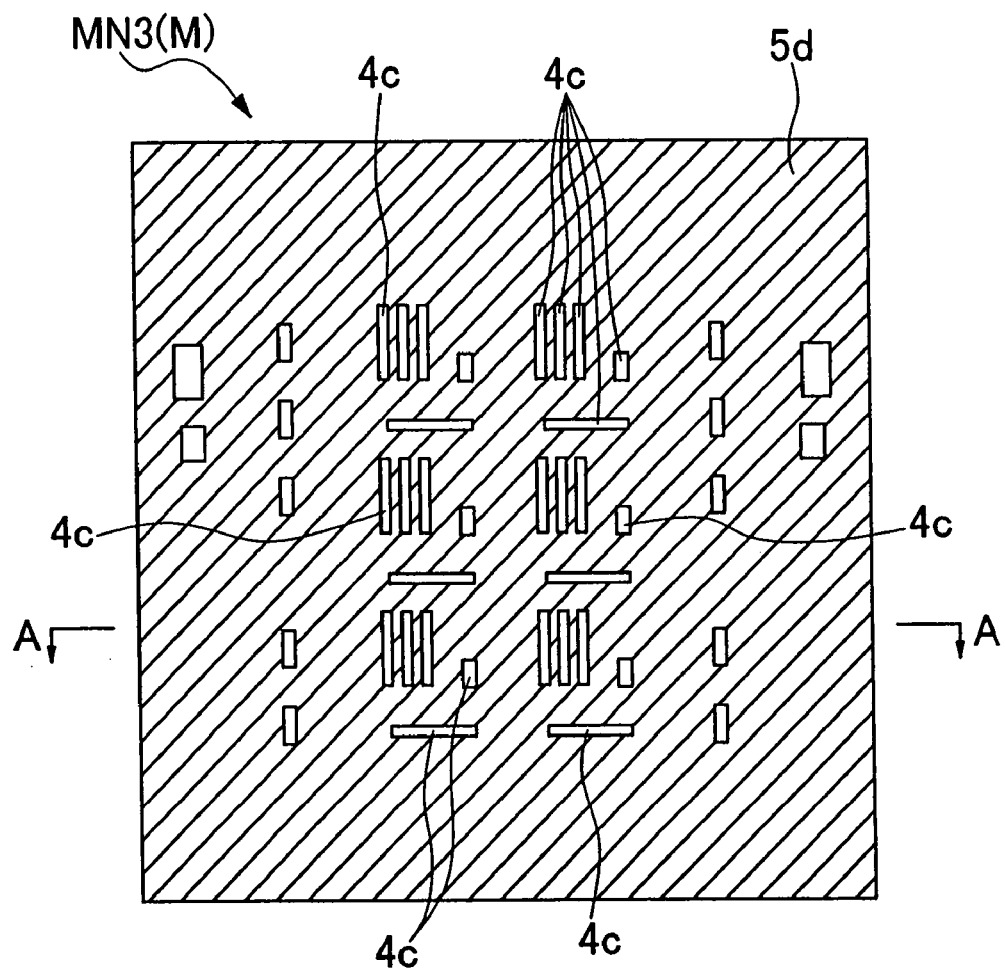
FIG. 5A is a plan view showing an example of a photomask used in the fabrication process of the semiconductor integrated circuit device in FIG. 1.
Figure 5B:
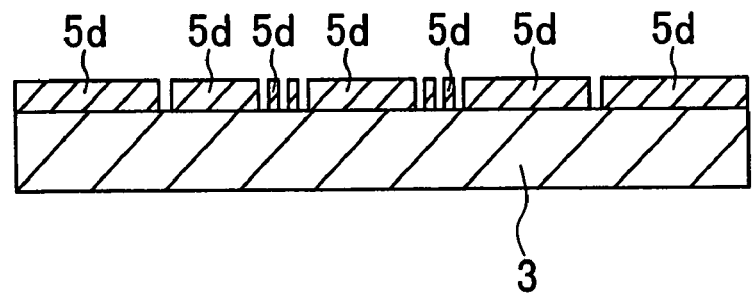
FIG. 5B is a cross-sectional view taken along line A-A in FIG. 5A.
Figure 6A:
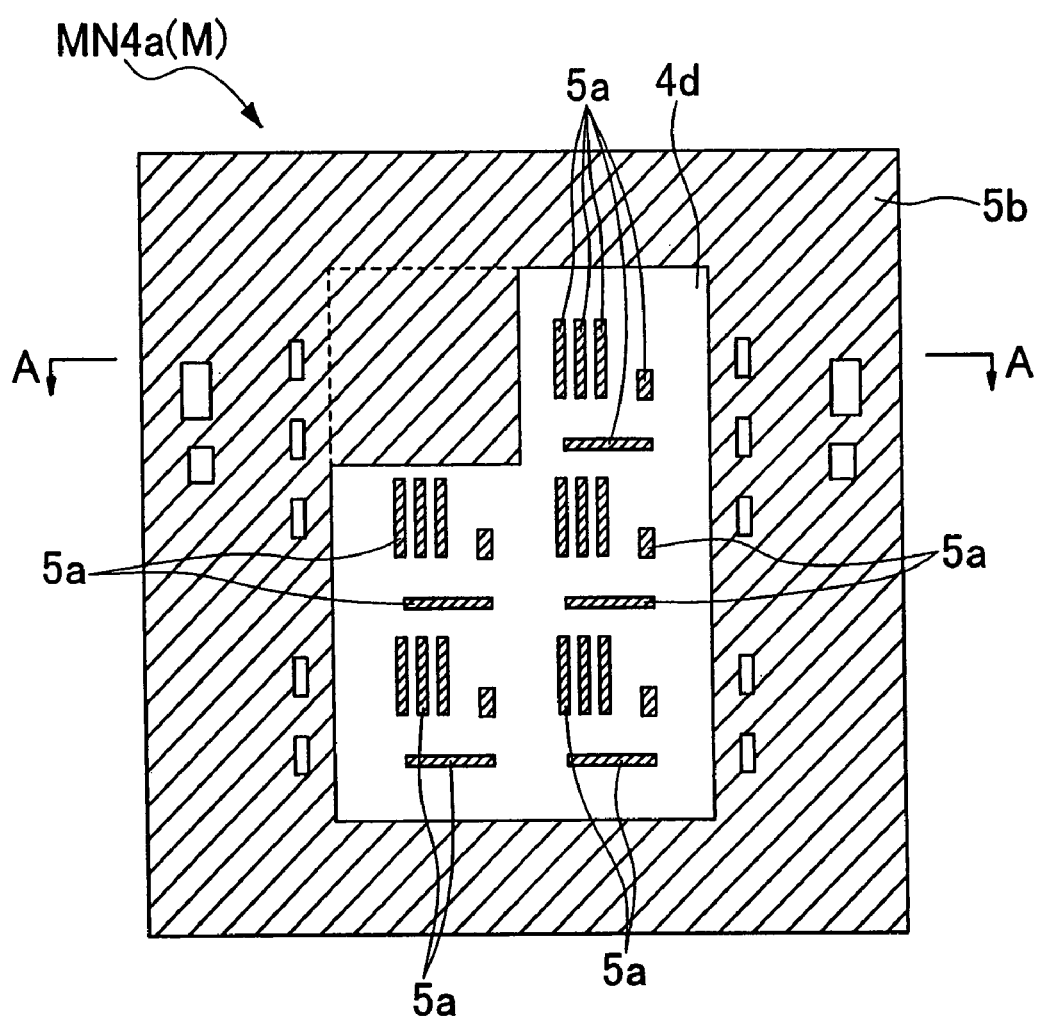
FIG. 6A is a plan view showing an example of a photomask used in the fabrication process of the semiconductor integrated circuit device in FIG. 1.
Figure 6B:
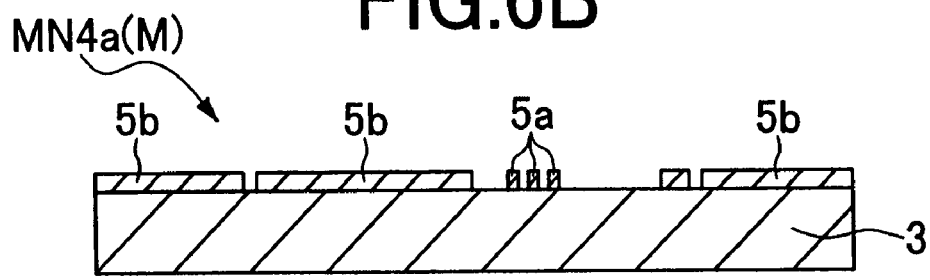
FIG. 6B is a cross-sectional view taken along line A-A in FIG. 6A.

In a mask MR6(M) in FIGS. 22A and 22B, the opaque film 5d of the conventional mask MN3 shown in FIGS. 5A and 5B is formed as the opaque film 7e made of the resist film or the like and having the same structure as that of the opaque pattern 7a. Parts of the opaque film 7e that mechanically contact to the installation portion of an exposure tool or a mask inspection tool or the like are removed, and the mask substrate 3 is exposed therefrom. Therefore, it is possible to suppress or prevent the occurrence of foreign objects at the time when the mask MR6 is installed into the exposure tool or the mask inspection tool or the like.

An example of the fabrication steps and modifying/altering steps of the above-described resist shading mask will be described based on FIGS. 23 to 27. Note that FIGS. 23B, 24B, 25B, 26B and 27B are cross-sectional views taken along line A-A in FIGS. 23A, 24A, 25A, 26A and 27A, respectively. Also, the description thereof will be made of the fabrication method and the modifying/altering method of the mask MR4 shown in FIGS. 20A and 20B, as an example.

First, the mask substrate 3 is prepared as one of blanks (FIGS. 23A and 23B), and the resist film 7 made of the photo-reactive organic resin film used to form the opaque member is coated thereon (FIGS. 24A and 24B). Subsequently, the opaque patterns 7a and 7c made of the resist film shown in FIGS. 20A and 20B are formed by performing the mask pattern writing and the development, and thereby the fabrication of the mask MR4 is completed. It is also preferable to add the photo-absorbing material, photo-shading material, or photo-attenuating material to the opaque patterns 7a and 7c made of the resist film. In addition, it is also preferable that a laminated film of a photo-absorbing organic film and an organic photoreactive resin film is formed and used as the resist film, or that a laminated film of an organic photoreactive resin film and an anti-reflective layer is formed and used as the resist film. Further, it is preferable to perform the hardening process after formation of the opaque patterns 7a and 7c made of the resist film.

Figures 26A, 26B:
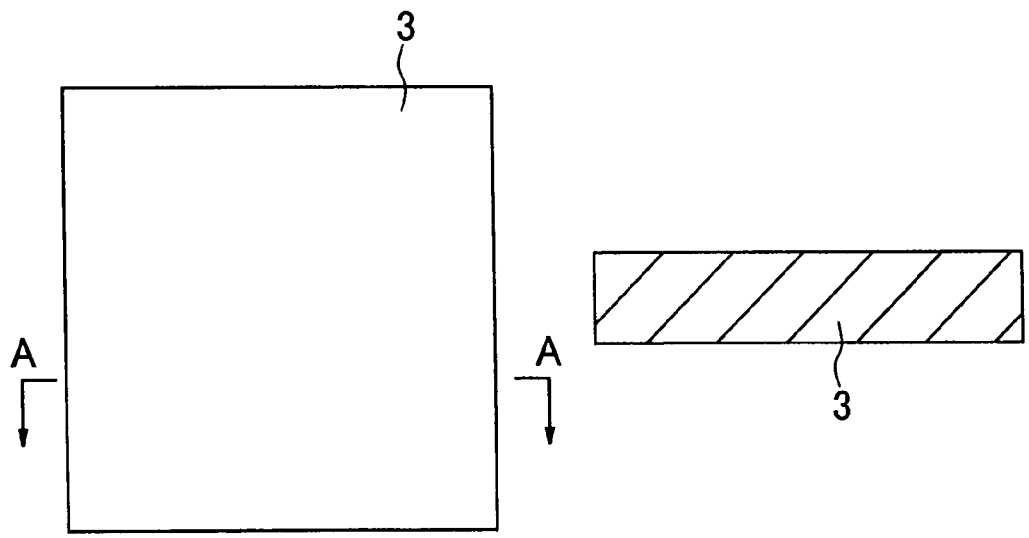
FIG. 26A is a plan view during the re-fabrication process of the photomask shown in FIG. 25 subsequently to FIG. 25.
FIG. 26B is a cross-sectional view taken along line A-A in FIG. 26A.
Figure 27A:
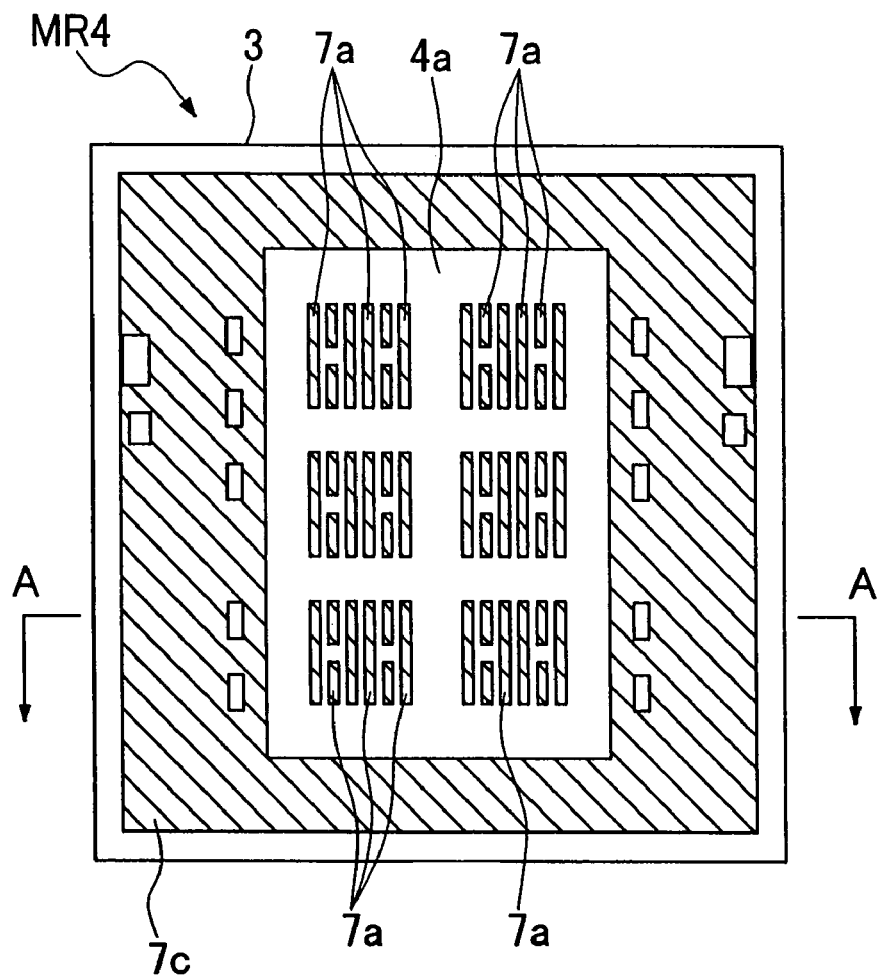
FIG. 27A is a plan view during the re-fabrication process of the photomask shown in FIG. 25 subsequently to FIG. 26.
Figure 27B:
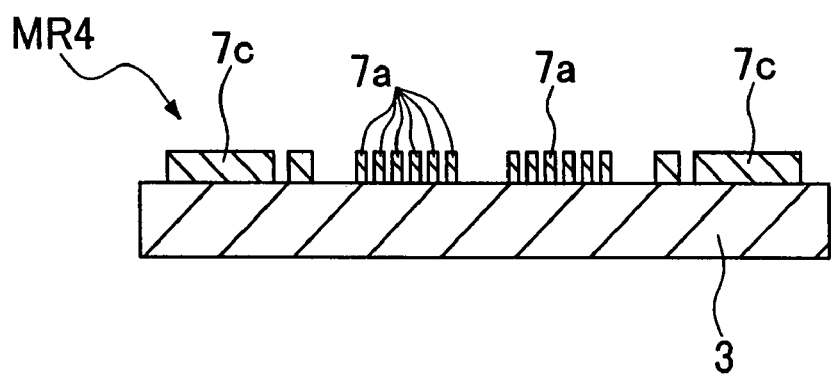
FIG. 27B is a cross-sectional view taken along line A-A in FIG. 27A.

Subsequently, the process of modifying and altering the mask pattern of the mask MR4 is performed in such a manner as follows. That is, the opaque patterns 7a and 7c as described above are first removed by the use of, for example, the organic solvent, the oxygen plasma ashing, or the peeling as described above (FIGS. 25A and 25B). Subsequently, the mask substrate 3 is cleaned similarly to the foregoing, and thereby the foreign objects 50 on the surface of the mask substrate 3 are removed, and the mask substrate 3 is led to the state of the blanks shown in FIGS. 23A and 23B (FIGS. 26A and 26B). Thereafter, similar to the fabrication process of the resist shading mask, the resist film 7 is coated on the mask substrate 3, and the mask pattern writing and the development are performed thereto and thereby the opaque patterns 7a and 7c made of the resist film is formed, and thus the fabrication of the mask MR4 is completed (FIGS. 27A and 27B). In this case, such an example has been described that the opaque pattern 7a having the shape and arrangement different from those of the opaque pattern 7a shown in FIGS. 20A and 20B is formed. Of course, a pattern the same as the opaque pattern 7a shown in FIGS. 20A and 20B may be formed.

In the case of the resist shading mask as described above, since the metal is not used therein, the modifications and alterations of the opaque member can be performed more easily than the conventional mask in a short time and that with the reliability of the mask substrate ensured. Also, since the process cost, material cost, and fuel cost can be reduced, the significant reduction in the cost of a mask can be achieved. Therefore, the resist shading mask of this type is also suitably used in the case where the mask pattern is frequently modified and altered or in the case where frequency of use common to masks is small, in other words, in the development period of the semiconductor integrated circuit device, in the fabrication process of a small quantity of various types of semiconductor integrated circuit devices, or the like.

Further, FIGS. 28 to 32 show still another example of the resist shading mask described above. In this case, a mask is exemplified in which the pattern for printing the integrated circuit pattern onto the mask substrate has both of an opaque pattern made of metal and an opaque pattern made of the resist film. Note that FIGS. 28B, 29B, 30B and 32B is cross-sectional views taken along line A-A in FIGS. 28A, 29A, 30A and 32A, respectively.

Figure 3A:
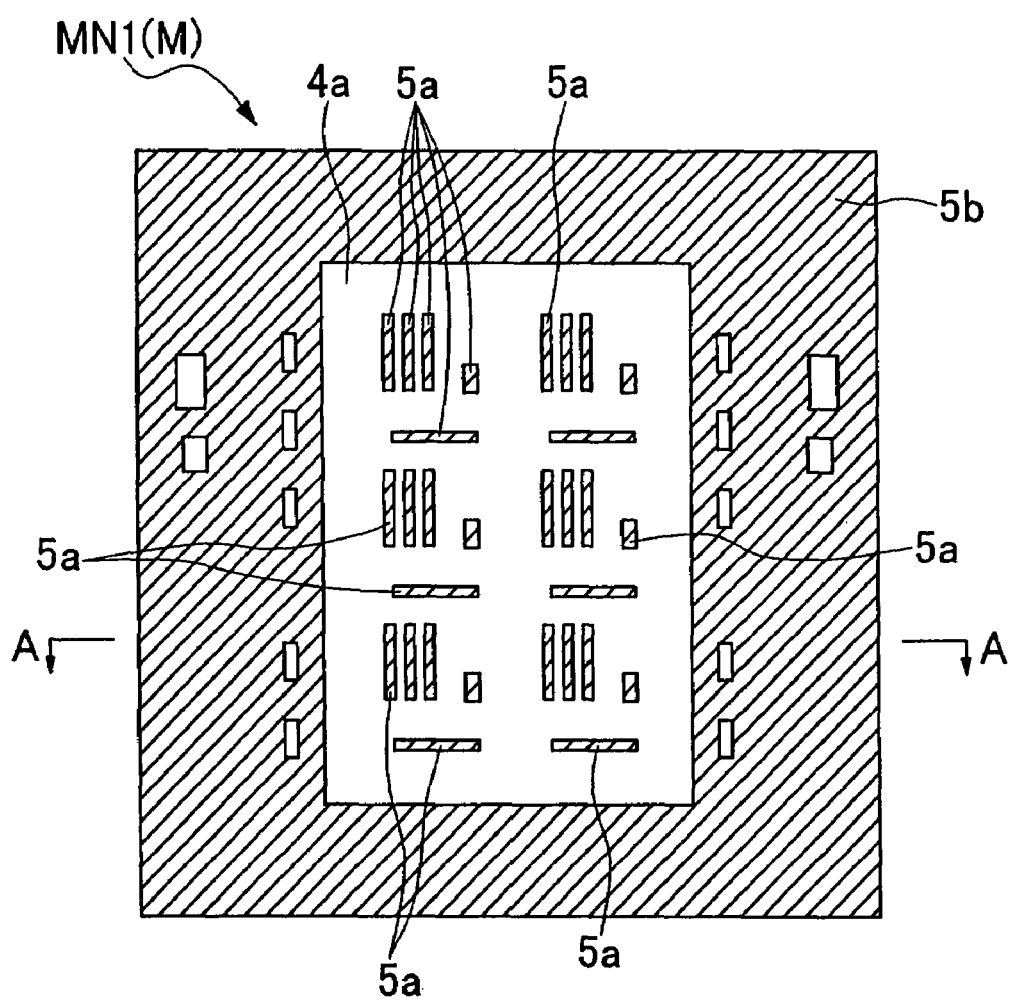
FIG. 3A is a plan view showing an example of a photomask used in the fabrication process of the semiconductor integrated circuit device in FIG. 1.
Figure 3B:
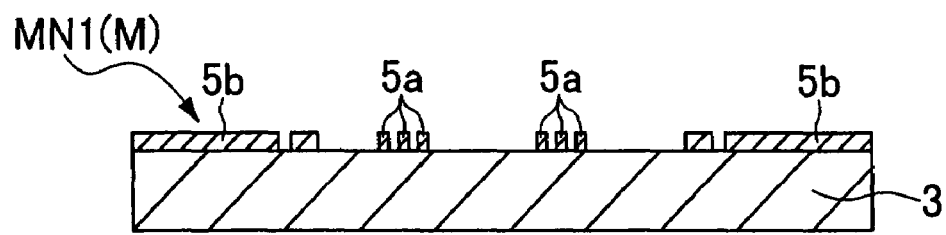
FIG. 3B is a cross-sectional view taken along line A-A in FIG. 3A.
Figure 28A:
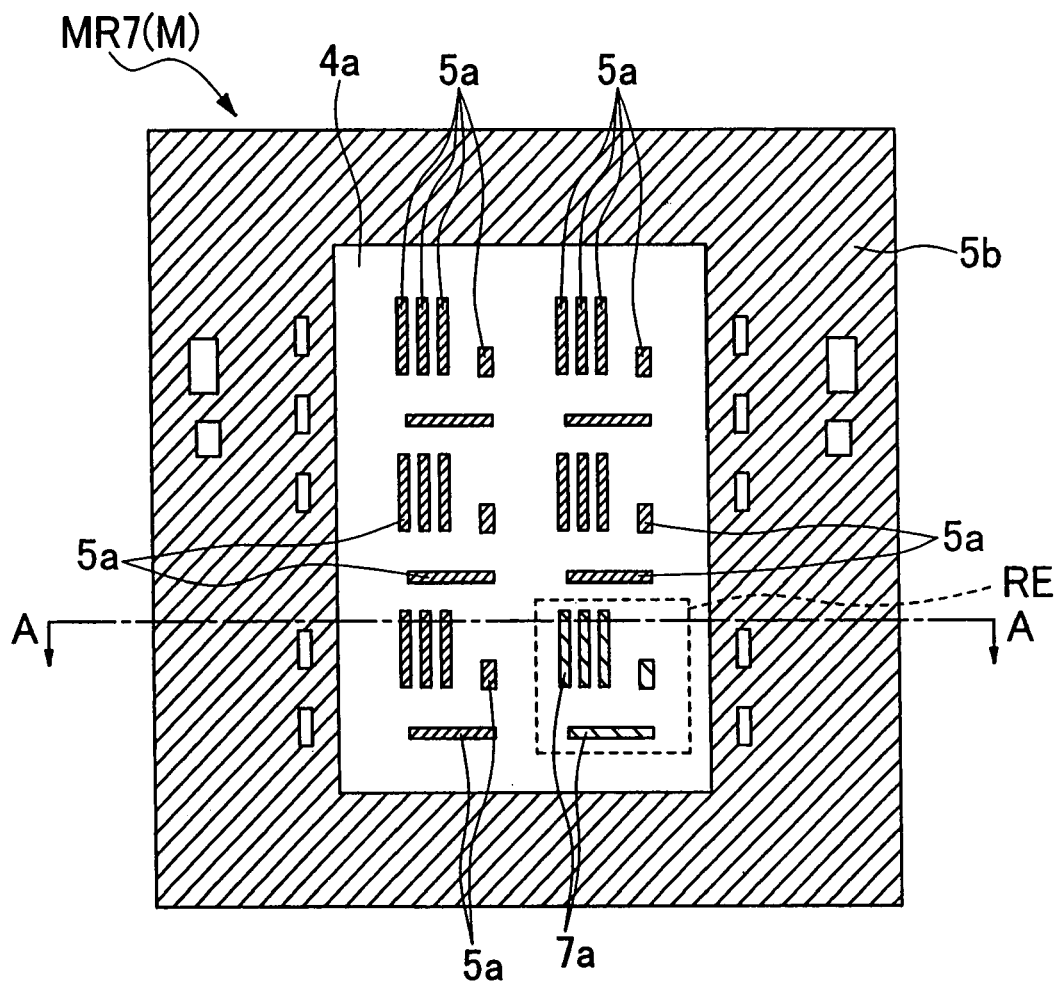
FIG. 28A is a plan view showing an example of the photomask used in the fabrication process of the semiconductor integrated circuit device in FIG. 1.
Figure 28B:
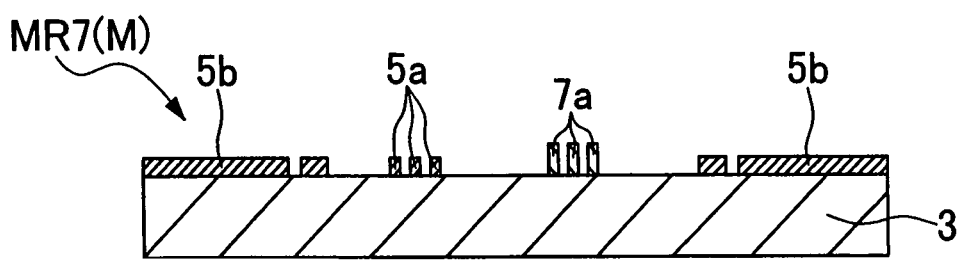
FIG. 28B is a cross-sectional view taken along line A-A in FIG. 28A.

In a mask MR7(M) shown in FIGS. 28A and 28B, a group of the opaque patterns 5a located in a part of the integrated circuit pattern circuit region of the conventional mask MN1 shown in FIGS. 3A and 3B described above are formed as a group of the opaque patterns 7a made of the resist film.

Figure 4A:
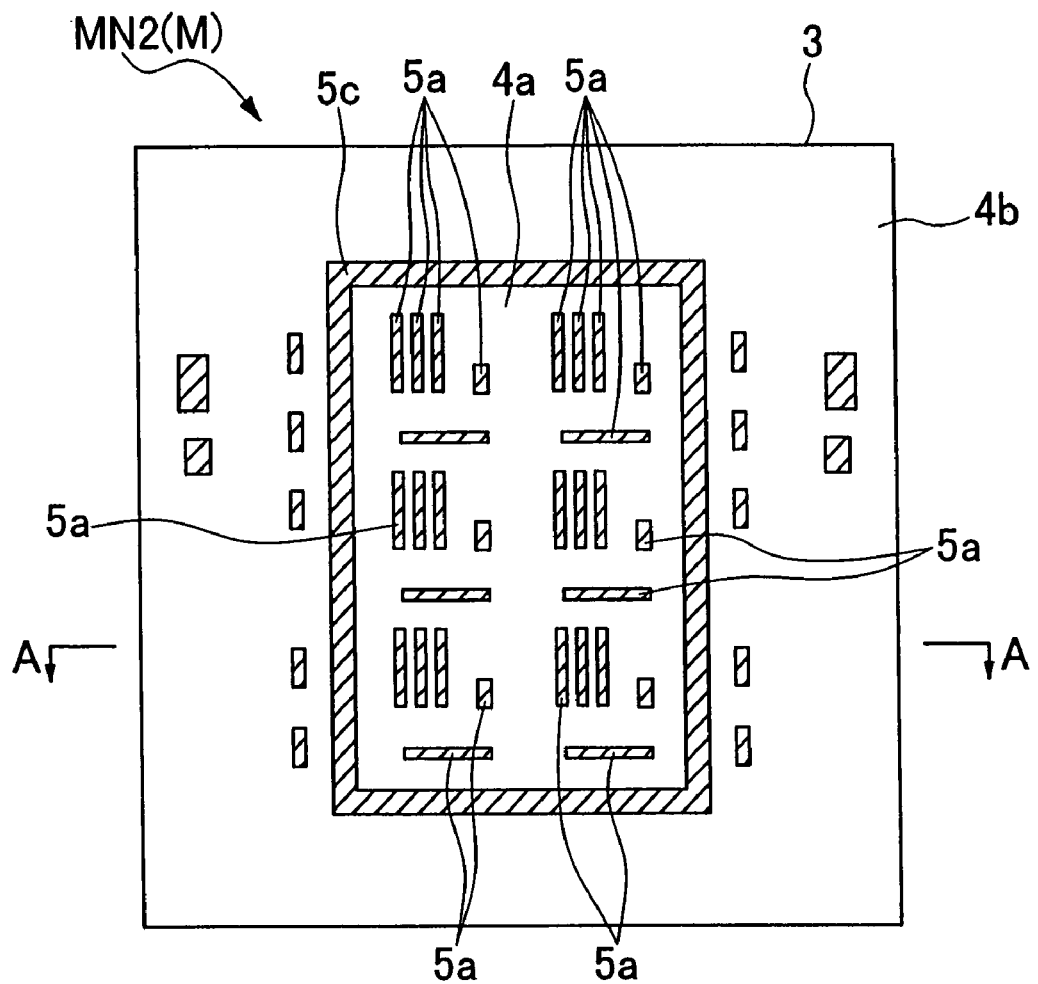
FIG. 4A is a plan view showing an example of a photomask used in the fabrication process of the semiconductor integrated circuit device in FIG. 1.
Figure 4B:
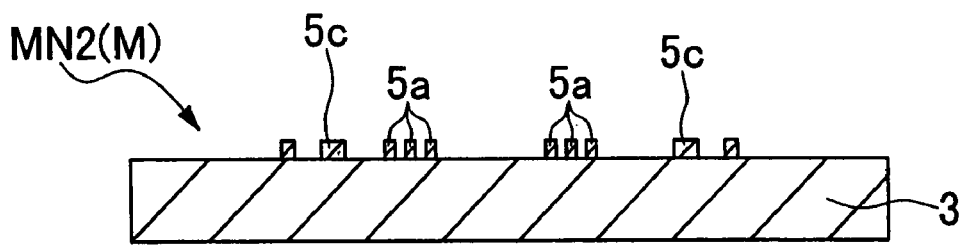
FIG. 4B is a cross-sectional view taken along line A-A in FIG. 4A.
Figure 29A:
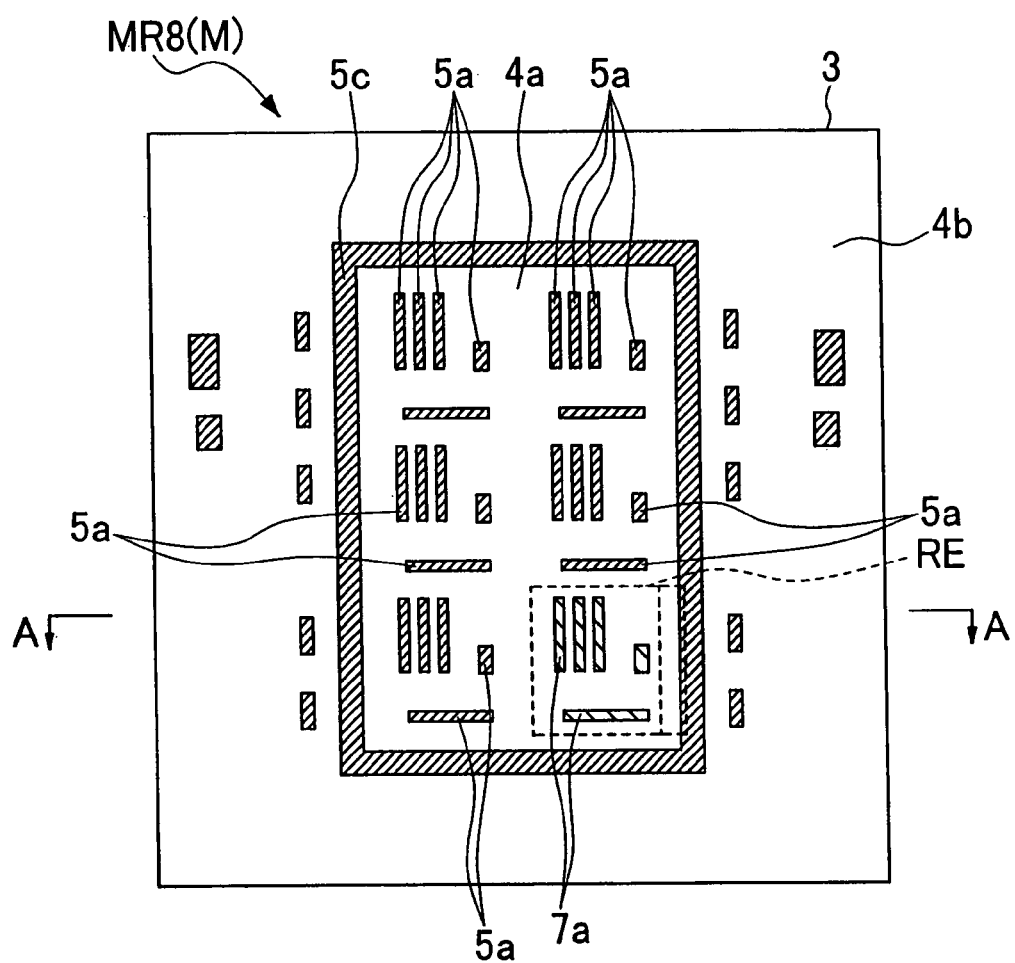
FIG. 29A is a plan view showing an example of the photomask used in the fabrication process of the semiconductor integrated circuit device in FIG. 1.
Figure 29B:
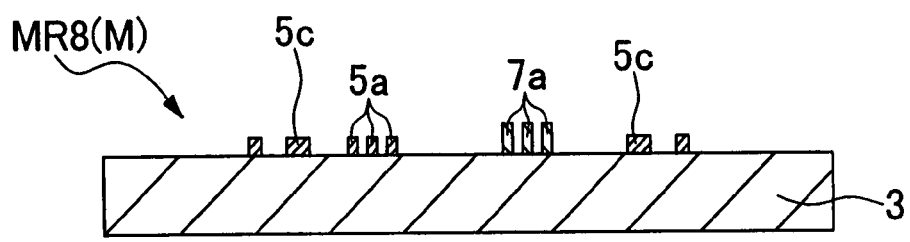
FIG. 29B is a cross-sectional view taken along line A-A in FIG. 29A.

In a mask MR8(M) shown in FIGS. 29A and 29B, a group of the opaque patterns 5a located in a part of the integrated circuit pattern circuit region of the conventional mask MN1 shown in FIGS. 4A and 4B described above are formed as a group of the opaque patterns 7a made of the resist film.

Figure 30A:
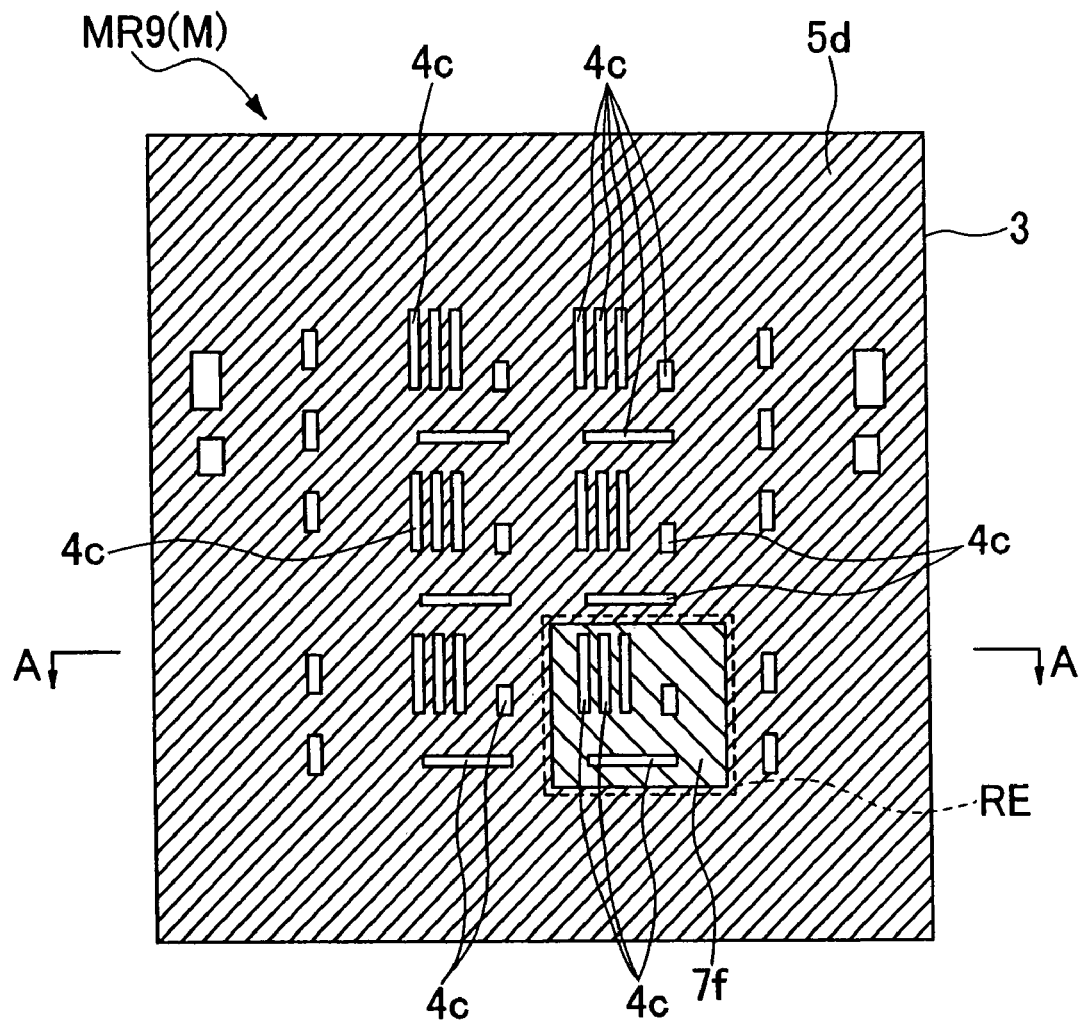
FIG. 30A is a plan view showing an example of the photomask used in the fabrication process of the semiconductor integrated circuit device in FIG. 1.
Figure 30B:
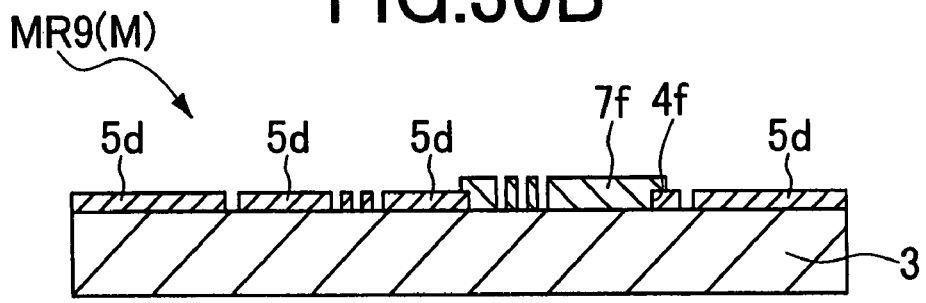
FIG. 30B is a cross-sectional view taken along line A-A in FIG. 30A.

In a mask MR9(M) shown in FIGS. 30A and 30B, a clear region 4f having a square shape in two dimensions and having a relatively small area is formed like an opening in a part of the opaque film 5d in the integrated circuit pattern circuit region of the conventional mask MN1 shown in FIGS. 5A and 5B, and the clear region 4f is covered with an opaque film 7f made of the resist film having the same structure as the opaque pattern 7a. Also, parts of the opaque film 7f are removed to form the clear pattern 4c for printing the integrated circuit pattern.

Figure 31A:
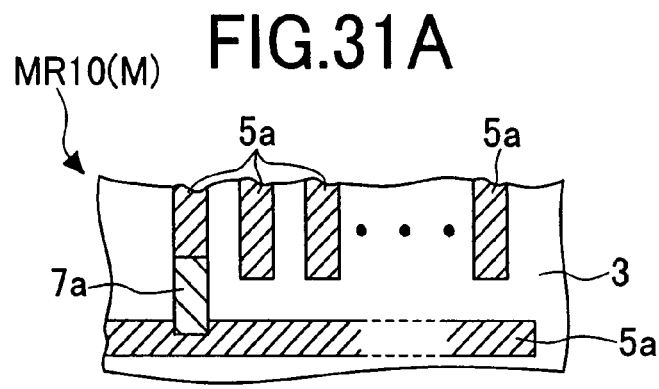
FIG. 31A is a plan view showing the principal part of an example of the photomask used in the fabrication process of the semiconductor integrated circuit device of FIG. 1.
Figure 31B:
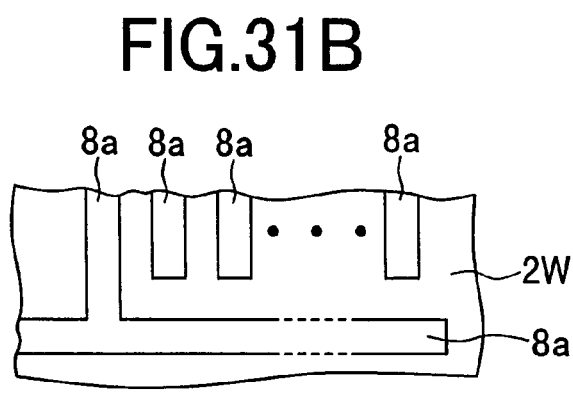
FIG. 31B is a plan view showing the principal part of the pattern printed by using the photomask shown in FIG. 31A.
Figure 31C:
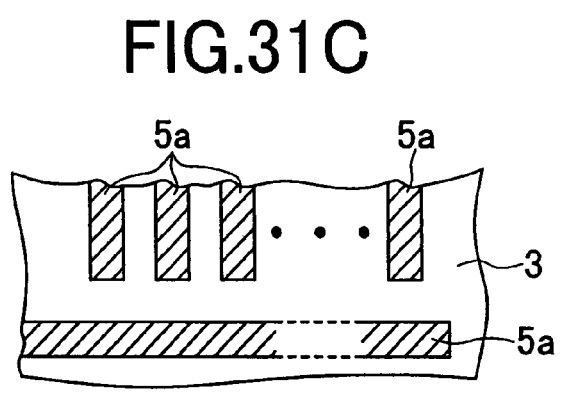
FIG. 31C is a plan view showing the principal part of the photomask in FIG. 31A in a state where an opaque member made of an organic material containing an organic photo-reactive resin film of the photomask is removed.
Figure 31D:
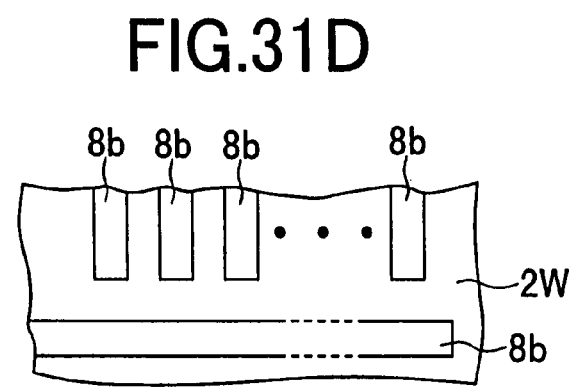
FIG. 31D is a plan view showing the principal part of a semiconductor wafer illustrating a pattern to be printed, by the use of the photomask of FIG. 31C, onto a semiconductor wafer.

A mask MR10(M) in FIG. 31A exemplifies a mask in which an opaque pattern 7g made of the resist film or the like having the same structure as the opaque pattern 7a is arranged only in a part. In this case, the opaque pattern 7g is arranged so as to connect the opaque patterns 5a made of metal and arranged separately from each other. FIG. 31B shows a pattern 8a to be printed onto a wafer by a exposure treatment using the mask MR10 shown in FIG. 31A. FIG. 31C shows a state of a metal mask on which the opaque pattern 7g made of the resist film or the like shown in FIG. 31A is removed. And further, FIG. 31D schematically shows a pattern 8b obtained by printing, onto a wafer, the pattern of the metal mask shown in FIG. 31C.

Figure 7A:
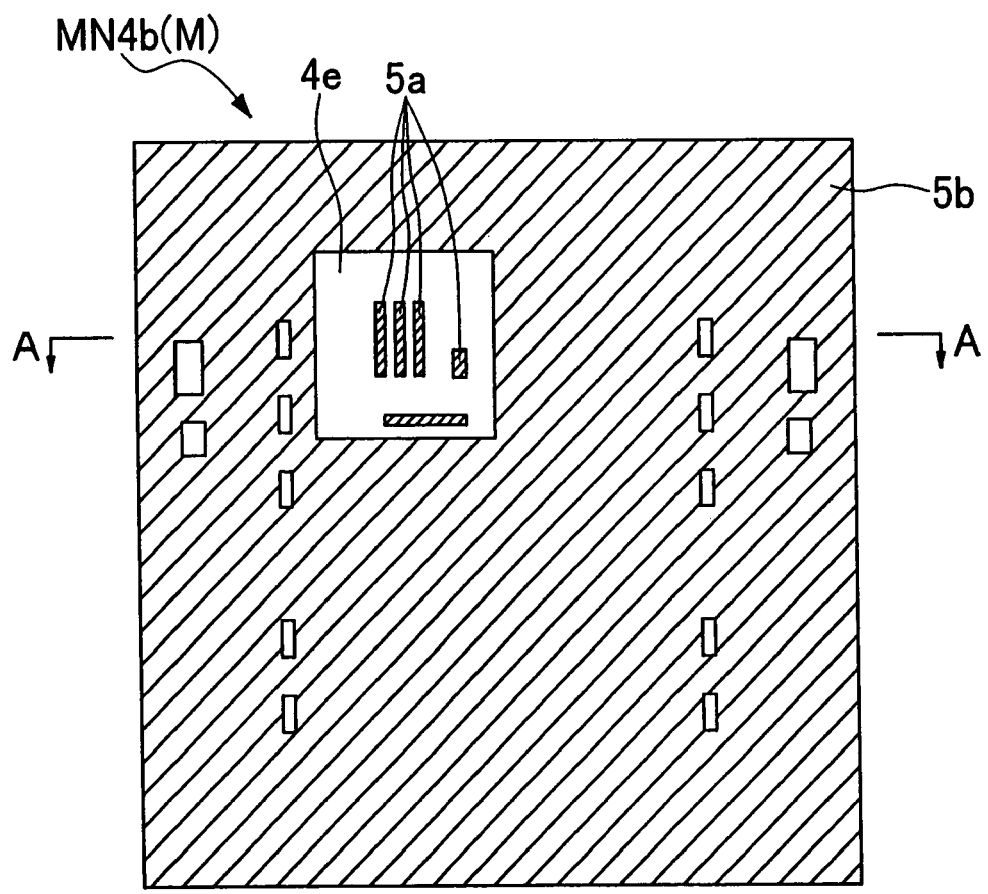
FIG. 7A is a plan view showing an example of a photomask used in the fabrication process of the semiconductor integrated circuit device in FIG. 1.
Figure 7B:
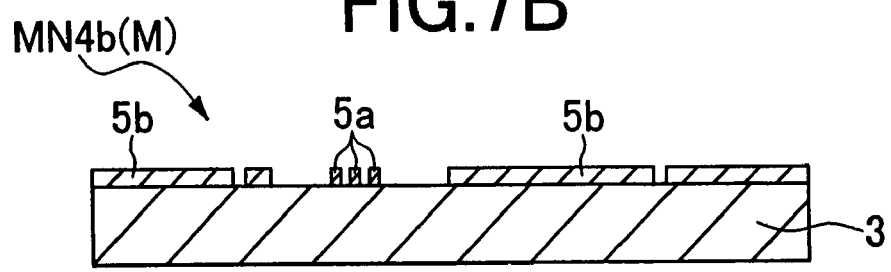
FIG. 7B is a cross-sectional view taken along line A-A in FIG. 7A.
Figure 32A:
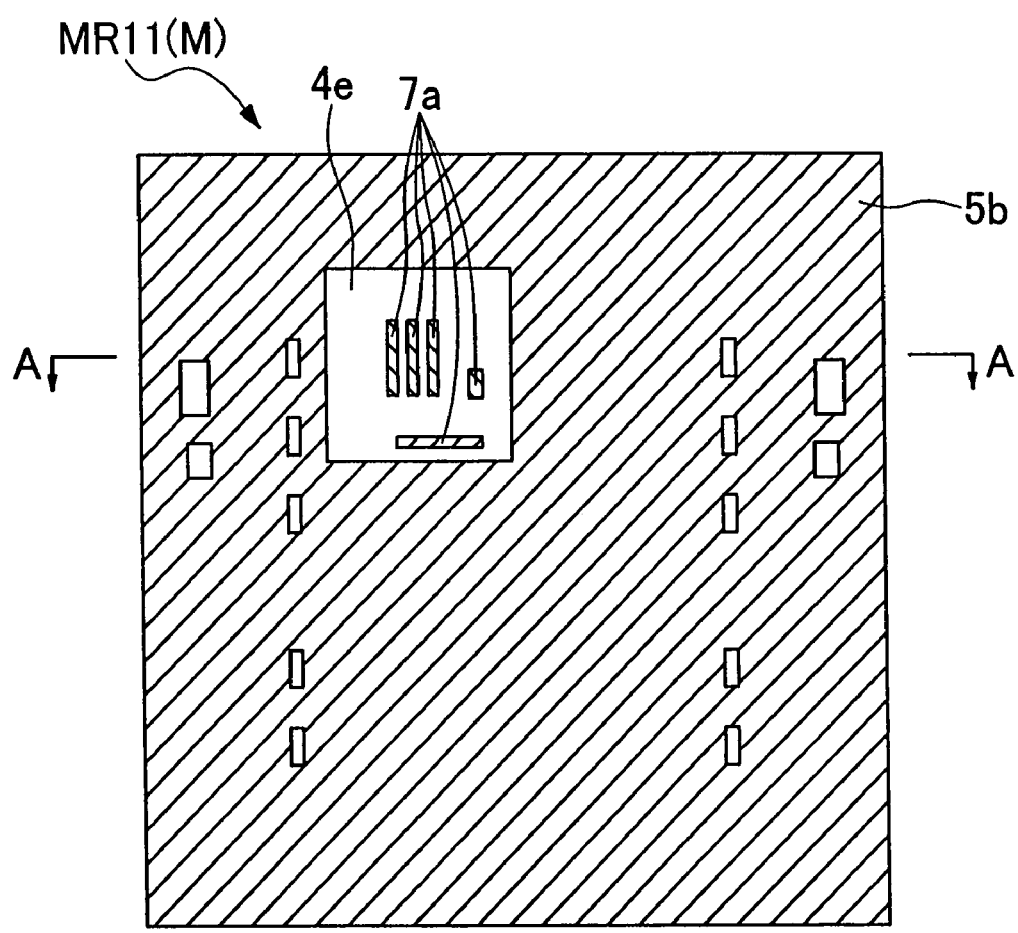
FIG. 32A is a plan view showing an example of the photomask used in the fabrication process of the semiconductor integrated circuit device in FIG. 1.
Figure 32B:
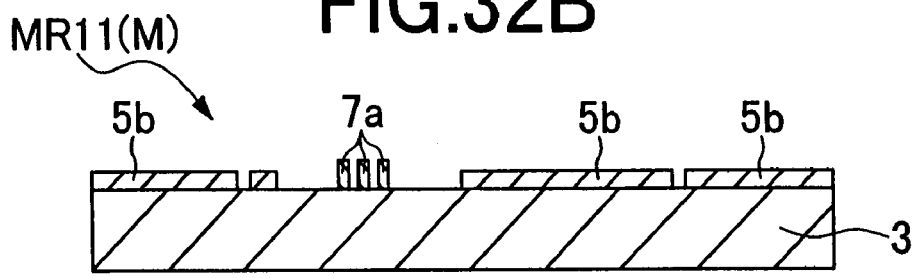
FIG. 32B is a cross-sectional view taken along line A-A in FIG. 32A.

A mask MR11 in FIGS. 32A and 32B exemplifies one of the masks used in the overlapping exposure described above. In the mask MR11, a group of opaque patterns 5a made of metal in the clear region 4e of the mask MN4b shown in FIGS. 7A and 7B are formed as a group of opaque patterns 7a made of the resist film or the like. In this case, the modifications and alterations can be made in the opaque pattern 7a in a short time and more easily than the case of the mask MN4b shown in FIGS. 7A and 7B. Also, the process cost, material cost, and fuel cost can be further reduced. Thus, the significant reduction in the cost of a mask can be achieved. The other masks are the same as the mask MN4a shown in FIGS. 6A and 6B, and so the description thereof will be omitted. The overlapping exposure of the masks MN4a and MR11, and the method of forming the resist pattern of the masks MN4a and MR11 are the same as those of the masks MN4a and MN4b.

An example of the fabrication steps and modifying/altering steps of the above-described resist shading mask will be described based on FIGS. 33 to 40. Note that FIGS. 33B, 34B, 35B, 36B, 37B, 38B, 39B and 40B are cross-sectional views taken along line A-A in FIGS. 33A, 34A, 35A, 36A, 37A, 38A, 39A and 40A, respectively. Also, in this case, description will be mainly made of the fabrication method and the modifying/altering method of the mask MR7 shown in FIGS. 28A and 28B, as an example.

Figure 33A:
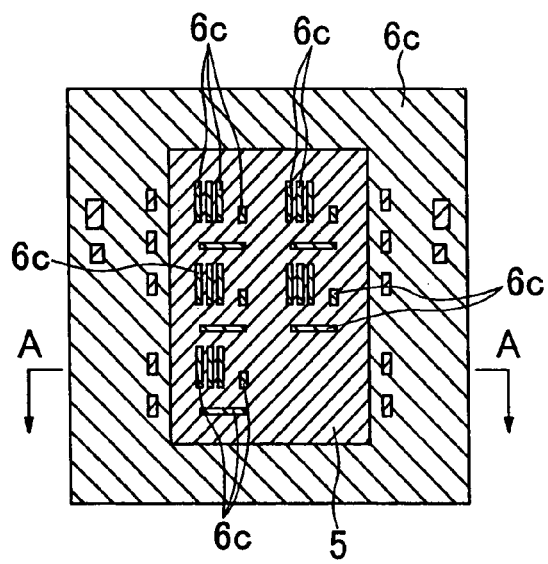
FIG. 33A is a plan view during the fabrication process of the photomask shown in FIG. 28.
Figure 33B:
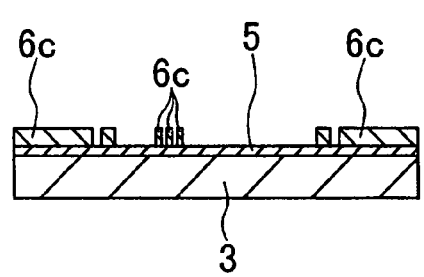
FIG. 33B is a cross-sectional view taken along line A-A in FIG. 33A.
Figure 34A:
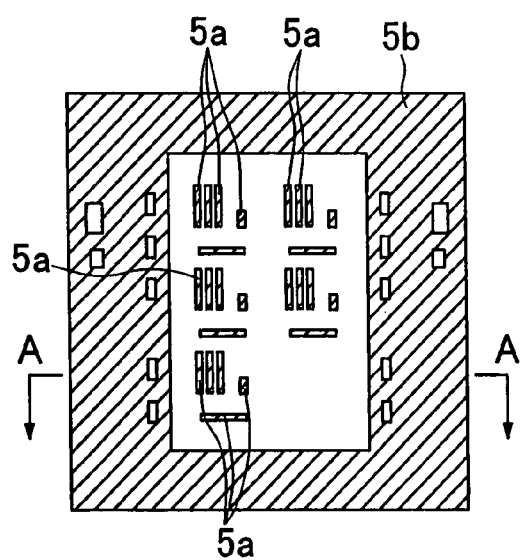
FIG. 34A is a plan view during the fabrication process of the photomask shown in FIG. 28 subsequently to FIG. 33.
Figure 34B:
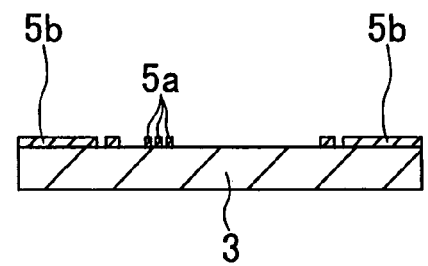
FIG. 34B is a cross-sectional view taken along line A-A in FIG. 34A.
Figure 35A:
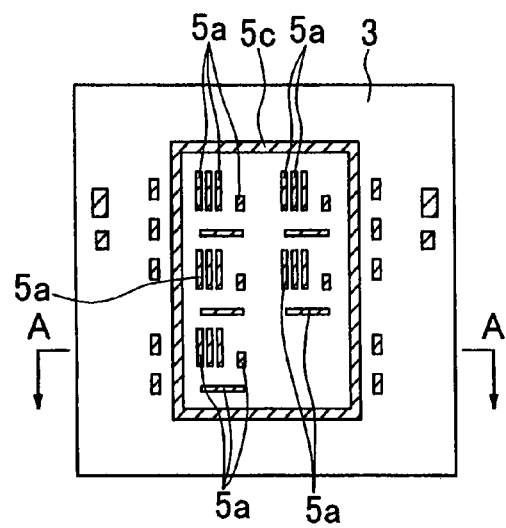
FIG. 35A is a plan view during the fabrication process of the photomask shown in FIG. 29.
Figure 35B:
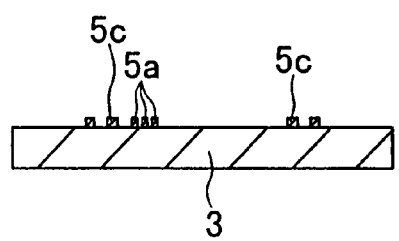
FIG. 35B is a cross-sectional view taken along line A-A in FIG. 35A.
Figure 36A:
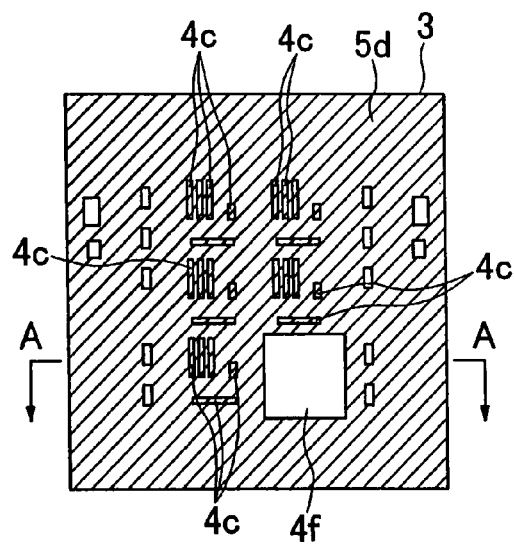
FIG. 36A is a plan view during the fabrication process of the photomask shown in FIG. 30.
Figure 36B:
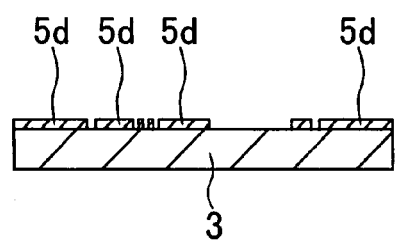
FIG. 36B is a cross-sectional view taken along line A-A in FIG. 36A.
Figure 38A:
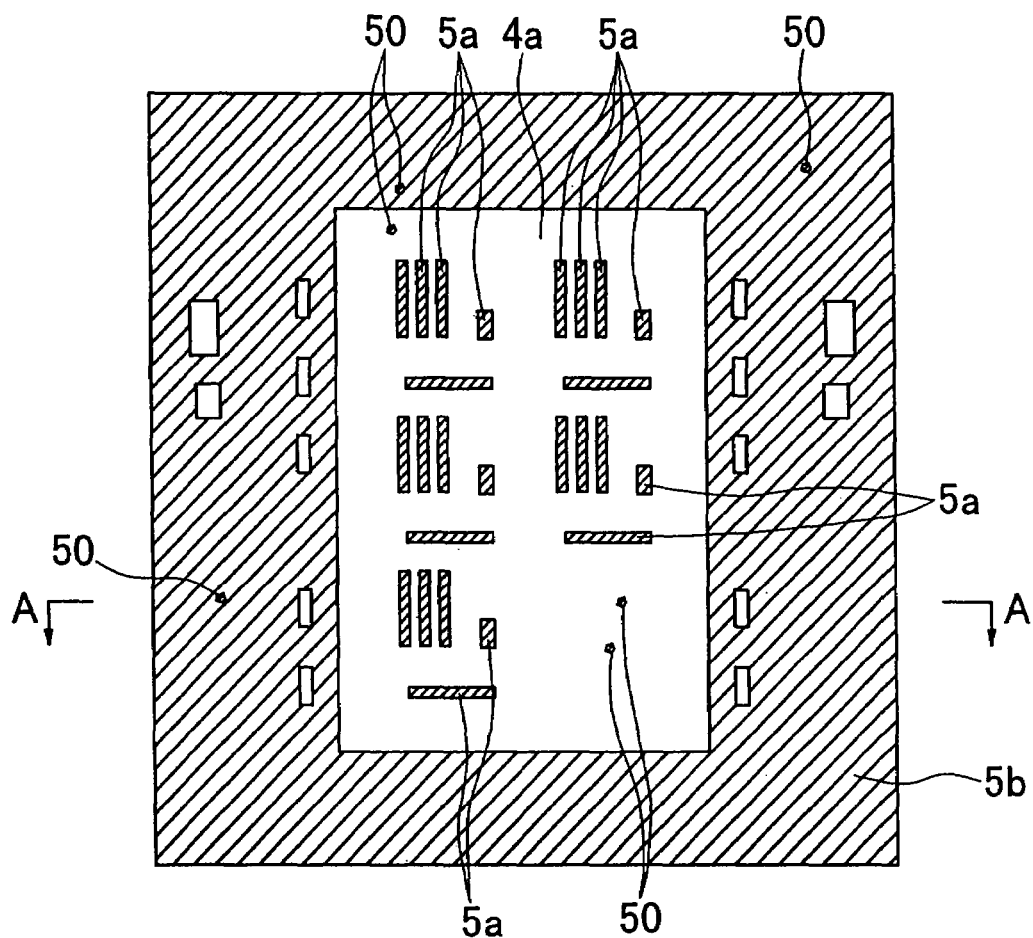
FIG. 38A is a plan view during the re-fabrication process of the photomask shown in FIG. 28.
Figure 38B:
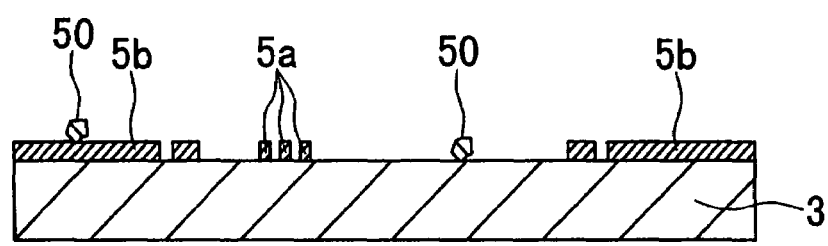
FIG. 38B is a cross-sectional view taken along line A-A in FIG. 38A.
Figure 39A:
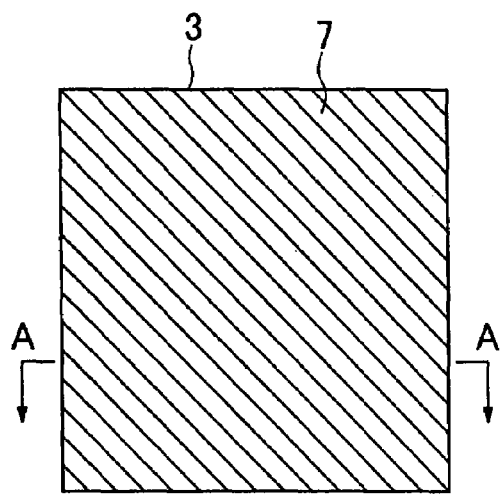
FIG. 39A is a plan view during the re-fabrication process of the photomask shown in FIG. 28 subsequently to FIG. 38.
Figure 39B:
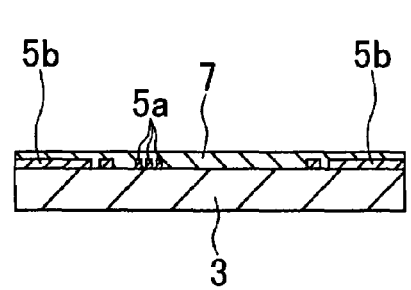
FIG. 39B is a cross-sectional view taken along line A-A in FIG. 39A.

First, after the above-mentioned opaque film 5 made of metal is deposited on the mask substrate 3, the resist film reactive to an electron beam is coated thereon and an electron beam having a predetermined pattern data is irradiated thereto to perform the development and thus the resist pattern 6c is formed (FIGS. 33A and 33B). Subsequently, the resist pattern 6c is used as an etching mask to etch the opaque film 5 and to form opaque patterns 5a and 5b. Thereafter, the resist pattern 6c is removed (FIGS. 34A and 34B). In this case, the opaque pattern 5a for printing the integrated circuit pattern is also formed on the mask substrate 3. The states of the masks MR8 and MR9 after this step are shown in FIGS. 35 and 36, respectively. Thereafter, similarly to the foregoing, the resist film 7 is coated on the main surface of the mask substrate 3 having the opaque patterns 5a and 5b formed thereon (FIGS. 37A and 37B). Then, by performing the mask pattern writing and the development, the opaque pattern 7a made of the resist film shown in FIGS. 28A and 28B is formed, and thus the fabrication of the mask MR7 is completed.

Figure 40A:
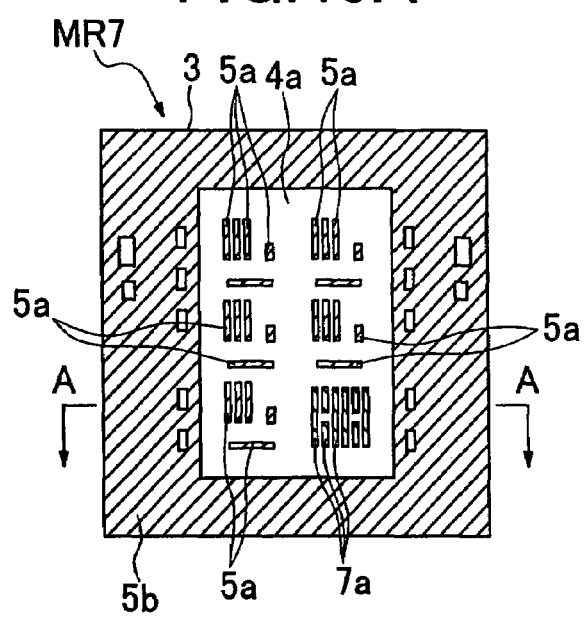
FIG. 40A is a plan view during the re-fabrication process of the photomask shown in FIG. 28 subsequently to FIG. 39.
Figure 40B:
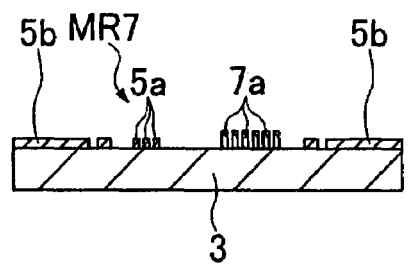
FIG. 40B is a cross-sectional view taken along line A-A in FIG. 40A.

Subsequently, the process of modifying or altering the mask pattern of the mask MR7 performed in such a manner as follows. That is, the opaque pattern 7a described above is first removed by the use of, for example, the organic solvent, the oxygen plasma ashing, or the peeling as described above (FIGS. 38A and 38B). In this case, the opaque pattern 5a for printing the integrated circuit pattern is not removed. Subsequently, the mask substrate 3 is cleaned similarly to the foregoing, and thereby the foreign objects 50 on the surface of the mask substrate 3 are removed. By so doing, the mask substrate 3 is led to the state of the metal mask shown in FIGS. 34A and 34B. Thereafter, similarly to the fabrication process of the resist shading mask, the resist film 7 is coated on the mask substrate 3 (FIGS. 39A and 39B), and the mask pattern writing and the development are performed thereto, and thereby the opaque patterns 7a made of the resist film is formed, and thus the fabrication of the mask MR4 is completed (FIGS. 40A and 40B). In this case, such an example is described that the opaque pattern 7a having the shape and arrangement different from those of the opaque pattern 7a shown in FIGS. 28A and 28B is formed. Of course, a pattern the same as the opaque pattern 7a shown in FIGS. 28A and 28B may be formed.

The use of the above-described mask makes it possible to avoid the problems of the occurrence of the foreign objects and the pattern defect similar to the foregoing because the opaque member made of metal is formed in the peripheral region of the mask or the mask substrate 3 is exposed therefrom. In addition, in the case of the conventional mask, all of the patterns thereof must be formed again even if modifications and alterations are needed in only a part of the patterns on the mask. However, in the case of the above-mentioned resist shading mask, only a part of the patterns may be modified or altered. Also, it is possible to start the reproduction of the opaque member from the stage after formation of the opaque member made of metal. Therefore, the modifications and alterations thereof can be made easily and in a short time and that with the reliability of the mask substrate ensured. In addition, the process cost, material cost, and fuel cost can be reduced, and the significant reduction in the cost of a mask can be achieved. As a result, the resist shading mask of this type is also suitably used in the case where the mask pattern is frequently modified and altered or in the case where frequency of use common to masks is small, more specifically, in the development period of the semiconductor integrated circuit device, or in the fabrication of a small quantity of various types of semiconductor integrated circuit devices.

Figure 41:
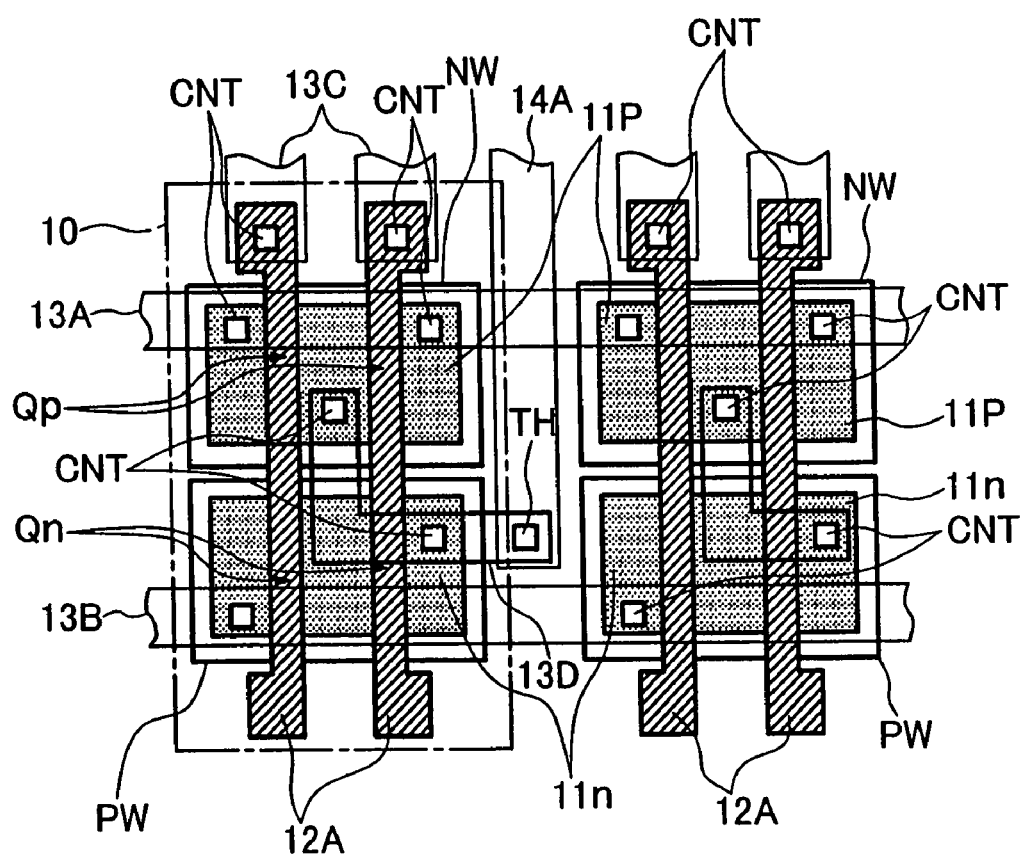
FIG. 41 is a plan view showing the principal part of an example of a semiconductor integrated circuit device according to an embodiment of the present invention.

Next, a specific fabrication example of the semiconductor integrated circuit device will be described. In this example, descriptions will be made of the case where the present invention is applied to a method of fabricating a semiconductor integrated circuit device in a semi-customized manner such as a gate array, a standard cell or the like, or to a method of fabricating a semiconductor integrated circuit device having a customized I/O (Input/Output) circuit, a customized logic circuit, or an I/F (interface) control circuit on a semiconductor substrate. FIG. 41 is a plan view showing a part of a logic device in a semiconductor integrated circuit device.

This logic device is constituted by an unit cell 10 surrounded by a dot and dashed line shown in FIG. 41. This unit cells 10 comprises, for example, two nMISs Qn and two pMISs Qp. Each nMIS Qn is formed on an n type semiconductor region (diffused layer) 11n on a surface of a p well region PW formed over a semiconductor substrate, and each pMIS Qp is formed on a p type semiconductor region (diffused layer) 11p on a surface of an n well region NW. Gate electrodes 12A are common to the nMISs Qn and pMISs Qp, respectively. Each gate electrode 12A is constituted, for example, by: a single film made of low-resistive polycrystalline silicon; a polycide structure in which a silicide layer is provided on the upper portion of a low-resistive polycrystalline silicon film; a polymetal structure in which a metal film such as tungsten or the like is deposited on a low-resistive polycrystalline silicon film through a barrier film such as tungsten nitride or the like; or a damascene gate electrode structure obtained by depositing a barrier film such as titanium nitride or the like in a trench formed in an dielectric film, and further by filling, thereon, a metal film such as copper or the like. The part of the semiconductor substrate below each gate electrode 12A serves as a channel region.

A wiring 13A is a power supply wiring, for example, in a high potential side (e.g., about 3.3V or about 1.8V), and is electrically connected to p type semiconductor regions 11p of the two pMISs Qp through contact holes CNT. Also, a wiring 13B is a power supply wiring in a low potential side (e.g., about 0V), and is electrically connected to an n type semiconductor region 11n of one nMIS Qn through a contact hole CNT. Each wiring 13C is an input wiring of a 2-input NAND gate circuit, and contacts to and is electrically connected to a broader portion of each gate electrode 12A through each contact hole CNT. A wiring 13D is electrically connected to both of the n type semiconductor region 11n and the p type semiconductor region 11p through the contact holes CNT. A wiring 14A is electrically connected to the wiring 13D through a via hole TH.

Figure 42:
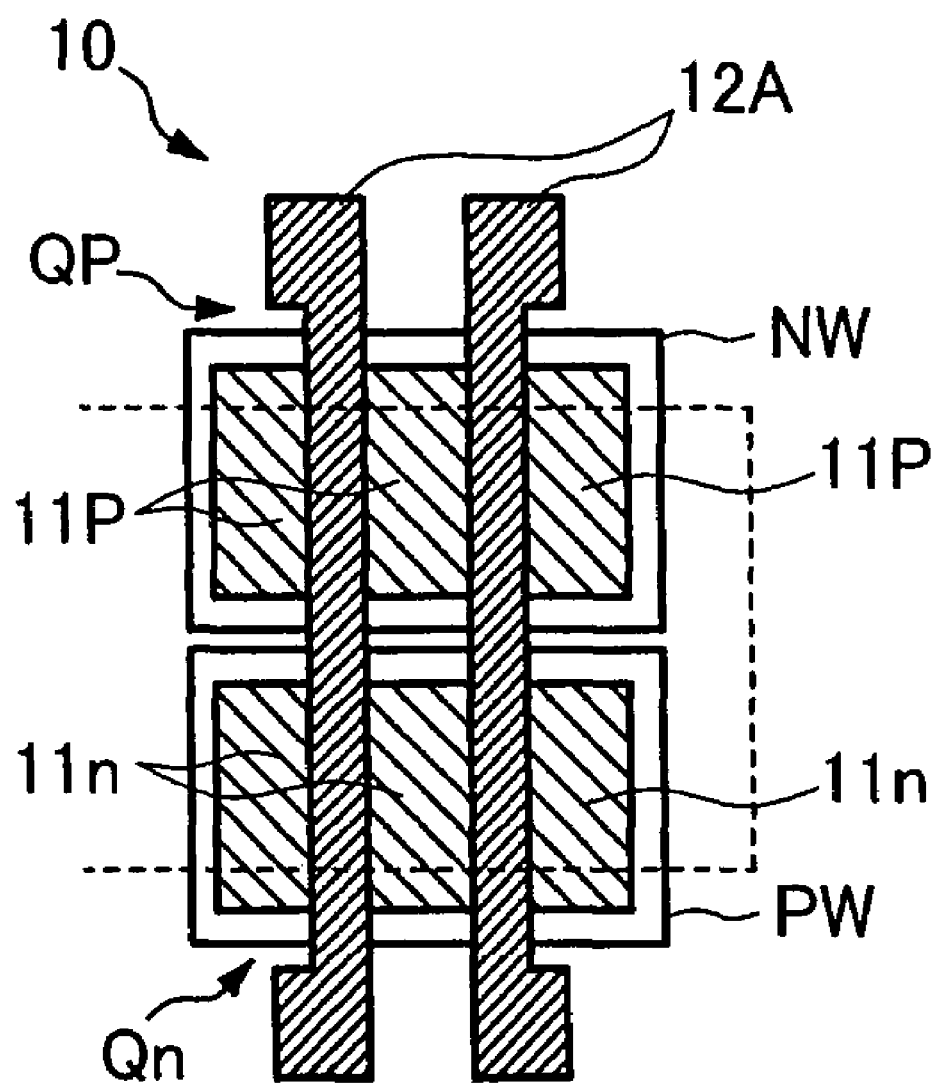
FIG. 42 is a plan view showing the principal part of a unit cell in FIG. 41.

A plan view of the unit cell 10 in a state before each formation of the wirings 13A to 13D and 14A is shown in FIG. 42. This unit cell 10 is a common basic constituent for constituting the logic device such as a NAND gate circuit and a NOR gate circuit and the like, and is constituted so as to form the above-mentioned logic circuit efficiently by appropriately selecting the wirings formed in the unit cell 10. Note that the present invention is extensively applied to constitution for connecting a plurality of CMIS (Complementary MIS) circuits.

Figure 43A:
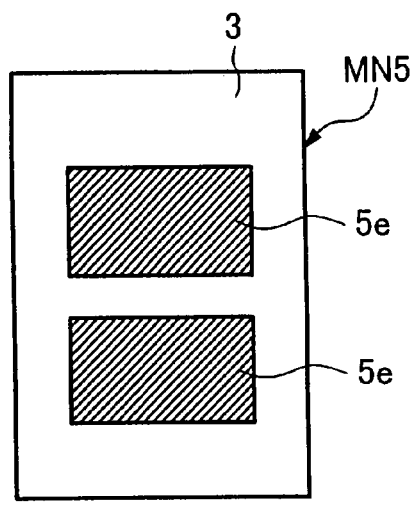
FIG. 43A is a plan view showing the principal part of one of various photomasks used in the fabrication of the semiconductor integrated circuit device in FIG. 41.
Figure 43B:
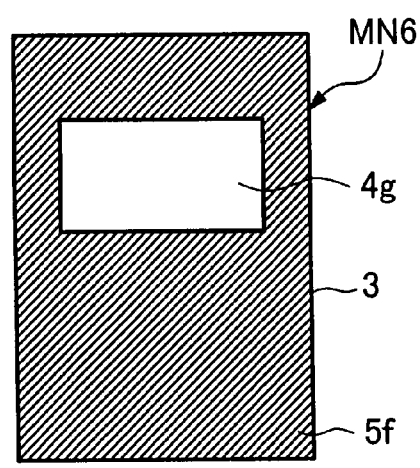
FIG. 43B is a plan view showing the principal part of another one of the various photomasks used in the fabrication of the semiconductor integrated circuit device in FIG. 41.
Figure 43C:
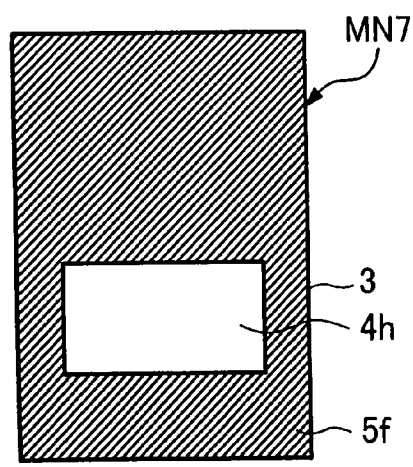
FIG. 43C is a plan view showing the principal part of another one of the various photomasks used in the fabrication of the semiconductor integrated circuit device in FIG. 41.
Figure 43D:
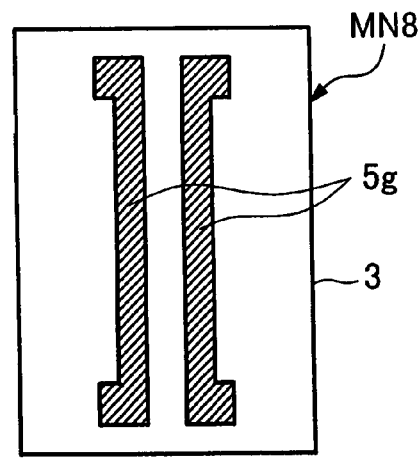
FIG. 43D is a plan view showing the principal part of another one of the various photomasks used in the fabrication of the semiconductor integrated circuit device in FIG. 41.

Thereupon, the conventional mask is used until the fabrication of the unit cell 10 serving as the basic constituent is completed. An integrated circuit pattern region of the conventional mask used then is shown in FIGS. 43A to 43D. A mask MN5 in FIG. 43A is a mask used when a device isolation portion and an active region in the unit cell 10 described above are formed on a wafer (semiconductor substrate). On a main surface of the mask substrate 3, for example, two opaque patterns 5e formed in a rectangular shape in two dimensions are arranged in parallel to each other at a predetermined interval therebetween. Each opaque pattern 5e is made of the same metal as the above-mentioned opaque pattern 5a, and is formed so as to shield the active region on the wafer. A mask MN6 in FIG. 43B is a mask used when an n well region NW in the unit cell 10 is formed. On a main surface of the mask substrate 3, an opaque film 5f is deposited, and a part of the opaque film 5f is opened to form a clear pattern 4g having, for example, a rectangular shape in two dimensions. The opaque film 5f is made of the same metal as the above-mentioned opaque pattern 5a and is formed so as to shield a region other than the n well region on the wafer. A mask MN7 in FIG. 43C is a mask used when a p well region PW of the unit cell 10 is formed. On a main surface of the mask substrate 3, the opaque film 5f is deposited, and a part of the opaque film 5f is opened to form a clear pattern 4h having, for example, a rectangular shape in two dimensions. The opaque film 5f is formed so as to shield a region other than the p well region on the wafer. A mask MN8 in FIG. 43D is a mask used when the gate electrode 12A in the unit cell 10 is formed. On a main surface of the mask substrate 3, two strip-shaped opaque patterns 5g having, for example, broader portions at both ends thereof are formed in parallel to each other. Each opaque pattern 5g is made of the same metal as the above-mentioned opaque pattern 5a, and is formed so as to shield a gate electrode forming region on the wafer.

Next, steps of forming the nMIS Qn and the pMIS Qp will be described based on FIGS. 44 to 53 that are cross-sectional views taken along a dashed line in FIG. 42.

Figure 44:
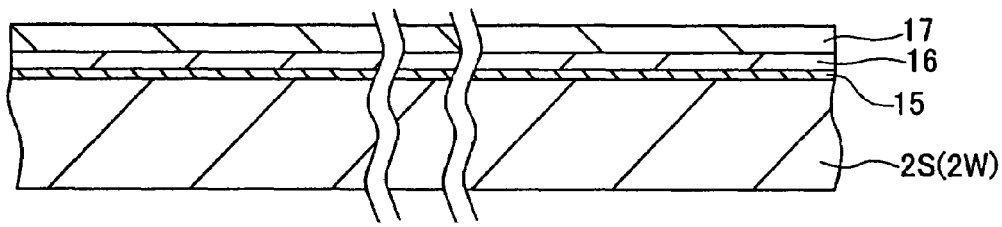
FIG. 44 is a cross-sectional view showing a principal part during the fabrication process of the semiconductor integrated circuit device shown in FIG. 41.
Figure 45:
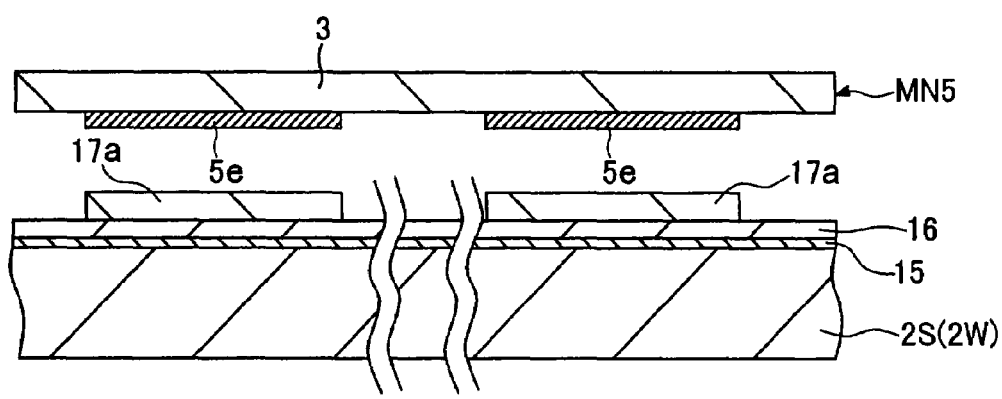
FIG. 45 is a cross-sectional view showing the principal part during the fabrication process of the semiconductor integrated circuit device shown in FIG. 41 subsequently to FIG. 44.
Figure 46:
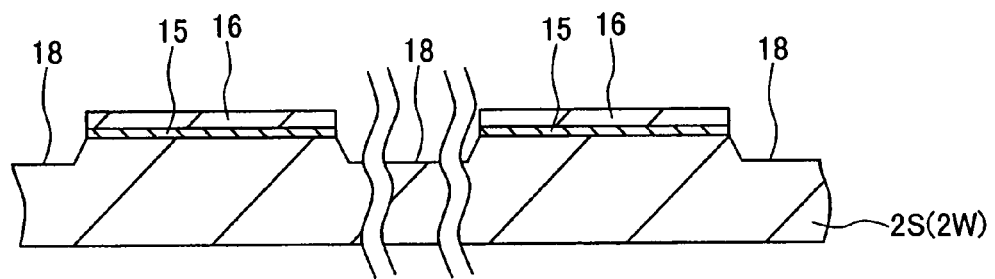
FIG. 46 is a cross-sectional view showing the principal part during the fabrication process of the semiconductor integrated circuit device shown in FIG. 41 subsequently to FIG. 45.

First, a dielectric film 15 made of, for example, a silicon oxide film is formed, by an oxidation method, on a main surface (device surface) of a semiconductor substrate 2S constituting a wafer 2W made of, for example, p single crystal silicon. Thereafter, a dielectric film 16 made of, for example, a silicon nitride film is deposited thereon by a CVD method, and further a resist film 17 is coated thereon (FIG. 44). Subsequently, after the above-mentioned conventional mask MN5 is used to perform the exposure process relative to the semiconductor substrate 2S, the development process or the like is performed and thereby resist patterns 17a are formed on the main surface of the semiconductor substrate 2S (FIG. 45). Each resist pattern 17a is flatly formed such that the device isolation region is exposed and the active region is covered. Thereafter, each resist pattern 17a is used as an etching mask to remove by turns the dielectric films 16 and 15 exposed therefrom, and further a main surface portion of the semiconductor substrate 2S is removed to form trenches 18 in the main surface portion of the semiconductor substrate 2S. Then, the resist patterns 17a are removed (FIG. 46).

Figure 47:
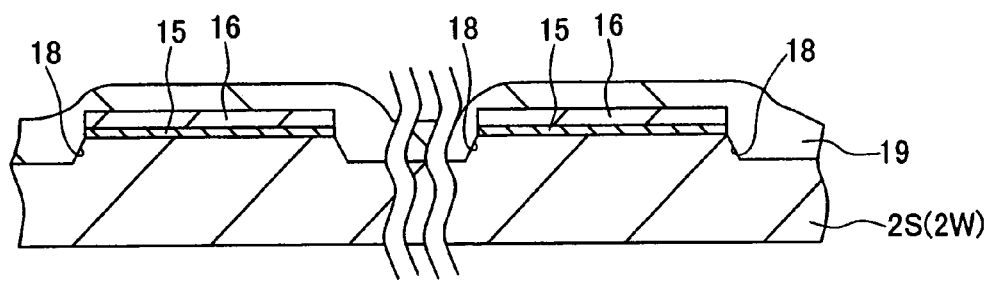
FIG. 47 is a cross-sectional view showing the principal part during the fabrication process of the semiconductor integrated circuit device shown in FIG. 41 subsequently to FIG. 46.
Figure 48:
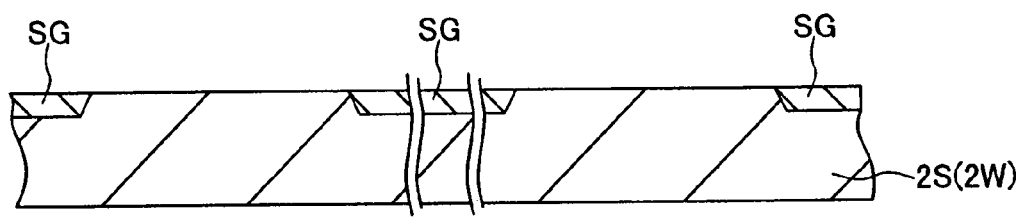
FIG. 48 is a cross-sectional view showing the principal part during the fabrication process of the semiconductor integrated circuit device shown in FIG. 41 subsequently to FIG. 47.

Subsequently, a dielectric film 19 made of, for example, silicon oxide is deposited by a CVD (Chemical Vapor Deposition) method or the like on the main surface of the semiconductor substrate 2S (FIG. 47). Thereafter, the semiconductor substrate 2S is planarized by, for example, a CMP (Chemical Mechanical Polish) method or the like. As a result, trench-like device isolation portions SG are formed (FIG. 48). In this embodiment, each device isolation portion SG has a trench-like isolation structure, but is not limited to this structure, and may be formed as a field dielectric film by, for example, a LOCOS (Local Oxidization of Silicon) method.

Figure 49:
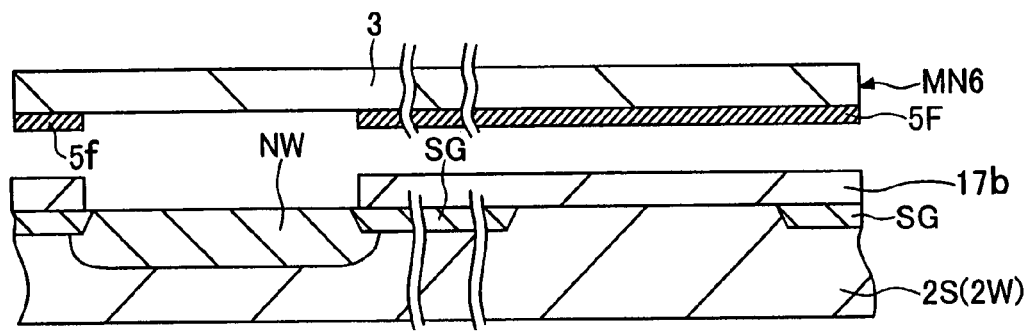
FIG. 49 is a cross-sectional view showing the principal part during the fabrication process of the semiconductor integrated circuit device shown in FIG. 41 subsequently to FIG. 48.

Subsequently, after a resist film on the main surface of the semiconductor substrate 2S is coated, the conventional mask MN6 described above is used to perform the exposure process relative to the semiconductor substrate 2S, and thereby a resist pattern 17b on the main surface of the semiconductor substrate 2S is formed. The resist pattern 17b is flatly formed so as to expose the n well region NW and to cover the other region. Thereafter, the resist pattern 17b is used as an ion-implantation mask to ion-implant, for example, phosphorus, arsenic or the like into the semiconductor substrate 2S, and thereby an n well region NW is formed (FIG. 49). Then, the resist pattern 17b is removed.

Figure 50:
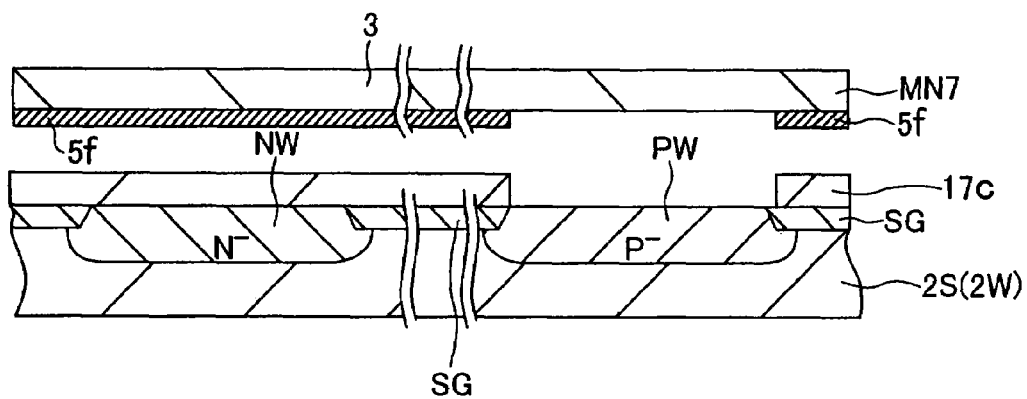
FIG. 50 is a cross-sectional view showing the principal part during the fabrication process of the semiconductor integrated circuit device shown in FIG. 41 subsequently to FIG. 49.

Similarly, after a resist film is coated on the main surface of the semiconductor substrate 2S, the above-mentioned conventional mask MN7 is used to perform the exposure process, and thereby a resist pattern 17c is formed so as to expose the p well region PW and to cover the other region on the main surface of the semiconductor substrate 2S. Thereafter, the resist pattern 17c is used as an ion-implantation mask to ion-implant, for example, boron or the like into the semiconductor substrate 2S, and thereby a p well region PW is formed (FIG. 50). Then, the resist pattern 17c is removed.

Figure 51:
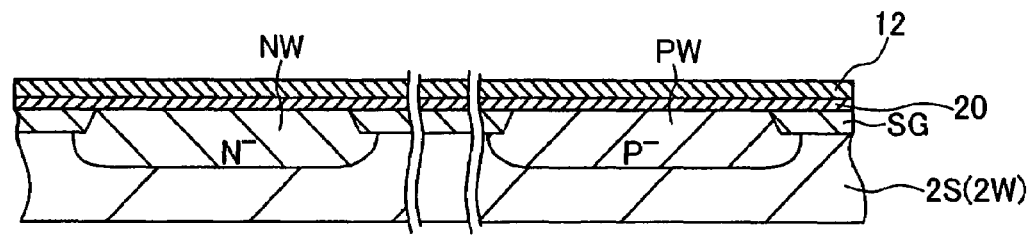
FIG. 51 is a cross-sectional view showing the principal part during the fabrication process of the semiconductor integrated circuit device shown in FIG. 41 subsequently to FIG. 50.
Figure 52:
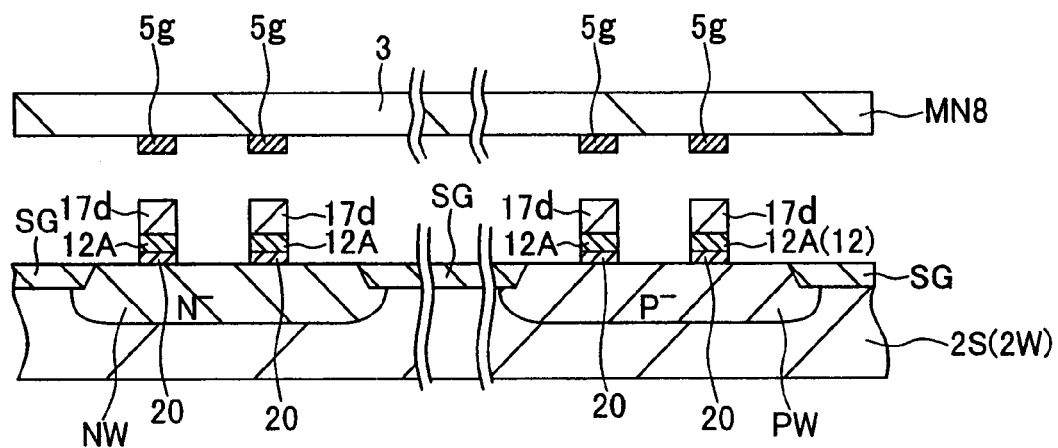
FIG. 52 is a cross-sectional view showing the principal part during the fabrication process of the semiconductor integrated circuit device shown in FIG. 41 subsequently to FIG. 51.
Figure 53:
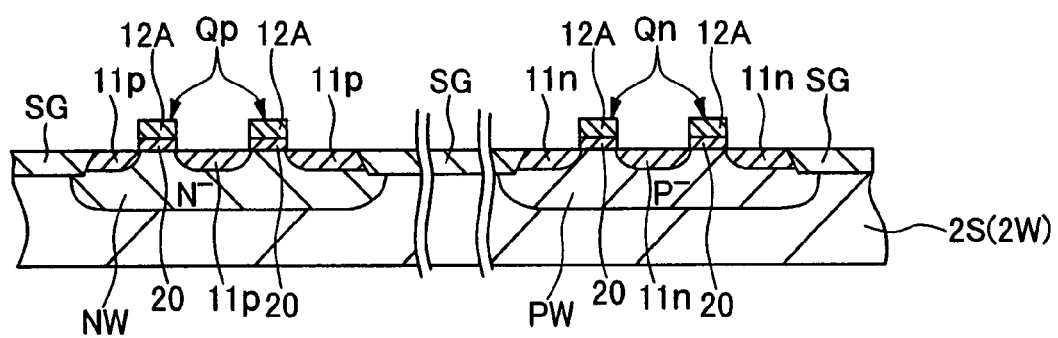
FIG. 53 is a cross-sectional view showing the principal part during the fabrication process of the semiconductor integrated circuit device shown in FIG. 41 subsequently to FIG. 52.

Subsequently, a gate dielectric film 20 made of, for example, a silicon oxide film is formed up to a thickness (converted to a film thickness of silicon dioxide) of about 3 nm on the main surface of the semiconductor substrate 2S by a thermal oxidation method or the like. Furthermore, a conductor film 12 made of polycrystalline silicon or the like is deposited thereon by a CVD method or the like (FIG. 51). Subsequently, after a resist film on the conductor film 12 is coated, the above-mentioned conventional mask MN8 is used to perform the exposure process, and thereby a resist pattern 17d is formed so as to cover the gate electrode forming region and to expose the other region on the conductor film 12. Thereafter, the resist pattern 17d is used as an etching mask to etch the conductor film 12, and thereby the gate electrode 12A is formed (FIG. 52). Thereafter, the n type semiconductor region 11n used in an nMIS Qn and having a high impurity concentration, and the p type semiconductor region 11p used in a pMIS Qp and having a high impurity concentration, both of which also function as a source region, a drain region, or a wiring layer, are formed self-alignedly relative to the gate electrode 12A by an ion-implantation or diffusion method (FIG. 53). Note that, for example, each of the resist patterns 17a to 17d described above is used as a positive resist.

Figure 54A:
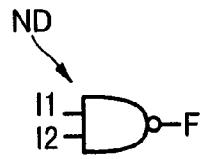
FIG. 54A is a symbolic diagram of a NAND gate circuit constituting the semiconductor integrated circuit device of FIG. 41.
Figure 54B:
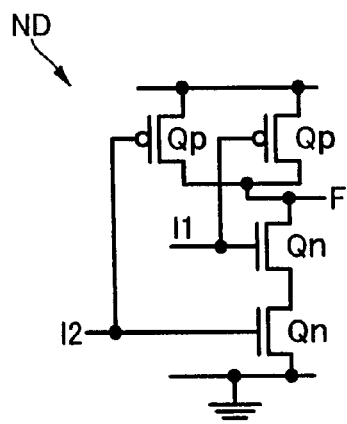
FIG. 54B is a circuit diagram of FIG. 54A.
Figure 54C:
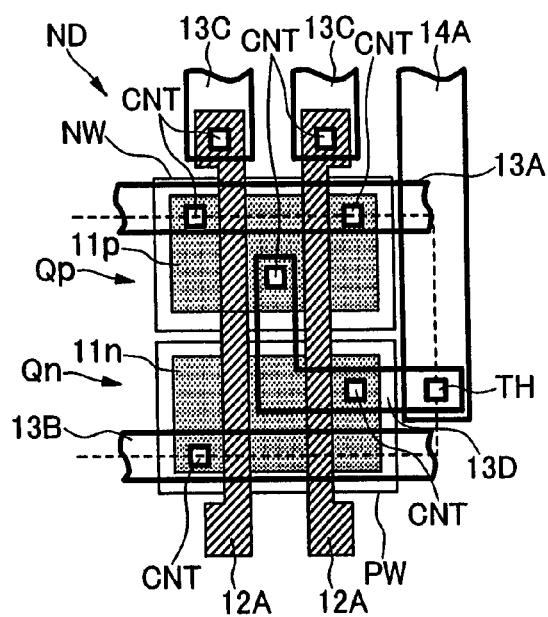
FIG. 54C is a plan view showing a pattern layout of FIG. 54A.

It is possible to form a NAND gate circuit or a NOR gate circuit by appropriately selecting a wiring in the following process. In this embodiment, the NAND gate circuit ND shown in FIGS. 54A and 54C is fabricated as an example. FIG. 54A is a symbolic diagram of the NAND gate circuit ND, FIG. 54B is a circuit diagram of the same, and FIG. 54C is a plan view showing the layout of the same. The NAND gate circuit ND having two inputs 11 and 12 and one output F is exemplified therein.

Figure 55A:
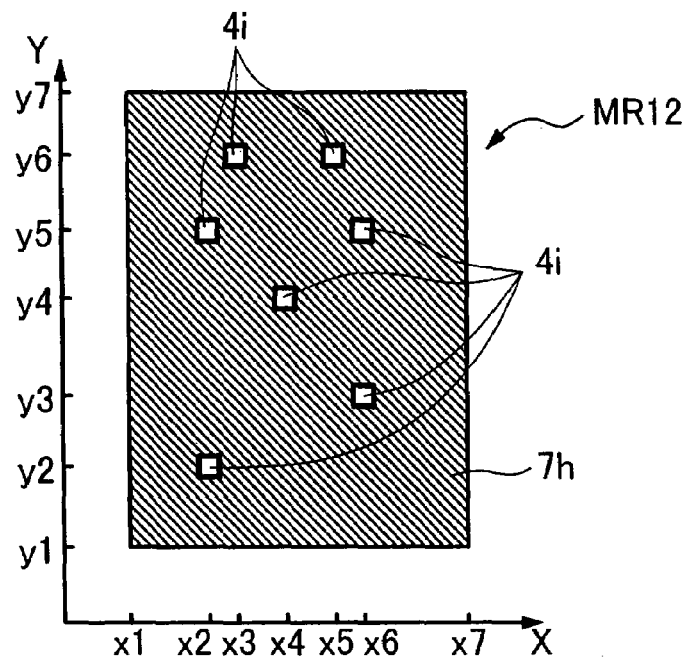
FIG. 55A is a plan view showing the principal part of the photomask used in printing a hole pattern in the NAND gate circuit of FIG. 54.
Figure 55B:
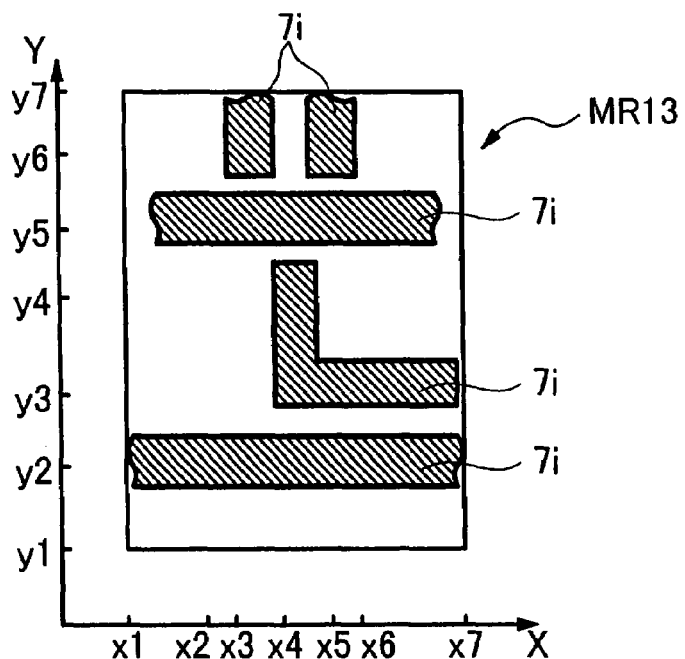
FIG. 55B is a plan view showing an example of the principal part of the photomask used in printing a line pattern in the NAND gate circuit of FIG. 54.

FIGS. 55A and 55B are plan views showing an example of the principal parts of patterns of the mask used for printing contact holes and wiring patterns of the NAND gate circuit ND. Note that an XY axis is provided in FIGS. 55A and 55B so as to easily understand the positional relation between the masks MR12 and MR13.

FIG. 55A exemplifies the pattern of the mask MR12 used for printing the contact holes CNT shown in FIG. 54C onto a wafer. An opaque film 7h is formed of the resist film having the same structure as the opaque pattern 7a. Parts of the opaque pattern 7h are removed to open a plurality of fine patterns 4i having a square shape in two dimensions. Each clear pattern 4i serves as a pattern for forming each contact hole CNT. FIG. 55B exemplifies the pattern of the mask MR13 used for printing the wirings 13A to 13D shown in FIG. 54C onto a wafer. Each opaque pattern film 7i is formed of the resist film having the same structure as the opaque pattern 7a described in the embodiment described above. The opaque patterns 7i serve as the patterns for forming the wirings 13A to 13D. Since the fabrication method of these masks MR12 and MR13 is the same as the foregoing, the descriptions thereof will be omitted.

Next, the fabrication process of a semiconductor integrated circuit device using the masks MR12 and MR13 will be described based on FIGS. 56 to 60. Note that FIGS. 56 to 60 are cross-sectional views taken along the dashed line in FIG. 54C.

Figure 56:
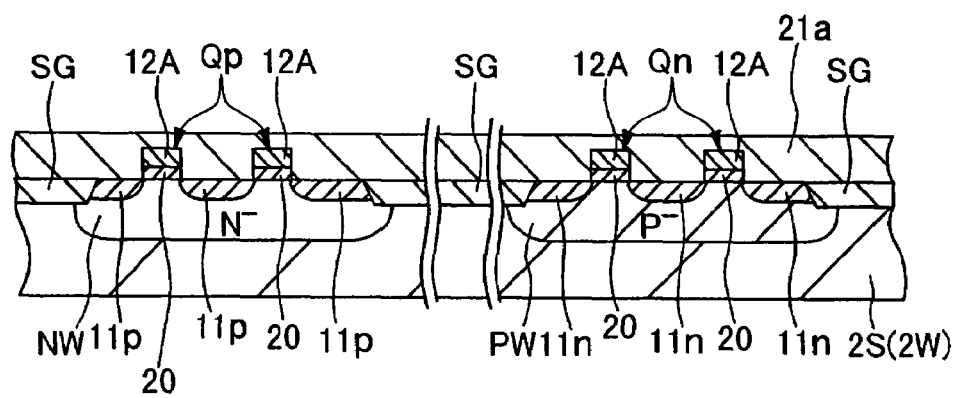
FIG. 56 is a cross-sectional view showing a principal part during the fabrication process of the semiconductor integrated circuit device, in which the NAND gate circuit of FIG. 54 is formed.
Figure 57:
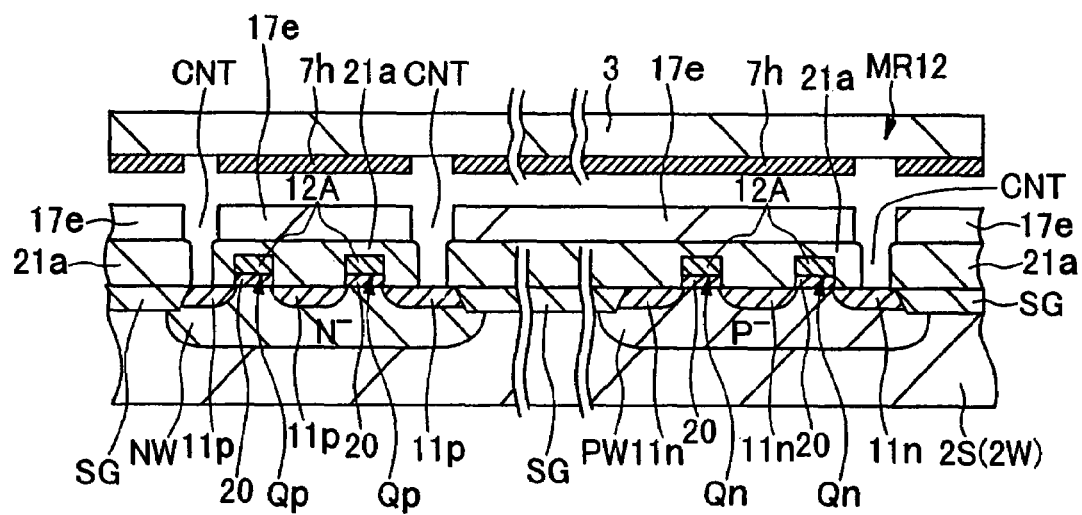
FIG. 57 is a cross-sectional view showing the principal part during the fabrication process of the semiconductor integrated circuit device subsequently to FIG. 56.

First, as described above, the nMISs Qn and the pMISs Qp are formed over the main surface of the semiconductor substrate 2S. Thereafter, an interlayer dielectric film 21a made of, for example, a phosphorus-doped silicon oxide film is deposited on the main surface by a CVD method (FIG. 56). Subsequently, after a resist film is coated on the interlayer dielectric film 21a, the exposure process using the mask MR12 is performed and thereby a resist pattern 17e is formed so as to expose each contact hole forming region having a round shape in two dimensions and to cover the other region. Thereafter, the resist pattern 17e is used as an etching mask to form the contact holes CNT through the interlayer dielectric film 21a (FIG. 57).

Figure 58:
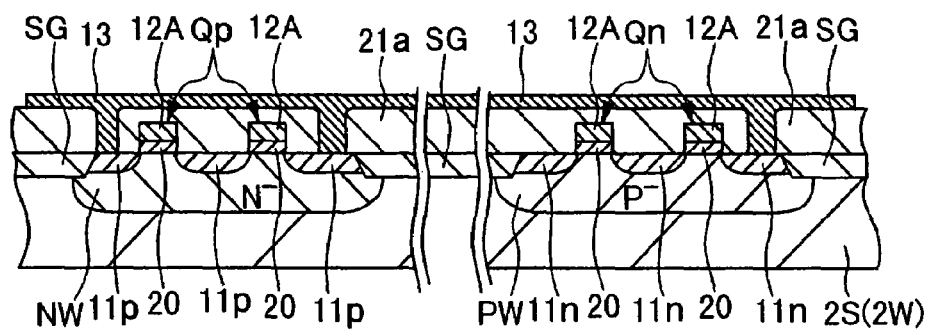
FIG. 58 is a cross-sectional view showing the principal part during the fabrication process of the semiconductor integrated circuit device subsequently to FIG. 57.
Figure 59:
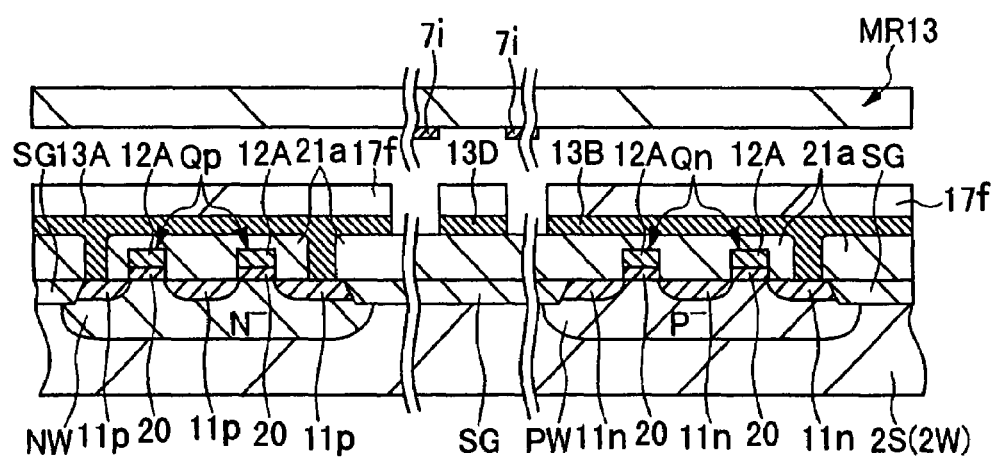
FIG. 59 is a cross-sectional view showing the principal part during the fabrication process of the semiconductor integrated circuit device subsequently to FIG. 58.
Figure 60:
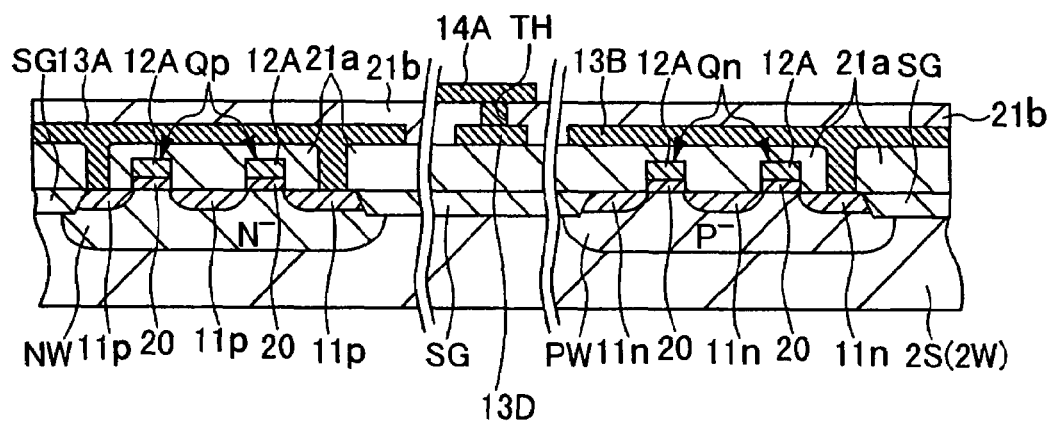
FIG. 60 is a cross-sectional view showing the principal part during the fabrication process of the semiconductor integrated circuit device subsequently to FIG. 59.

Subsequently, after the resist pattern 17e is removed, a conductor film 13 made of, for example, aluminum, aluminum alloy, or copper is deposited over the main surface of the semiconductor substrate 2S by a sputtering method (FIG. 58). Then, a resist film is coated on the conductor film 13, and the exposure process using the mask MR13 is performed thereto, and thereby a resist pattern 17f is formed so as to cover each wiring forming region and to expose the other region. Thereafter, the resist pattern 17f is used as an etching mask to etch the conductor film 13, and thus the wirings 13A to 13D are formed (FIG. 59). Note that, for example, each of the resist patterns 17e and 17f is used as a positive resist. Thereafter, an interlayer dielectric film 21b is formed over the main surface of the semiconductor substrate 2S by a CVD method, and further other masks are used to form the via hole TH and the wiring 14A in the upper layer thereof. Wire connection between parts is also made by pattern formation in which similar steps are repeated only the required number of times. Thus, the fabrication of the semiconductor integrated circuit device is completed.

Figure 61A:
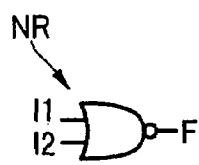
FIG. 61A is a symbolic diagram of a NOR gate circuit constituting the semiconductor integrated circuit device of FIG. 41.
Figure 61B:
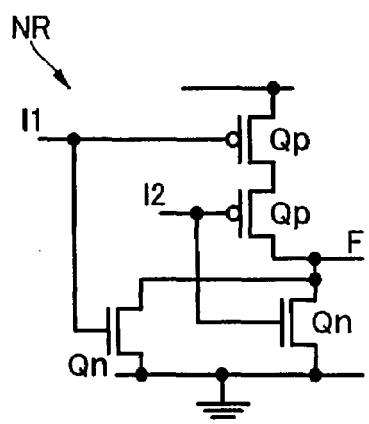
FIG. 61B is a circuit diagram of FIG. 61A.
Figure 61C:
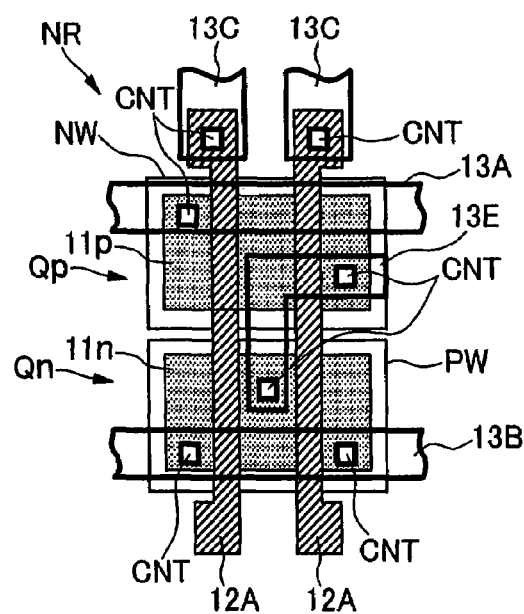
FIG. 61C is a plan view showing a pattern layout of FIG. 61A.

In the foregoing, a fabrication example of the 2-input NAND gate circuit has been described. However, it is also possible to fabricate a NOR gate circuit easily by changing the pattern arrangement of the masks MR12 and MR13 shown in FIGS. 55A and 55B. FIGS. 61A to 61C exemplify a 2-input NOR circuit NR formed by using the unit cell 10 described above. FIG. 61A is a symbolic diagram of the NOR circuit NR, FIG. 61B is a circuit diagram of the same, and FIG. 61C is a plan view showing the layout of the same.

As shown in FIG. 61C, the wiring 13A is electrically connected to the p type semiconductor region 11p under one of the pMISs Qp through one contact hole CNT. The wiring 13E is electrically connected to the p type semiconductor region 11p under one of the pMISs Qp through one contact hole CNT. Also, the wiring 13E is electrically connected to the n type semiconductor region 11n common to both nMISs Qn through one contact hole CNT. Furthermore, the wiring 13B is electrically connected to each n type semiconductor region 11n under each of both nMISs Qn through two contact holes CNT.

Figure 62A:
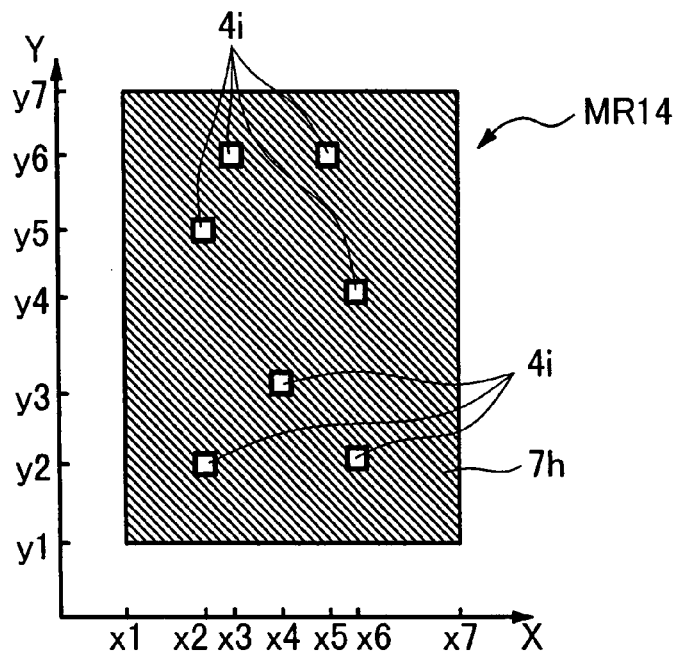
FIG. 62A is a plan view showing an example of the principal part of the photomask used in printing a hole pattern of the NOR gate circuit shown in FIG. 61.
Figure 62B:
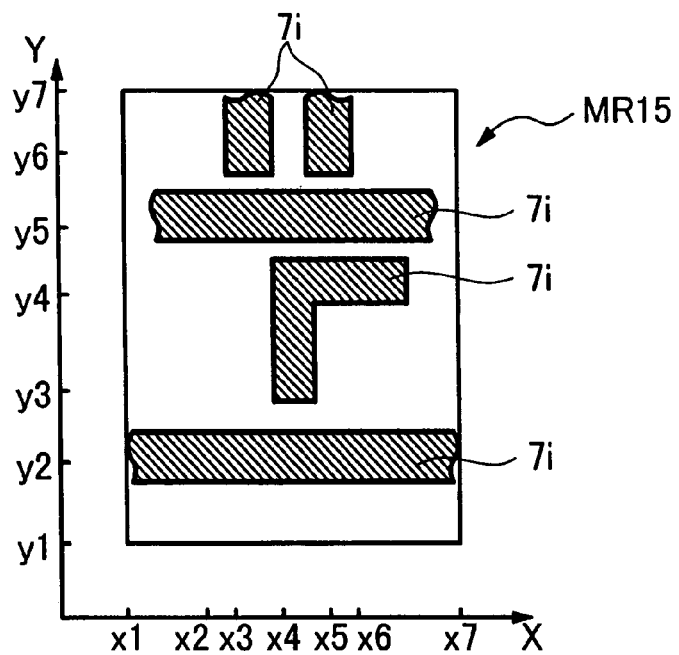
FIG. 62B is a plan view showing an example of the principal part of the photomask used in printing a line pattern of the NOR gate circuit in FIG. 61.

FIGS. 62A and 62B are plan views showing an example of each principal part of patterns of respective masks used for printing contact holes and wiring patterns of the NOR gate circuit ND. Note that an XY axis is provided in the FIGS. 62A and 62B so as to easily understand the positional relation between masks MR14 and MR15.

FIG. 62A exemplifies a pattern in the integrated circuit pattern region of the mask MR14 used for printing the contact holes CNT shown in FIG. 61C onto a wafer. An opaque film 7h is formed of the resist film having the same structure as the opaque pattern 7a described above. Each clear pattern 4i is a pattern for forming each contact hole CNT. FIG. 62B exemplifies a pattern of the mask MR15 used for printing the wirings 13A to 13C and 13E shown in FIG. 61C onto a wafer. Each opaque film 7i is formed of the same resist material as the opaque pattern 7a. The opaque patterns 7i serve as the patterns for forming the wirings 13A to 13C and 13E. Positive resist films are used on a wafer even if either the mask MR14 or MR15 is used.

The pattern alteration in the masks MR12 and MR14 shown in FIGS. 55 and 62 can be made in the same manner as described above, respectively. For example, the pattern for the NAND gate circuit of the mask MR12 shown in FIG. 55 can be altered into the pattern for the NOR gate circuit of the mask MR14 shown in FIG. 62 in such a manner as follows. That is, after removal of the opaque film 7h on the mask MR12 shown in FIG. 55, the above-mentioned resist film for forming an opaque film is newly coated on a mask substrate, and a pattern for the NOR gate circuit is written on the resist film by an electron beam or ultra-violet ray or the like, and thereby the opaque film 7h and the clear patterns 4i of the mask MR14 shown in FIG. 62 are formed. More specifically, the pattern on the mask can be altered from the pattern for the NAND gate circuit to that for the NOR gate circuit, on the contrary, from the pattern for the NOR gate circuit to that for the NAND gate circuit easily and in a short time. Therefore, it is possible to significantly reduce the amount of time required to develop and fabricate the semiconductor integrated circuit device by using the mask as above. Also, such modifications and alterations can be made by using the existing fabrication tools. In addition, the reduction in the material cost, process cost, and fuel cost can be achieved. Therefore, the significant reduction in the cost of the semiconductor integrated circuit device can be achieved. Thus, the cost reduction can be achieved even in the small-lot production of the semiconductor integrated circuit device. In this embodiment, the description has been made of the case where the pattern of the mask MR12 is altered into the pattern of the mask MR14. However, the present invention is not limited to this, and it is also possible to prepare the masks MR12 and MR14 separately without altering the pattern. Since it is possible to prepare many resist shading masks at a lower cost in comparison to the conventional mask, it is possible to flexibly cope with the small-lot production of the semiconductor integrated circuit device at a low cost and in a short time if the masks MR12 and MR14 are prepared separately.

In this embodiment as described above, the unit cell 10 shown in FIG. 42 is fabricated by the use of the conventional mask because a large number of unit cells are fabricated to be used as common patterns, and the hole patterns and the wiring patterns formed thereon are fabricated by the use of the resist shading masks because the shapes of the hole patterns and the wiring patterns are changed in accordance with desired logic circuits. By so doing, it becomes possible to fabricate the mask efficiently in a series of the fabrication process of the semiconductor integrated circuit device, and thus the improvement of the productivity of the semiconductor integrated circuit device can be achieved.

Second Embodiment

In this embodiment, descriptions will be made of the case where the technical idea of the present invention is applied to the fabrication of, for example, a mask ROM.

The mask ROM has characteristics as follows. That is, a large capacity memory can be achieved because a memory cell is formed of one MIS and the entire circuit structure thereof can be made simple because no writing operation is required. However, since the contents of memory differ in accordance with the demands of customers, TAT of the mask ROM becomes longer in comparison to that of another ROM (e.g., EEPROM (Electric Erasable Programmable Read Only Memory)) and different masks must be fabricated for respective various kinds of ROM codes of the customers. Therefore, there arises such a problem that the product cost is increased in the small-lot production. Thereupon, in this embodiment, patterns of base data constituted by basic components common to various kinds of mask ROMs are printed by the use of the above-mentioned conventional mask, and patterns in the memory cell region are printed by the use of the resist shading mask so as to enable the data rewriting. By so doing, various types of mask ROMs having different writing data are fabricated.

Figure 63A:
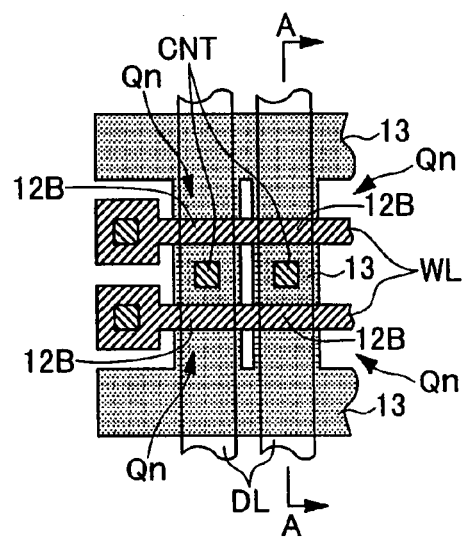
FIG. 63A is a plan view showing the principal part of a memory region of a mask ROM serving as a semiconductor integrated circuit device according to another embodiment of the present invention.
Figure 63B:
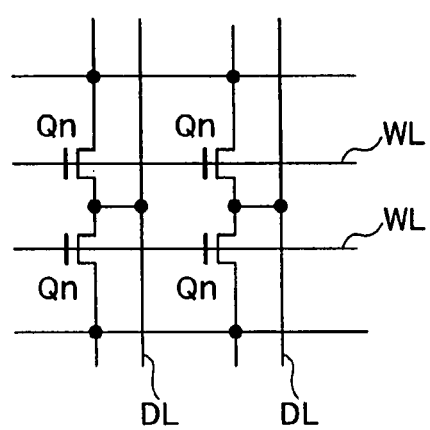
FIG. 63B is a circuit diagram of the memory region in FIG. 63A.
Figure 63C:
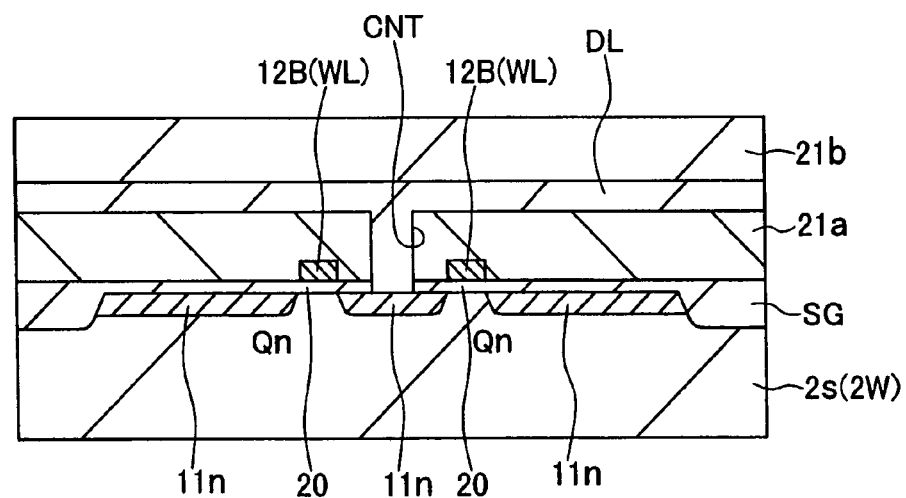
FIG. 63C is a cross-sectional view taken along line A-A in FIG. 63A.

FIGS. 63A to 63C show the base data of a mask ROM. FIG. 63A is a plan view showing layout of the memory cell region, FIG. 63B is a circuit diagram of the same, and FIG. 63C is a cross-sectional view taken along line A-A in FIG. 63A. A mask ROM of the ion-implantation programming type is exemplified herein. Each data line DL is electrically connected to an n type semiconductor region 11n through a contact hole CNT. Each gate electrode 12B is formed of a part of a word line WL. One memory cell is formed of one nMIS Qn positioned near each of the intersections between the data lines DL and the word lines WL. In this mask ROM of the ion-implantation programming type, the nMISs Qn are classified into two types by whether or not impurities are introduced in a channel region of each nMIS Qn constituting a memory cell, that is, classified into a type of an nMIS Qn having a high threshold voltage (the threshold voltage is high enough that the nMIS Qn is not turned on even if the word line WL is in high-level) and a type of an nMIS Qn having a low threshold voltage (the threshold voltage is low enough that the nMIS Qn is turned on if the word line WL is in high-level). Then, two types of the nMISs Qn correspond to "0" and "1" of the data, respectively. The conventional mask described above is used for printing the patterns of the base data.

Figure 64A:
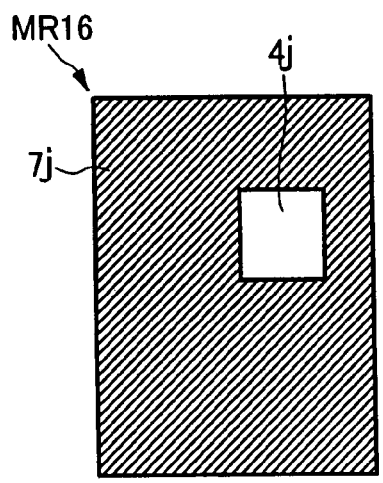
FIG. 64A is a plan view showing an example of the principal part of a photomask used in data rewriting of the mask ROM of FIG. 63.

Three kinds of mask. ROMs shown below are fabricated with using the base data in common until a desired amount can be obtained. Descriptions thereof will be made based on FIGS. 64 to 66. FIGS. 64A, 65A and 66A are plan views showing the principal part of the integrated circuit pattern region of the used mask, and FIGS. 64B, 65B and 66B are plan views showing the layout of the memory cell region of the mask ROM, which illustrates the patterns for data writing, and FIGS. 64C, 65C and 66C are cross-sectional views of a portion corresponding to the portion taken along line A-A in FIG. 63A in the step of data writing.

Figure 64B:
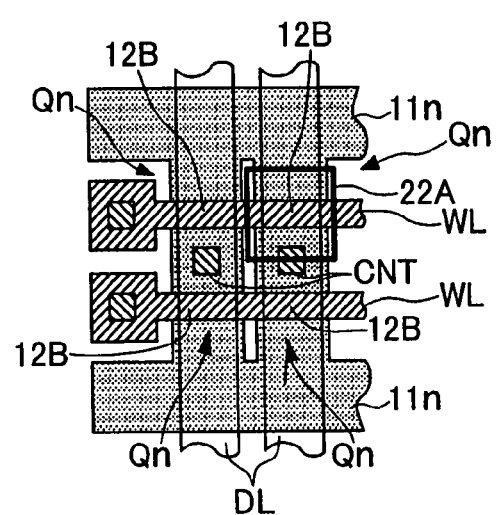
FIG. 64B is a plan view showing the principal part of a semiconductor wafer illustrating the pattern for data rewriting printed from the photomask of FIG. 64A.
Figure 64C:
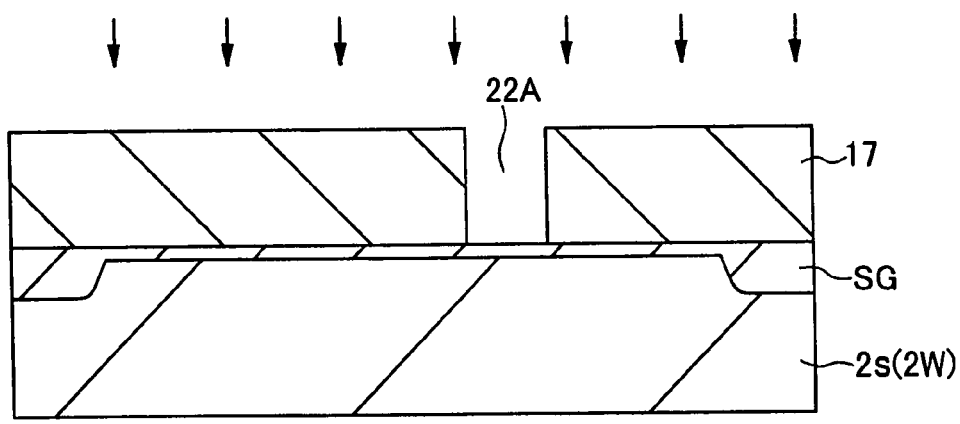
FIG. 64C is a cross-sectional view showing the principal part of a semiconductor wafer during a data rewriting step.
Figure 65A:
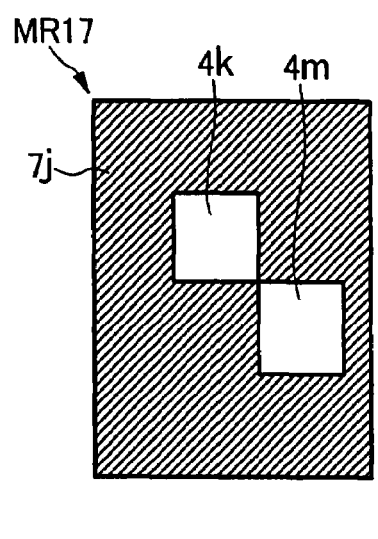
FIG. 65A is a plan view showing another example of the principal part of a photomask used in data rewriting of the mask ROM of FIG. 63.

First, in FIGS. 64A to 64C, such a case is exemplified that an opening pattern 22A shown in FIG. 64B is formed on the base data by the use of a mask MR16 shown in FIG. 64A, and impurities are ion-implanted into the semiconductor substrate 2S exposed from the opening pattern 22A as shown in FIG. 64C, and thereby the data is written. The mask MR16 is the resist shading mask described above, and the opaque film 7j thereof is made of the resist film having the same structure as the above-mentioned opaque pattern 7a. Apart of the opaque film 7j is removed to form one clear pattern 4j having a square shape in two dimensions. The clear pattern 4j serves as a pattern for forming the opening pattern 22A of the resist pattern 17g over the wafer 2W. In this case, the resist pattern 17g is used as an impurity-implantation mask to introduce impurities for data writing into the channel region of the one nMIS Qn. Note that the step of impurity implantation for data writing is performed before the step of forming gate electrodes 12B (i.e., word lines WL). When the threshold value of the nMIS Qn is required to be high, boron, for example, may be suitable as the impurity to be introduced, and when the threshold value of the nMIS Qn is required to be low, phosphorus or arsenic, for example, may be suitable as the impurity to be introduced.

Figure 65B:
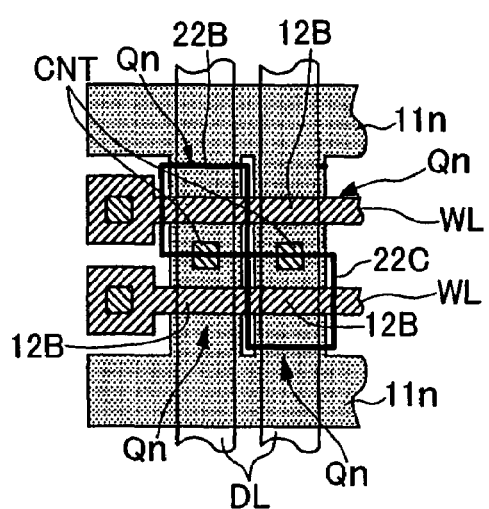
FIG. 65B is a plan view showing the principal part of a semiconductor wafer illustrating the pattern for data rewriting printed from the photomask of FIG. 65A.
Figure 65C:
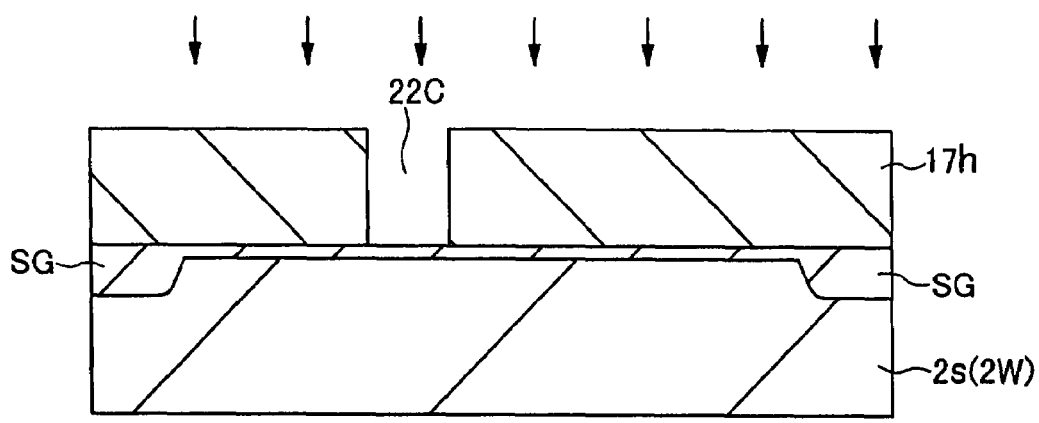
FIG. 65C is a cross-sectional view showing the principal part of a semiconductor wafer during the data rewriting step.
Figure 66A:
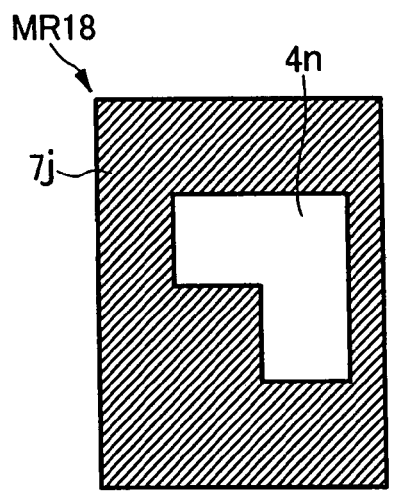
FIG. 66A is a plan view showing still another example of the principal part of a photomask used in data rewriting of the mask ROM of FIG. 63.

Next, in FIGS. 65A to 65C, such a case is exemplified that opening patterns 22B and 22C shown in FIG. 65B are formed on the base data by the use of a mask MR17 shown in FIG. 65A, and impurities are ion-implanted into the semiconductor substrate 2S exposed from the opening patterns 22B and 22C as shown in FIG. 65C, and thereby the data is written. This mask MR17 is the resist shading mask described above. Parts of the opaque film 7j are removed to form two clear patterns 4k and 4m each having a square shape in two dimensions. The clear patterns 4k and 4m serve as patterns for forming the two opening patterns 22B and 22C of the resist pattern 17h on the wafer 2W. In this case, the resist pattern 17h is used as an impurity-implantation mask to introduce impurities for data writing into the two channel regions of the nMISs Qn.

Figure 66B:
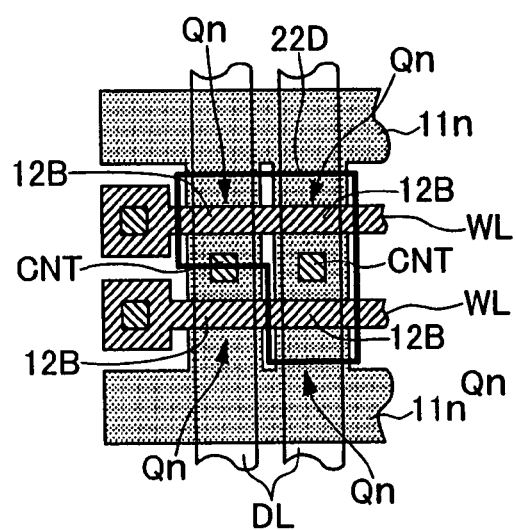
FIG. 66B is a plan view showing the principal part of a semiconductor wafer illustrating the pattern for data rewriting printed from the photomask of FIG. 66A.
Figure 66C:
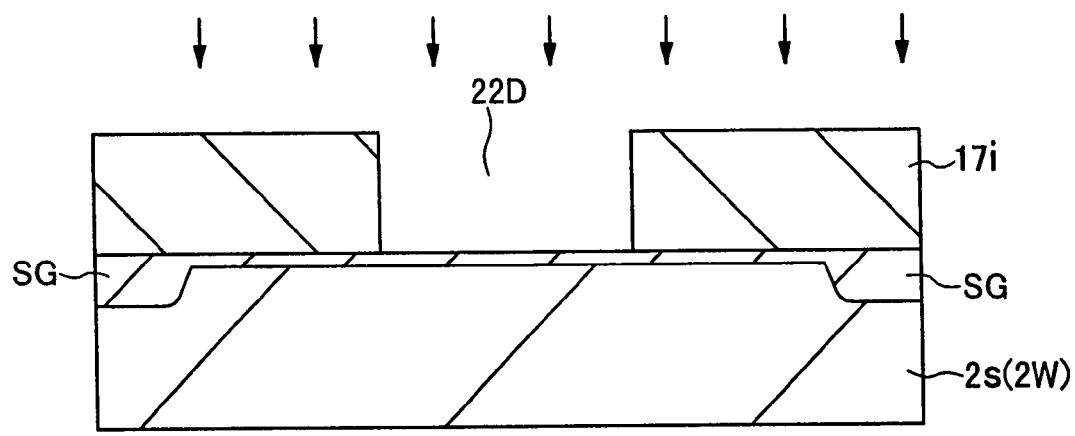
FIG. 66C is a cross-sectional view showing the principal part of a semiconductor wafer during the data rewriting step.

Next, in FIGS. 66A to 66C, such a case is exemplified that an opening pattern 22D shown in FIG. 66B is formed on the base data by the use of a mask MR18 shown in FIG. 66A, and impurities are ion-implanted into the semiconductor substrate 2S exposed from the opening pattern 22D as shown in FIG. 66C, and thereby the data is written. The mask MR18 is the resist shading mask, and a part of the opaque film 7j is removed to form a clear pattern 4n. The clear pattern 4n serves as a pattern for forming the opening pattern 22D of the resist pattern 17i on the wafer 2W. In this case, impurities for data writing are introduced into three channel regions of the nMISs Qn with using the resist pattern 17i as an impurity-implantation mask. Note that each of the resist patterns 17g to 17i is used as a positive resist.

The pattern alteration in the masks MR16 to MR18 shown in FIGS. 64 to 66 may be made in the same manner as described above. For example, the pattern of the mask MR16 shown in FIGS. 64A to 64B can be altered into the pattern of the mask MR17 shown in FIGS. 65A to 65C in such a manner as follows. That is, after removal of the opaque film 7j on the mask MR16, a resist film for forming an opaque film is newly coated over the mask substrate, and an electron beam or ultra-violet ray or the like is irradiated onto a predetermined portion of the resist film, and thereby the opaque film 7j and the clear patterns 4k and 4m of the mask MR17 are formed. By so doing, it becomes possible to fabricate masks for various kinds of mask ROMs efficiently. Of course, it is also possible to prepare the masks MR16 to MR18 separately. Also in this case, it is possible to flexibly cope with the fabrication of the semiconductor integrated circuit device having the mask ROM at a low cost and in a short time.

In the data rewriting of this kind, the resist shading masks shown in FIGS. 9 to 11 and FIGS. 20 to 22 may be used. Alternatively, the resist shading masks shown in FIGS. 28 to 32 may be used, too. More specifically, among the rewriting layers, bit pattern portions of the mask ROM to be altered may be printed by the use of a region having an opaque member made of a resist film, and other non-altered patterns may be printed by the use of a region having an opaque member made of metal. By so doing, since the region of the opaque member made of a resist film can be narrowed in a mask, reduction in the amount of time required for the mask pattern writing can be achieved, and therefore reduction in the mask fabrication time can be achieved.

The steps from the rewriting step to the packaging step as described above are the same as those of the conventional fabrication process of a semiconductor integrated circuit device.

According to the embodiment as described above, the mask used in the patterning for fabricating the base data is the conventional mask, and the mask used for forming the rewriting layer is the resist shading mask. By so doing, it becomes possible to fabricate various kinds of mask ROMs efficiently. Also, the significant reduction in the TAT of various kinds of mask ROMs can be achieved. In addition, the data rewriting can be performed by using the existing manufacturing tool. Furthermore, the reduction in the material cost, process cost, and fuel cost can be achieved. Therefore, it is possible to significantly reduce the cost of the mask ROM even in small-lot production.

Third Embodiment

This embodiment is a modification example of the second embodiment, and will describe the case where the present invention is applied to the fabrication method of the mask ROM of data rewriting type, which is different from that of the second embodiment.

Figure 67A:
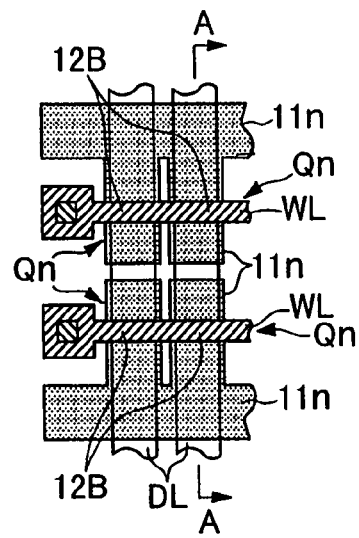
FIG. 67A is a plan view showing the principal part of a memory region of a mask ROM fabricated in another method, which serves as a semiconductor integrated circuit device of another embodiment of the present invention.
Figure 67B:
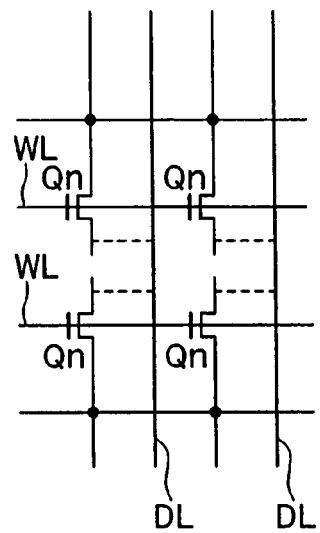
FIG. 67B is a circuit diagram of the memory region of FIG. 67A.
Figure 67C:
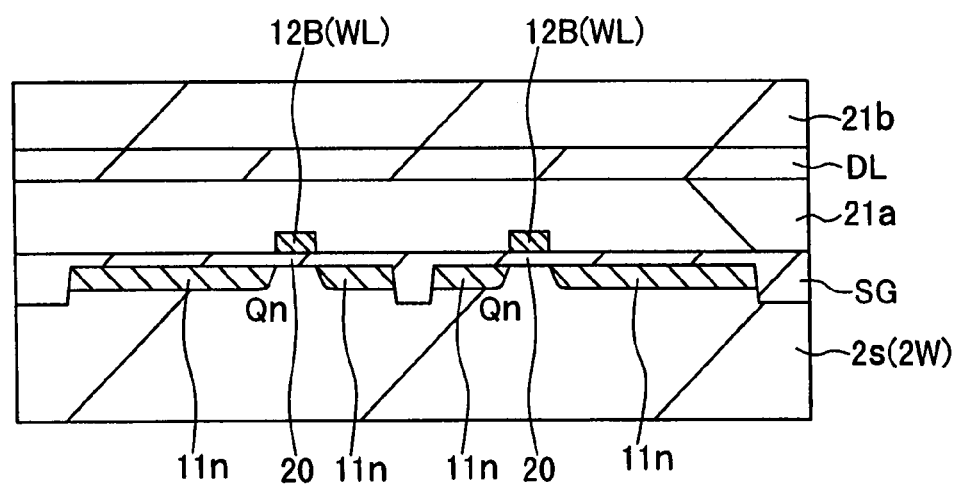
FIG. 67C is a cross-sectional view taken along line A-A in FIG. 67A.

FIGS. 67A to 67C show base data of a mask ROM used in this embodiment. FIG. 67A is a plan view showing the layout of the memory cell region, FIG. 67B is a circuit diagram of the same, and FIG. 67C is a cross-sectional view taken along line A-A in FIG. 67A. In this embodiment, a mask ROM of the contact hole programming type is exemplified. In this mask ROM of the contact hole programming type, programming is performed according to how to lay out contact holes (represented by the dashed line in FIG. 67B) which connect the respective semiconductor regions 11n and the data line DL. Also in this embodiment, the conventional mask is used to print the pattern of the base data.

The contact holes for rewriting described below are formed before forming the data lines DL, and three kinds of mask ROMs are fabricated with using the base data in common until a desired amount can be obtained. Descriptions thereof will be made based on FIGS. 68 to 70. Note that FIGS. 68A, 69A and 70A are plan views showing the principal part of the integrated circuit pattern region of the used mask, and FIGS. 68B, 69B and 70B are plan views showing the layout of the memory cell region of the mask ROM, which illustrates the pattern for data writing, and FIGS. 68C, 69C and 70C are cross-sectional views of the same, and FIGS. 68D, 69D and 70D are cross-sectional views taken along line A-A in FIGS. 68B, 69B and 70B, respectively.

Figure 68A:
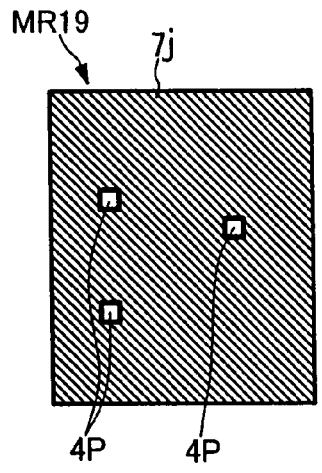
FIG. 68A is a plan view showing an example of the principal part of a photomask used in data rewriting of the mask ROM of FIG. 67.
Figure 68B:
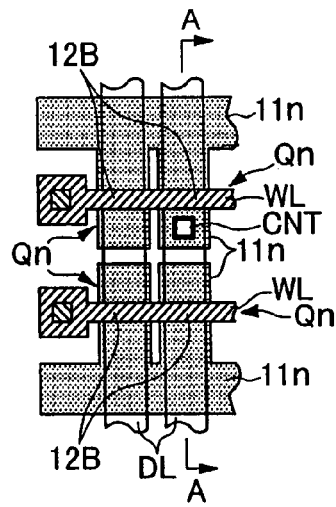
FIG. 68B is a plan view showing the principal part of the memory region after the data rewriting by the use of the photomask of FIG. 68A.
Figure 68C:
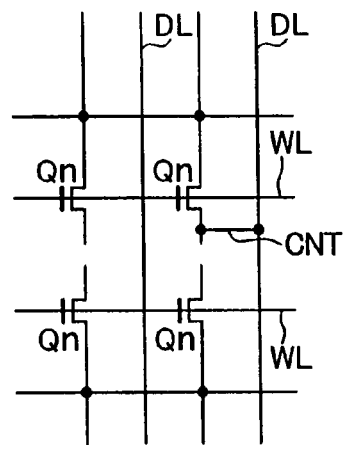
FIG. 68C is a circuit diagram of the memory region of FIG. 68C.
Figure 68D:
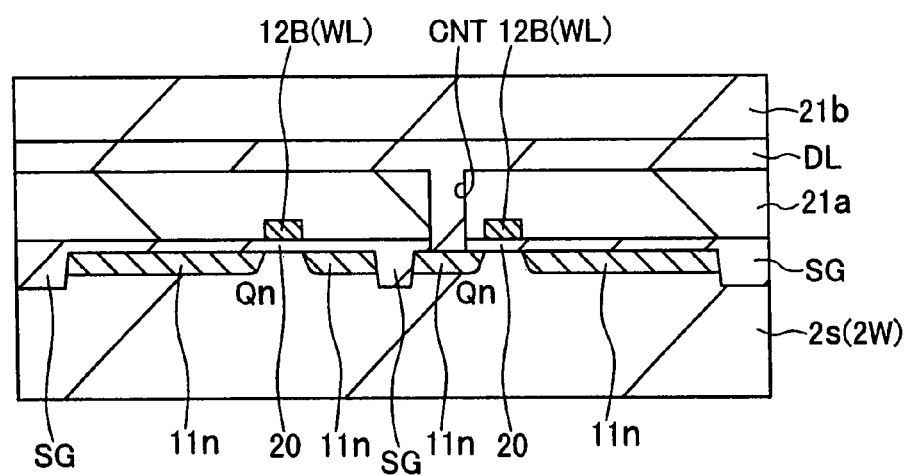
FIG. 68D is a cross-sectional view taken along line A-A in FIG. 68B.

First, in FIGS. 68A to 68D, such a case is exemplified that a contact hole CNT for exposing n type semiconductor regions 11n shown in FIG. 68B is formed on the base data by the use of a mask MR19 shown in FIG. 68A, and the n type semiconductor regions 11n of the predetermined MISs Qn and the data lines DL are connected to one another as shown in FIGS. 68C and 68D, and thereby the data is written. Parts of the opaque film 7j made of a resist film on the mask MR19 are removed to open a plurality of clear patterns 4p having a square shape in two dimensions. The clear patterns 4p serve as the patterns used to form the opening pattern for forming a contact hole CNT in the resist film on the wafer 2W. The method of forming the contact hole CNT is the same as the method described in the first embodiment. Therefore, descriptions thereof will be omitted.

Next, in FIGS. 69A to 69D, such a case is exemplified that each contact hole CNT shown in FIG. 69B is formed on the base data by the use of a mask MR20 shown in FIG. 69A, and the n type semiconductor region 11n of the predetermined nMISs Qn and the data lines DL are connected to one another at two points as shown in FIGS. 69C and 69D, and thereby the data is written. In the mask MR20, the clear patterns 4p for printing the contact holes used to write the data are arranged at two points that are different from those shown in FIGS. 68A to 68D.

Figure 70A:
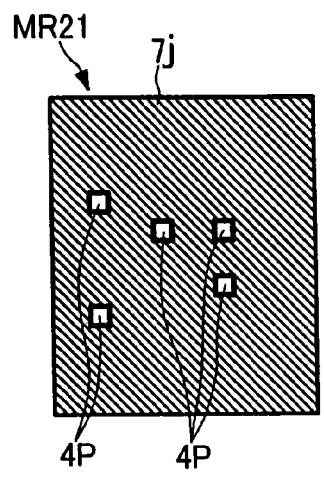
FIG. 70A is a plan view showing an example of the principal part of a photomask used in data rewriting of the mask ROM of FIG. 67.
Figure 70B:
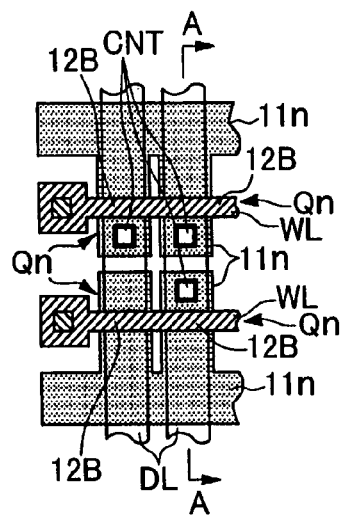
FIG. 70B is a plan view showing the principal part of the memory region after the data rewriting by the use of the photomask of FIG. 70A.
Figure 70C:
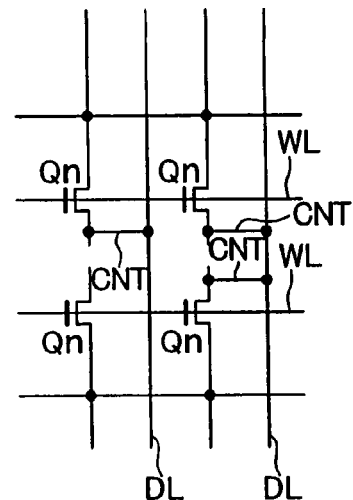
FIG. 70C is a circuit diagram of the memory region of FIG. 70C.
Figure 70D:
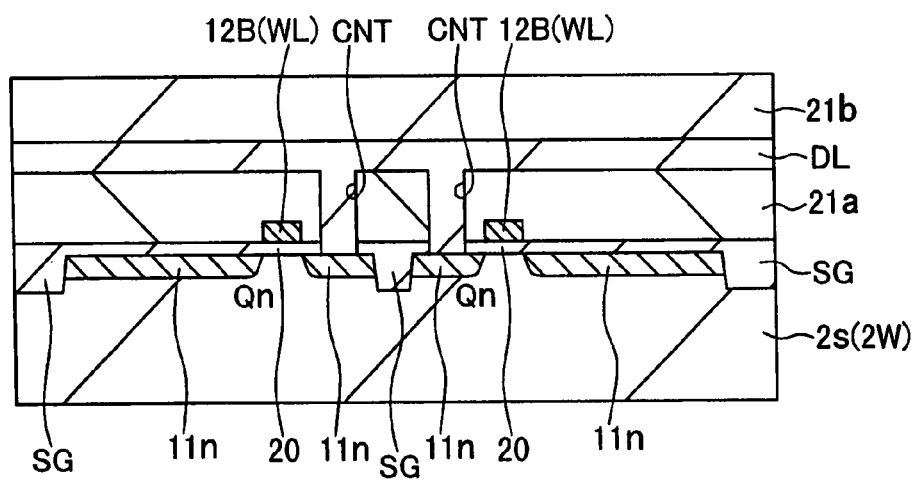
FIG. 70D is a cross-sectional view taken along line A-A in FIG. 70B.

Next, in FIGS. 70A to 70D, such a case is exemplified that each contact hole CNT shown in FIG. 70B is formed on the base data by the use of a mask MR21 shown in FIG. 70A, and n type semiconductor regions 11n of the predetermined nMISs Qn and the data lines DL are connected to one another at three points as shown in FIGS. 70C and 70D, and thereby the data is written. In the mask MR21, the clear patterns 4p for printing the contact holes used to write the data are arranged at three points, that is, at the number of points increased one point more than two points shown in FIGS. 69C and 69D.

The pattern alteration in the masks MR19 to MR21 shown in FIGS. 68 to 70 may be made in the same manner as that described in the second embodiment. Of course, it is also possible to prepare the masks MR19 to MR21 separately. This case too can be flexibly applied to the fabrication of the semiconductor integrated circuit device having the mask ROM, at a low cost and in a short time. The same effects as those of the second embodiment can be obtained also in this third embodiment.

Fourth Embodiment

This embodiment is a modification example of the second and third embodiments, and will describe the case where the present invention is applied to the fabrication method of the mask ROM of data rewriting type, which is different from those of the second and third embodiments.

Figure 71A:
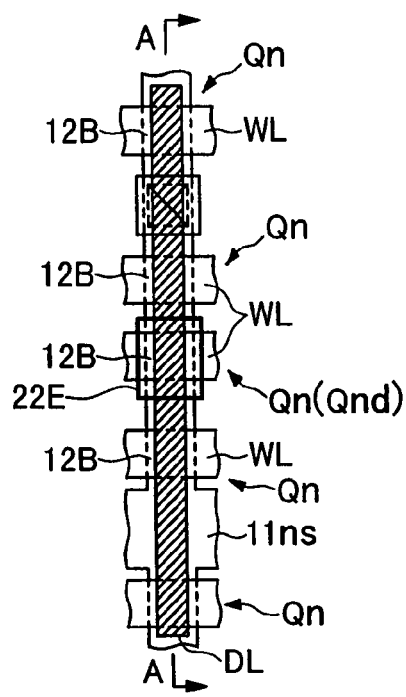
FIG. 71A is a plan view showing the principal part of a memory region of a mask ROM fabricated by another method, which serves as a semiconductor integrated circuit device of still another embodiment of the present invention.
Figure 71B:
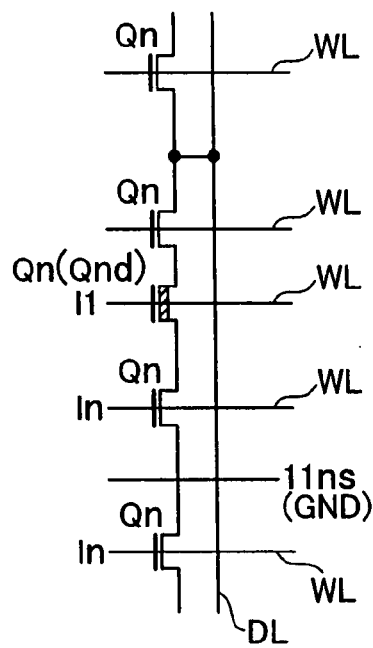
FIG. 71B is a circuit diagram of the memory region of FIG. 71A.
Figure 71C:
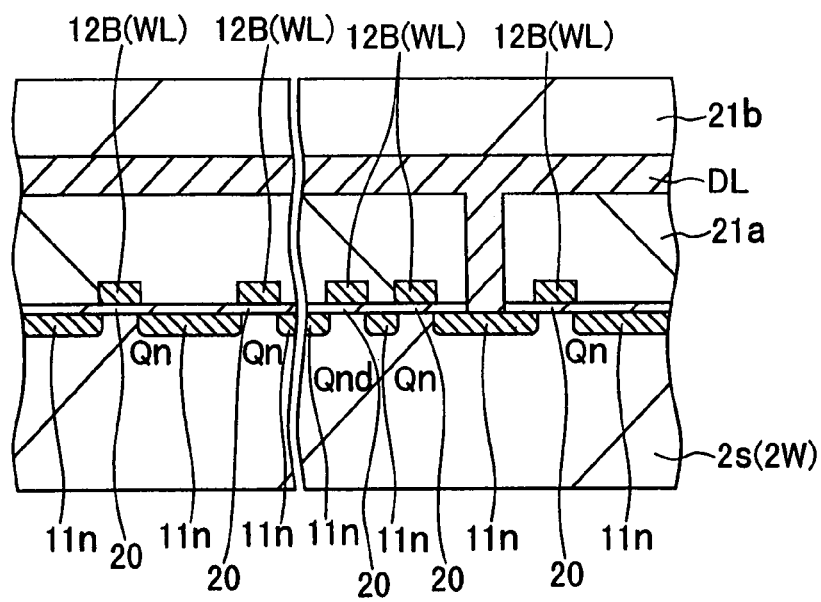
FIG. 71C is a cross-sectional view taken along line A-A in FIG. 71A.

FIGS. 71A to 71C show a part of a NAND mask ROM according to this embodiment. A plurality of nMISs Qn constituting a memory cell is connected in parallel through the n type semiconductor regions 11n. The ion-implantation type is employed as the programming type. More specifically, an ion-implanted part of each nMIS Qn (memory cell) is a depression type, and a non ion-implanted part of each nMIS Qn (memory cell) is an enhancement type, and these two parts are corresponded to "0" and "1" of the data, respectively.

FIGS. 71A to 71C exemplify the case where impurities are introduced into a channel region of an nMIS Qnd, and thus the channel region becomes the depression type. An opening pattern 22E showing a pattern for data writing means an opening pattern of an ion-implantation mask used at the time of performing the programming (impurity ion implantation) relative to the nMIS Qnd. Note that an n type semiconductor region 11ns has a function as a power supply wiring in a low potential (e.g., 0V=GND) side.

The way of using the conventional mask and the resist shading mask, the method of altering patterns on a mask, and the method of selectively introducing impurities into a wafer for the programming in this embodiment are the same as those in the second embodiment described above. Therefore, descriptions thereof will be omitted.

The same effects as the second embodiment can be obtained ever in this fourth embodiment.

Fifth Embodiment

In this fifth embodiment, such an example will be described that the present invention is applied to a packaging process. In this case, descriptions will be made of the case where the technical idea of the present invention is applied to a so-called wafer process package (hereinafter, abbreviated to WPP) technique in which a packaging process is performed together relative to a plurality of semiconductor chips formed on a wafer through the wafer process, with the semiconductor chips kept in a state of wafer.

Figure 72A:
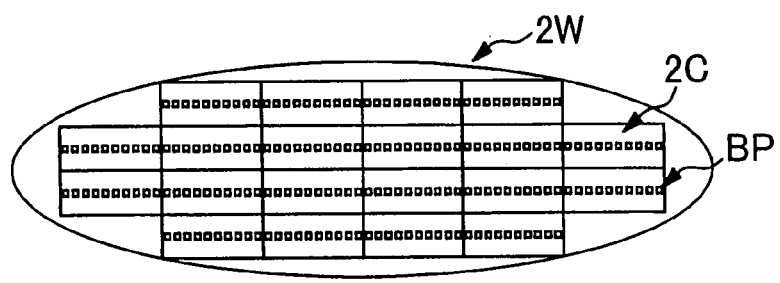
FIG. 72A is a plan view of a semiconductor wafer during the fabrication process of a semiconductor integrated circuit device according to another embodiment of the present invention.
Figure 72B:
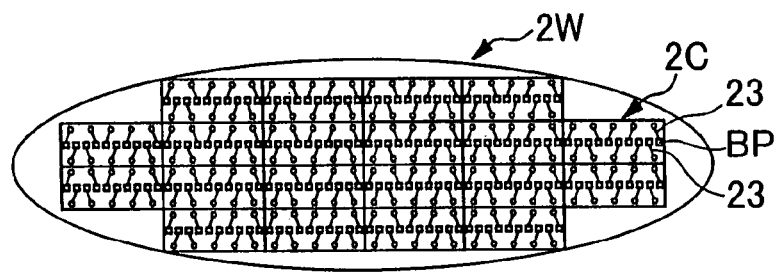
FIG. 72B is a plan view of the semiconductor wafer during the fabrication process of a semiconductor integrated circuit device according to another embodiment of the present invention.
Figure 72C:
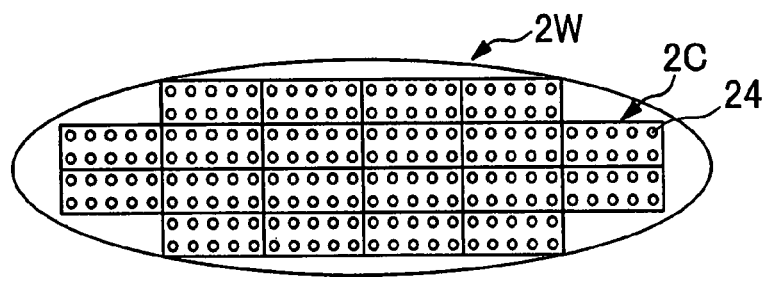
FIG. 72C is a plan view of the semiconductor wafer during the fabrication process of a semiconductor integrated circuit device according to another embodiment of the present invention.

FIGS. 72A to 72C are plan views of a wafer during the fabrication process of a semiconductor integrated circuit device according to this embodiment. FIG. 72A is a plan view of the wafer 2W after the wafer process. The wafer process is called also a pre-process, and generally means a series of steps in which elements are formed on a main surface of a wafer subjected to mirror polishing, and a wiring layer is formed, and a surface passivation film is formed, and thereafter each of plural semiconductor chips formed over the wafer comes to such a state as capable of being electrically tested by probes or the like.

The wafer 2W is formed, for example, in an almost round shape in two dimensions, and a plurality of rectangular-shaped semiconductor chips (hereinafter, referred to as chip) 2C are regularly arranged on a main surface of the wafer 2W in an up-and-down and a left-and-right direction of FIG. 72A. At the center of each chip 2C in a width direction, a plurality of bonding pads BP are arranged along a longitudinal direction of the chip 2C (center pad arrangement). These bonding pads BP are call also outer terminals and are electrodes functioning to draw or the like the electrodes of elements and circuits and the like formed on each chip 2C, to the outside. The electric test of each chip 2C is performed in a state where the above-mentioned probes are in contact with the bonding pads BP.

FIG. 72B is a plan view of the wafer 2W after a step of forming relocation wiring layers. Each relocation wiring 23 is a wiring for electrically connecting each bonding pad BP of the chips 2C, to a package electrode such as a bump electrode or the like functioning to package each chip 2C onto a predetermined printed wiring board. Also, each relocation wiring 23 is a wiring functions to match the size of each bonding pad BP defined in accordance with a size of a wafer process and the size of the package electrode defined in accordance with a size of a packaging process. More specifically, since the size of the package electrode (sizes of the electrode itself, intervals adjacent thereto, pitches, and the like) are defined in accordance with the size of the printed wiring board, the size of the package electrode is required to be relatively larger than that of each bonding pad BP (sizes of the pad itself, intervals adjacent thereto, pitches, and the like). Therefore, it is impossible to use each fine bonding pad BP defined in accordance with the wafer process as the package electrode directly. Thus, each bonding pad BP is drawn, through each relocation wiring 23, to an unused space having a relatively large area on the main surface of the chip 2C, and then the package electrode having a relatively large size is arranged in the space.

FIG. 72C is a plan view of the wafer 2W after a step of forming a solder bump electrode. Each solder bump electrode 24 is an electrode made of, for example, lead-tin alloy or the like and having a convex cross section, and is formed on an organic dielectric film covering the surface of each relocation wiring 23 described above, and is electrically connected to each relocation wiring 23 through each connection hole formed in the organic dielectric film, and further is electrically connected to each bonding pad BP.

Figure 73:
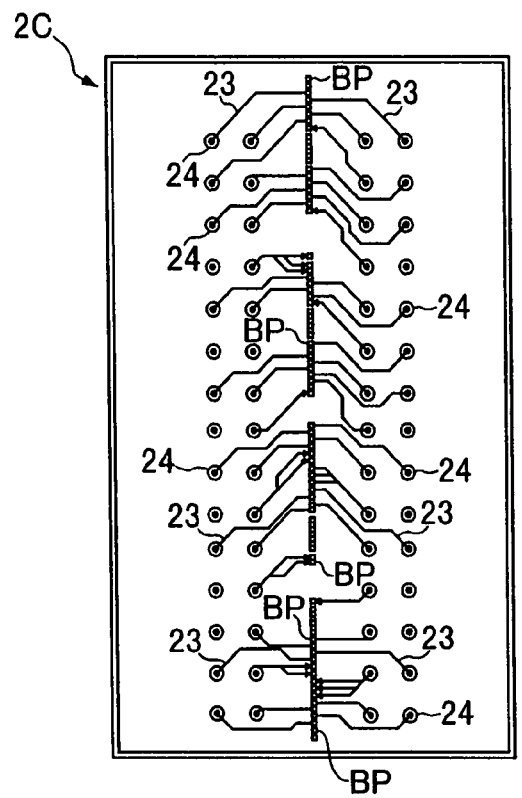
FIG. 73 is a plan view showing a semiconductor chip obtained by the fabrication method of the semiconductor integrated circuit device as shown in FIGS. 72A to 72C.
Figure 74:
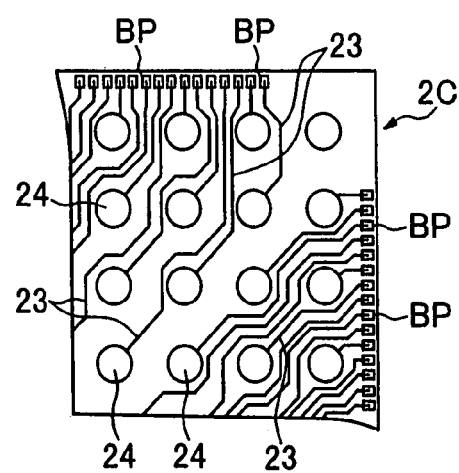
FIG. 74 is a plan view showing a modification example of a semiconductor chip obtained by the fabrication method of the semiconductor integrated circuit device as shown in FIGS. 72A to 72C.

After this step, the chips 2C are cut out from the wafer 2W. Each chip 2C cut out has already had a CSP (chip size package) structure in this stage. FIG. 73 is an enlarged plan view of one chip 2C having a center pad arrangement structure. The bonding pads BP are arranged linearly along the center of the chip 2C and are electrically connected to the solder bump electrodes 24 through the relocation wirings 23 extending from the center of the chip 2C to the outer periphery thereof. Also, FIG. 74 is an enlarged plan view of a corner portion of one chip 2C having a structure in which pads are arranged along four sides thereof. In this case, a plurality of bonding pads BP are linearly arranged near and along each of the four sides thereof and are electrically connected to the solder bump electrodes 24 through the relocation wirings 23 extending from the outer periphery of the chip 2C to the center thereof.

Next, the fabrication process of the semiconductor integrated circuit device will be described in detail based on FIGS. 75A to 75C.

Figure 75A:
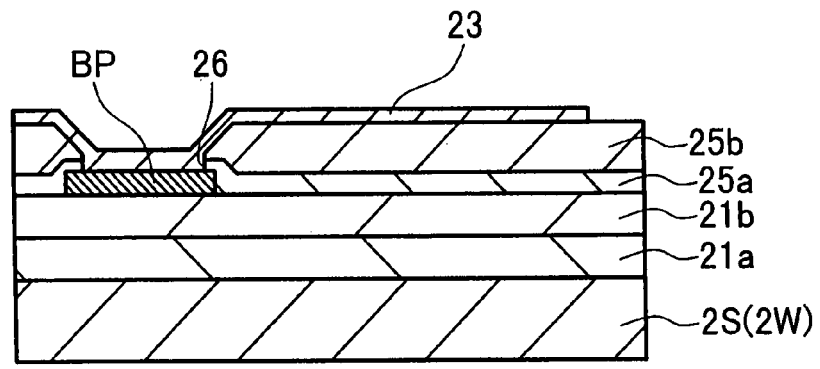
FIG. 75A is a cross-sectional view showing the principal part of a semiconductor wafer during the fabrication process of a semiconductor integrated circuit device as shown in FIG. 72A.

FIG. 75A is a cross-sectional view showing the principal part of the wafer 2W after the step of forming each of the relocation wirings 23 described above. For example, the above-mentioned logic device or the memory device or both devices, and a multilayer wiring layer are formed over the main surface of the semiconductor substrate 2S. On an uppermost wiring layer of the multilayer wiring layer, each bonding pad BP described above is formed. Each of the bonding pads BP is formed by performing the pattern processing of the same material as the wiring such as aluminum or aluminum alloy or the like in the same step. The surface of each bonding pad BP is covered with a passivation film 25a except for a part thereof. The passivation film 25a is made of, for example, a silicon oxide film, a silicon nitride film, or a lamination layer thereof. A passivation film 25b made of, for example, photo-reactive polyimide resin or the like is deposited to a thickness of about 5 .mu.m on the passivation film 25a. An opening 26 is formed through the passivation films 25a and 25b so as to expose each part of the bonding pads BP. It is preferable to use the above-mentioned resist shading mask at the time of forming the opening 26. This is because each position of the bonding pads BP may be changed in accordance with the products or the demands of the customers. Of course, it is also possible to form the opening 26 by the use of laser or the conventional mask. Each of the relocation wirings 23 described above is formed on the passivation film 25b. Each relocation wiring 23 is formed by depositing a conductor film for forming a main wiring made of copper or the like, on a barrier conductor film made of chromium or the like, and is electrically connected to each bonding pad BP through the opening 26. Note that the above-mentioned barrier film has a function to improve adhesiveness to a polyimide resin in addition to a function to prevent the diffusion of copper. The material of the barrier conductor film is not limited to chromium and various modifications and alterations can be made. For example, titanium, tungsten titanium, titanium nitride, or tungsten is also applicable thereto.

The above-mentioned resist shading mask is used also in the pattern processing of each relocation wiring 23. This is because the shape and arrangement and the like of each relocation wiring 23 are sometimes changed in accordance with the products and the demands of the customers. However, a line width of each of the relocation wirings 23 is wider in comparison to that of the gate electrode or the like, the above-mentioned i-ray (having a wavelength of 365 nm) stepper is used as the exposure for the patterning. Thus, a resist film for forming an opaque member on the resist shading mask is one that is formed by adding a photo-absorbing material or a photo-attenuating material to an organic photoreactive resin film (electron beam resist film), or that has a structure in which an organic photoreactive resin film (electron beam resist film), and a photo-absorbing resin film or a photo-attenuating resin film or a conventional anti-reflective layer are laminated. Note that forming together each chip on the wafer is performed until this step, and the wafer has not been divided into chip size units yet.

Figure 75B:
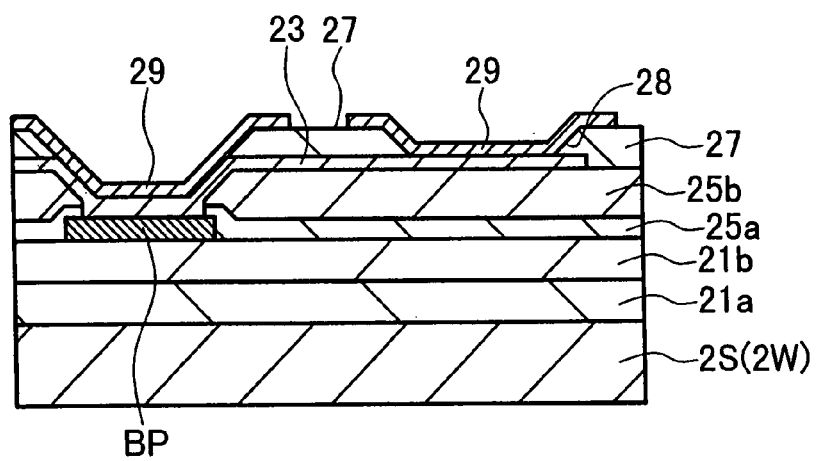
FIG. 75B is a cross-sectional view showing the principal part of the semiconductor wafer during the fabrication process of a semiconductor integrated circuit device as shown in FIG. 72B.

Subsequently, as shown in FIG. 75B, a sealing resin film 27 made of, for example, photo-reactive polyimide resin or the like is coated again over the main surface of the wafer 2W to coat each relocation wiring 23. The uppermost sealing resin film 27 is made of an organic dielectric film such as polyimide resin or the like in order to facilitate the handling of each chip by using a comparatively soft organic dielectric film as the uppermost layer. More specifically, if an inorganic dielectric film is used as the uppermost dielectric film, the sealing resin film is frequently cracked at the time of handling each chip (conveyance or the like). Therefore, each chip is difficult to handle. However, if an organic dielectric film is used as the uppermost dielectric film, such difficulty can be avoided because it is comparatively soft. Thereafter, the exposure and development processes are performed relative to the sealing resin film 27, and thereby an opening 28 is formed so as to expose a part of each relocation wiring 23. The resist shading mask described above can be used also in the exposure process for forming the opening 28. This is because the positions of the bonding pads BP and the relocation wirings 23 as described above are sometimes changed in accordance with the products and the demands of the customers. Of course, it is also possible to form the opening 28 by the use of laser or the conventional mask or the like.

Thereafter, chromium, chromium-copper alloy or the like, and gold or the like are deposited over the wafer 2W by a sputtering method or the like in the order from below. Thereafter, by patterning this by means of an etching process using the resist pattern as an etching mask, an under bump metal layer 29 is formed. The above-mentioned resist shading mask can be used also in the exposure treatment for the pattern processing of the under bump metal layer 29. This is because the positions or the like of the bonding pads BP and the relocation wirings 23 are sometimes changed in accordance with the products and the demands of the customers. Of course, it is also possible to form the under bump metal layer 21 by the use of laser or the conventional mask or the like. The under bump metal layer 29 is formed, for example, in a round shape in two dimensions, and is electrically connected to each relocation wiring 23 through the opening 28. Note that FIG. 72B is a plan view showing the wafer 2W after the process described above.

Figure 75C:
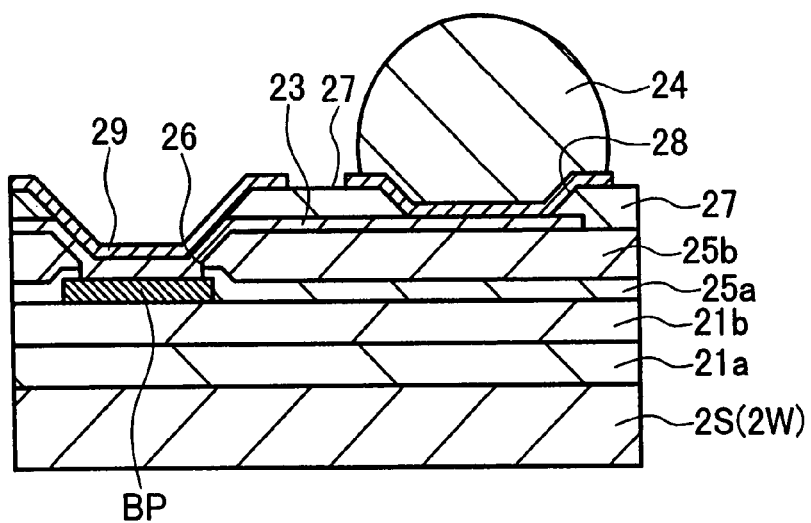
FIG. 75C is a cross-sectional view showing the principal part of the semiconductor wafer during the fabrication process of a semiconductor integrated circuit device as shown in FIG. 72C.

Lastly, after print of a solder paste made of, for example, lead-tin alloy or the like, a heat treatment is performed relative to the wafer 2W, and thereby a solder bump electrode 24 on the under bump metal layer 29 is formed as shown in FIG. 75C. Until this step, forming together each chip on the wafer is performed. Note that FIG. 72C is a plan view showing the wafer 2W after the process described above.

Figure 76A:
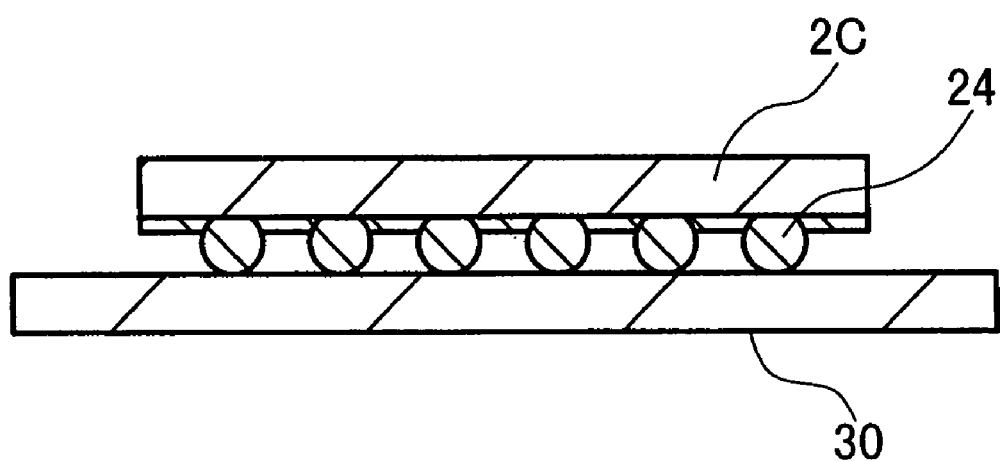
FIG. 76A is a cross-sectional view showing a state where the semiconductor chip obtained by the fabrication method of the semiconductor integrated circuit device of FIGS. 72A to 72C is packaged.
Figure 76B:
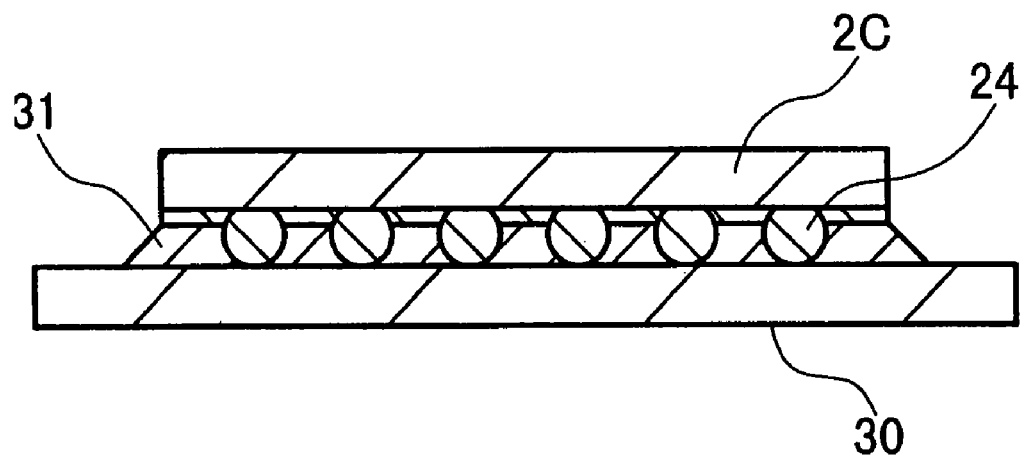
FIG. 76B is a cross-sectional view showing a modification example of the packaged semiconductor chip of FIG. 76A.

After the process described above, each chip 2C is cut out from the wafer 2W, and then each of the chips 2C is packaged over a printed wiring board 30 as shown in FIGS. 76A and 76B. The solder bump electrodes 24 under each chip 2C are electrically connected to lands of the printed wiring board 30. FIG. 76A exemplifies the case where the sealing resin 27 has sufficiently buffering properties, and where filler (underfill) is not interposed between each chip 2C and the printed wiring board 30. Of course, the filler may be interposed therebetween. FIG. 76B exemplifies a packaging structure in which the above-mentioned sealing resin 27 is not provided or the buffering properties thereof are insufficient. More specifically, FIG. 76B exemplifies the case where filler 31 made of liquid resin or the like is interposed between each chip 2C and the printed wiring board 30, and each chip 2C is firmly fixed to the printed wiring board 30.

As described above, the technical idea of the present invention is applied to the above-mentioned WPP (patterning of the relocation wiring or the like). As a result, it becomes possible to perform the packaging of the various types of chips efficiently and in a short period.

Sixth Embodiment

In this sixth embodiment, descriptions will be made of the case where the technical idea of the present invention is applied to a fabrication of a multichip module.

In this embodiment, a memory chip and a logic chip are fabricated through the completely different fabrication process. The memory chip mentioned here is a chip on which a memory circuit such as DRAM (Dynamic Random Access Memory), SRAM (Static Random Access Memory), a mask ROM, a flash memory (EEPROM) or the like is mainly formed. The logic chip mentioned here is a chip on which a logic circuit such as CPU (Central Processing Unit), DSP (Digital Signal Processor) or the like is mainly formed.

In the fabrication of a memory chip, since there are a large number of highly integrated micropatterns arranged regularly, the illumination condition at the time of printing the patterns of a mask onto a wafer by using an exposure tool is determined in accordance with the integration of the patterns. In this case, an annular illumination or a special illumination depending on an application is used. With regard to masks, the conventional masks described above are used in almost all exposure steps.

Meanwhile, in the fabrication of a logic chip, a pattern, which is smaller than that of a memory chip, is required especially in a gate circuit portion. However, since the integration is not always high, an illumination light source (conventional illumination) having a large area is used. Also, since different gate circuits are used depending on the types, both of the above-mentioned resist-shading mask and the conventional mask are used properly in the fabrication of the chip.

Figure 77:
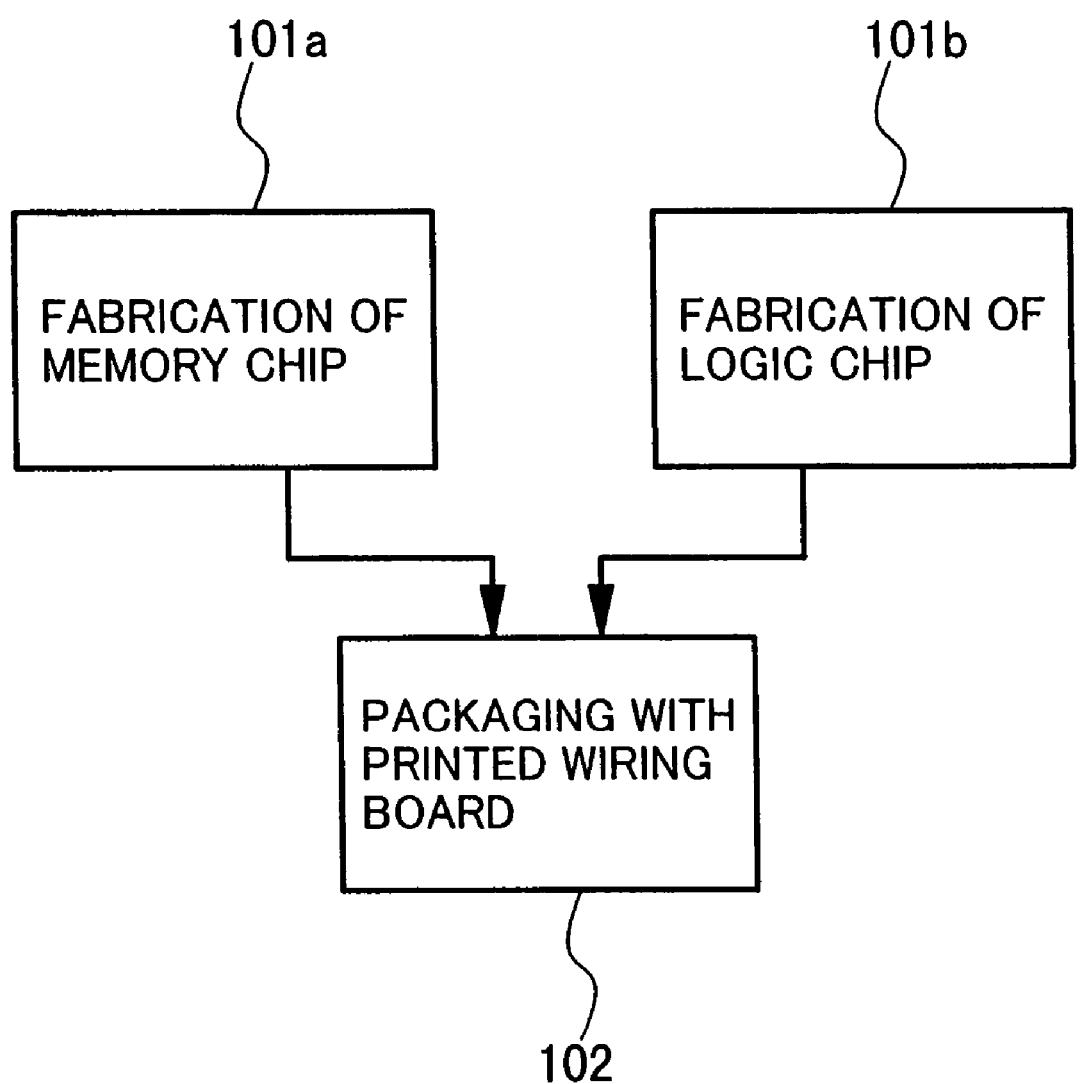
FIG. 77 is a flow chart showing the process of packaging a multi-chip module according to still another embodiment of the present invention.
Figure 78A:
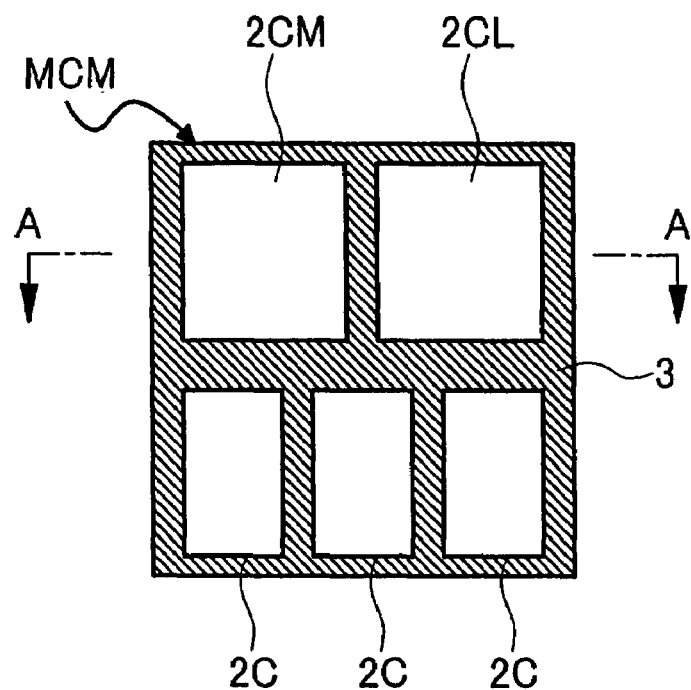
FIG. 78A is a plan view of the multi-chip module fabricated according to the flow shown in FIG. 77.
Figure 78B:
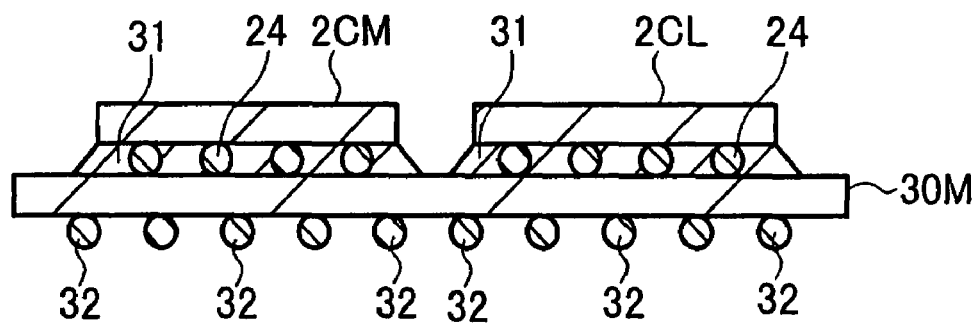
FIG. 78B is a cross-sectional view taken along line A-A in FIG. 78A.

The two types of chips described above are separately fabricated in steps 101a and 10b, respectively, as shown in FIG. 77, and the chips are packaged on a base substrate (printed wiring board) in step 102. FIG. 78A is a plan view of a multichip module MCM constituted as described above, and FIG. 78B is a cross-sectional view taken along line A-A in FIG. 78A. In this case, in addition to a memory chip 2CM and a logic chip 2CL, other chips 2C such as an image processing unit and a signal processing unit for a specific application and the like, which have various functions and depend on various objects, are mounted on a base substrate 30M. In this embodiment, these chips 2C, 2CM, and 2CL are separately fabricated and mounted on one base substrate 30M to fabricate a multichip module MCM. As the step of forming each solder bump electrode 24 of the chips 2C, 2CM, and 2CL, the WPP technique as described in the fifth embodiment is employed. Each solder bump electrode 24 of the chips 2C, 2CM, and 2CL is electrically connected to a land on the main surface of the base substrate 30M, to a land on the rear surface of the base substrate 30M through an internal wiring in the base substrate 30M, and to each solder bump electrode 32 which is electrically connected to the land on the rear surface of the base substrate 30M.

According to the embodiment described above, the optimum process condition can be selected for each of the chips, and the performances of chips can be improved. For this reason, a high-performance multichip module MCM can be fabricated.

In the foregoing, the invention made by the inventors of this invention has been specifically described with reference to the embodiments. However, the present invention is not limited to the above-mentioned embodiments, and, needless to say, various changes and modifications of the invention can be made without departing from the gist thereof.

In the embodiments described above, the case where both of the conventional mask and the resist shading mask are properly used in accordance with the situation has been described. However, the present invention is not limited to this. For example, it is also possible to use the resist shading masks of such types as shown in FIGS. 9 to 11 and FIGS. 20 to 22 (masks in which the opaque patterns for printing integrated circuit patterns are all made of resist films) and the resist shading masks of such types as shown in FIGS. 28 to 32 (masks in which the opaque patterns for printing integrated circuit patterns are made of both of the resist film and metal) in accordance with the condition described in the above embodiments. As a result, the production efficiency of the semiconductor integrated circuit device can be improved.

In addition, it is also possible to use the resist masks of such types as shown in FIGS. 9 to 11 and FIGS. 20 to 22 and the resist masks of such types as shown in FIGS. 28 to 32 in accordance with the condition described in the above embodiments. As a result, the production efficiency of the semiconductor integrated circuit device can be further improved.

In addition, it is also possible to use the conventional masks of such types as shown in FIGS. 3 to 5 and the conventional masks of such types as shown in FIGS. 6 and 7 (masks for the overlapping exposure), in accordance with the condition described in the above embodiments. Also in this case, the production efficiency of the semiconductor integrated circuit device can be improved in comparison to the case where only the conventional masks of such types as shown in FIGS. 3 to 5 are used in a series of fabrication steps of the semiconductor integrated circuit device.

In addition, it is also possible to use the conventional masks of such types as shown in FIGS. 3 to 5, the conventional masks of such types as shown in FIGS. 6 and 7 (masks for the overlay exposure), and the resist shading masks as described above, in accordance with the condition described in the above embodiments. As a result, the production efficiency of the semiconductor integrated circuit can be improved. In this case, it is also possible to use the various types of resist masks described in various steps.

In the above description, the invention made by the inventors of this invention is applied to a manufacturing method of a semiconductor integrated circuit device, which is an applicable field serving as the background of the invention. However, the present invention is not limited to this, and can be applied to a fabrication method of a liquid crystal display apparatus and a manufacturing method of other devices such as micro-machines or the like.

Effects achieved by a typical one of the inventions disclosed in this application will be briefly described below.

(1) According to the present invention, it becomes possible to improve the production efficiency of a semiconductor integrated circuit device by using a mask having an opaque member made of a metal film and a mask having an opaque member made of an organic material containing an organic photoreactive resin film, at the time of an exposure treatment in the fabrication process of the semiconductor integrated circuit device.

(2) According to the present invention, it becomes possible to reduce a development period required to develop a semiconductor integrated circuit device by using a mask having an opaque member made of a metal film and a mask having an opaque member made of an organic material containing an organic photoreactive resin film, at the time of an exposure treatment in the fabrication process of the semiconductor integrated circuit device.

(3) According to the present invention, it becomes possible to reduce the fabrication time of a semiconductor integrated circuit device by using a mask having an opaque member made of a metal film and a mask having an opaque member made of an organic material containing an organic photoreactive resin film, at the time of an exposure treatment in the fabrication process of the semiconductor integrated circuit device.

(4) According to the present invention, it becomes possible to reduce the cost of a semiconductor integrated circuit device by using a mask having an opaque member made of a metal film and a mask having an opaque member made of an organic material containing an organic photoreactive resin film, at the time of an exposure treatment in the fabrication process of the semiconductor integrated circuit device.

What is claimed is:

1. A manufacturing of fabricating a multichip module, including a step of selecting one of a first photomask using a metal film as an opaque member for an exposure light and a second photomask using an organic photoreactive resin film as an opaque member for an exposure light, the method comprising the steps of:

fabricating a plurality of first semiconductor integrated circuit devices, so as to include at least one step of forming a predetermined pattern onto a first semiconductor substrate by using the first photomask having the metal film as the opaque member for the exposure light;

fabricating a plurality of second semiconductor integrated circuit devices, so as to include at least one step of forming a predetermined pattern onto a second semiconductor substrate by using the second photomask having the organic photoreactive resin film as the opaque member for the exposure light; and packaging the first semiconductor integrated circuit device and the second semiconductor integrated circuit device on the same printed wiring board, wherein, in the step of selecting one of the first photomask and the second photomask, the first photomask using the metal film as the opaque member for the exposure light is used when a number of exposed wafers or a number of wafer exposure treatments per photomask is equal to or larger than a predetermined value, and the second photomask using the organic photoreactive resin film as the opaque member for the exposure light when it is smaller than the predetermined value.

2. The method of fabricating a multichip module according to claim 1, wherein the first semiconductor integrated circuit device includes a memory device.

3. The method of fabricating a multichip module according to claim 1, wherein the second semiconductor integrated circuit device includes a logic device.

4. The method of fabricating a multichip module according to claim 1, wherein the first and second semiconductor integrated circuit devices are electrically connected to the printed wiring board by means of face down bonding.

5. A method of fabricating a multichip module, the method comprising:

a first semiconductor integrated circuit device fabricating step including a step of using a photomask in which a pattern is written by using a metal film as an opaque member, and repeatedly performing a projection exposure for printing the pattern onto a semiconductor substrate through exposure optics, and thereby sequentially forming predetermined patterns;

a second semiconductor integrated circuit device fabricating step including a step of selecting one of a first photomask using a metal film as an opaque member for an exposure light and a second photomask using an organic photoreactive resin film as the opaque member for the exposure light, at least one projection exposure step of using the second photomask in which an opening pattern is written by using an organic photoreactive resin film as the opaque member and of thereby printing the opening pattern onto a semiconductor substrate through exposure optics, and a step of using the first photomask which uses the metal film as the opaque member in other exposure steps and of repeatedly performing the projection exposure and of thereby sequentially forming predetermined patterns; and a step of packaging the first semiconductor integrated circuit device fabricated by the first semiconductor integrated circuit device fabricating step and the second semiconductor integrated circuit device fabricated by the second semiconductor integrated circuit device fabricating step, on the same printed wiring board, wherein, in the step of selecting one of the first photomask and the second photomask during the second semiconductor integrated circuit device fabricating step, the first photomask using the metal film as the opaque member for the exposure light is used when a number of exposed wafers or a number of wafer exposure treatments is equal to or larger than a predetermined value, and the second photomask using the organic photoreactive resin film as the opaque member for the exposure light is used when it is smaller than the predetermined value.

6. A method of fabricating a multichip module according to claim 5, wherein the first semiconductor integrated circuit device fabricating step is mainly a memory device, and the second semiconductor integrated circuit device fabricating step is mainly a logic device.

7. A method of fabricating a multichip module, the method comprising:

a first semiconductor integrated circuit device fabricating step including a step of selecting one of a first photomask using a metal film as an opaque member for an exposure light and a second photomask using an organic photoreactive resin film as an opaque member for an exposure light, a projection exposure step of using the second photomask in which an opening pattern is written by using an organic photoreactive resin film as the opaque member and of thereby printing the opening pattern onto a semiconductor substrate through exposure optics, and a step of using the first photomask which uses the metal film as the opaque member and of repeatedly performing the projection exposure and of thereby sequentially forming predetermined patterns, wherein the first photomask using the metal film as the opaque member is mainly used for forming the patterns;

a second semiconductor integrated circuit device fabricating step including a step of selecting one of the first photomask using the metal film as the opaque member for the exposure light and the second photomask using the organic photoreactive resin film as the opaque member for the exposure light, a projection exposure step of using the second photomask in which an opening pattern is written by using the organic photoreactive resin film as the opaque member and of thereby printing the opening pattern onto a semiconductor substrate through exposure optics, and a step of using the first photomask which uses the metal film as the opaque member and of repeatedly performing the projection exposure and of thereby sequentially forming predetermined patterns; and a step of packaging the first semiconductor integrated circuit device fabricated by the first semiconductor integrated circuit device fabricating step and the second semiconductor integrated circuit device fabricated by the second semiconductor integrated circuit device fabricating step, on the same printed wiring board, wherein, in the step of selecting one of the first photomask and the second photomask during the first semiconductor integrated circuit device fabricating step and the second semiconductor integrated circuit device fabricating step, the first photomask using the metal film as the opaque member for the exposure light is used when a number of exposed wafers or a number of wafer exposure treatments is equal to or larger than a predetermined value, and the second photomask using the organic photoreactive resin film as the opaque member for the exposure light is used when it is smaller than the predetermined value.

8. The method of fabricating a multichip module according to claim 7, wherein the projection exposure step of performing the exposure by using the second photomask having the organic photoreactive resin film as the opaque member is a step of forming at least one of a hole and a wiring pattern.

9. The method of fabricating a multichip module according to claim 7, wherein the projection exposure step of performing the exposure by using the second photomask having the organic photoreactive resin film as the opaque film is a step of forming a relocation wiring for connecting a bonding pad and a solder bump in a semiconductor integrated circuit device.

10. The method of fabricating a multichip module according to claim 7, wherein the organic photoreactive resin film is a resist material for electron beam, and an exposure wavelength used in a step of performing the exposure by using the photomask having the resist material as the opaque film is 250 nm or less.

11. The method of fabricating a multichip module according to claim 7, wherein an exposure wavelength used in a step of performing the exposure by using a photomask having an organic material as an opaque film is 370 nm or less, the organic material including the organic photoreactive resin film and an anti-reflective layer.

* * * * *